(12) United States Patent
Moriya et al.

(10) Patent No.: US 7,923,705 B2
(45) Date of Patent: Apr. 12, 2011

(54) EXTREME ULTRA VIOLET LIGHT SOURCE APPARATUS

(75) Inventors: Masato Moriya, Hiratsuka (JP);
Tamotsu Abe, Hiratsuka (JP); Takashi Suganuma, Hiratsuka (JP); Hiroshi Someya, Hiratsuka (JP); Takayuki Yabu, Hiratsuka (JP); Akira Sumitani, Hiratsuka (JP); Osamu Wakabayashi, Hiratsuka (JP)

(73) Assignee: Gigaphoton Inc., Tokyo (JP)

( * ) Notice: Subject to any disclaimer, the term of this patent is extended or adjusted under 35 U.S.C. 154(b) by 185 days.

(21) Appl. No.: 12/385,835

(22) Filed: Apr. 21, 2009

(65) Prior Publication Data
US 2010/0176310 A1    Jul. 15, 2010

(30) Foreign Application Priority Data
Jan. 9, 2009    (JP) .................................. 2009-004041

(51) Int. Cl.
*G21G 4/00*    (2006.01)

(52) U.S. Cl. ............. 250/493.1; 250/504 R; 250/423 R; 250/424; 250/425; 250/494.1

(58) Field of Classification Search ............... 250/504 R, 250/423 R, 424, 425, 493.1, 494.1
See application file for complete search history.

(56) References Cited

U.S. PATENT DOCUMENTS

2010/0171049 A1 * 7/2010 Moriya et al. ............ 250/504 R
2010/0200776 A1 * 8/2010 Yabu et al. ................ 250/504 R

FOREIGN PATENT DOCUMENTS

JP    2003-229298    8/2003

* cited by examiner

*Primary Examiner* — Robert Kim
*Assistant Examiner* — Meenakshi S Sahu
(74) *Attorney, Agent, or Firm* — Wenderoth, Lind & Ponack, L.L.P.

(57) ABSTRACT

An EUV light source apparatus capable of easily detecting deterioration etc. of a window of an EUV light generating chamber. The EUV light source apparatus includes a driver laser, an EUV light generating chamber, a window which passes the laser beam into the EUV light generating chamber, an EUV light collector mirror, laser beam focusing optics which focuses a laser beam onto a trajectory of a target material, a temperature sensor which detects a temperature of the window, and a laser beam optics deterioration determination processing unit which determines deterioration of the window based on the temperature of the window detected by the temperature sensor when extreme ultra violet light is generated.

30 Claims, 35 Drawing Sheets

FIG.24
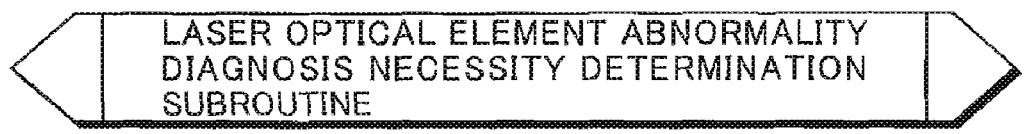
(a) OPTICAL ELEMENT TEMPERATURE MANAGEMENT ROUTINE
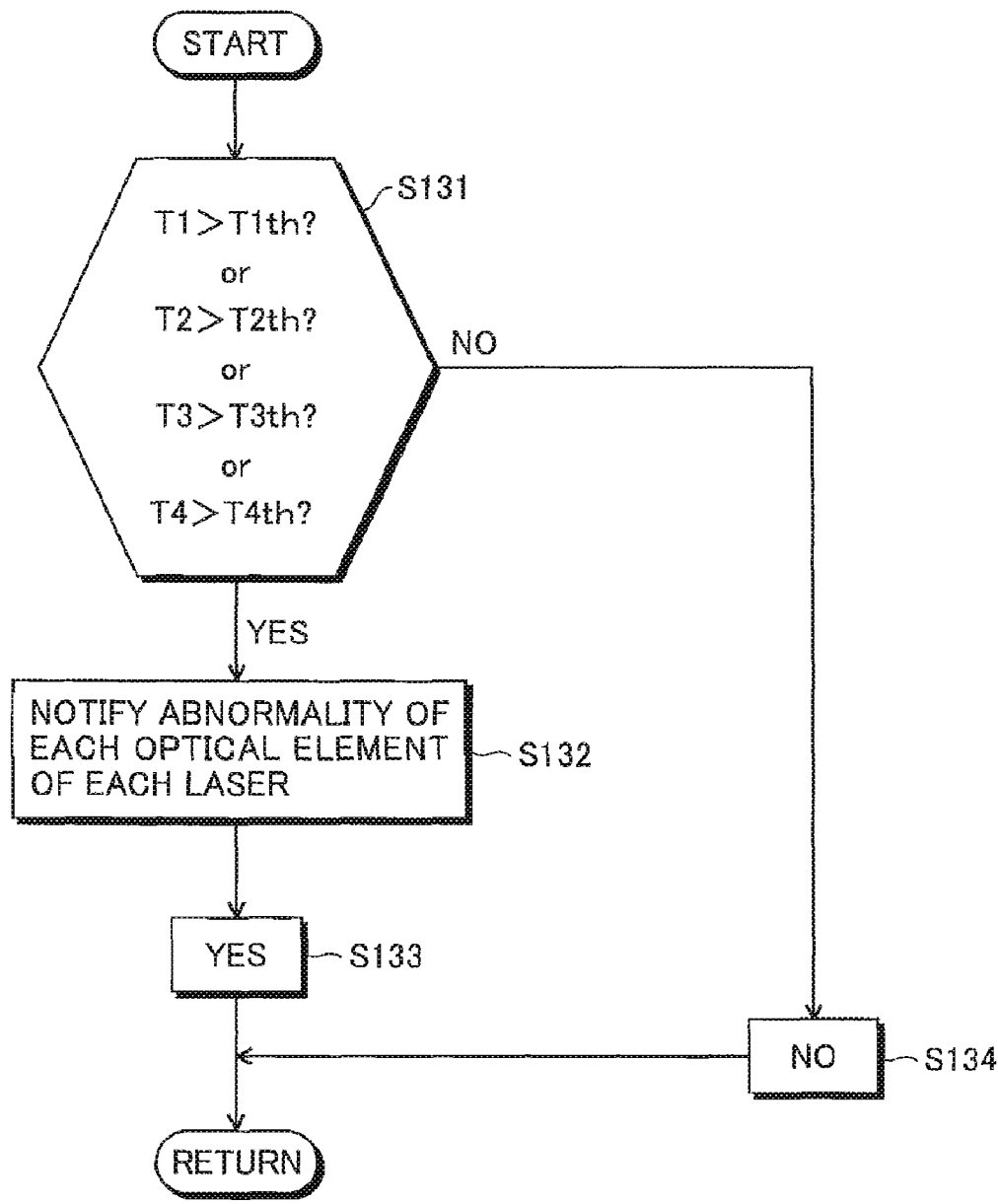

FIG.25
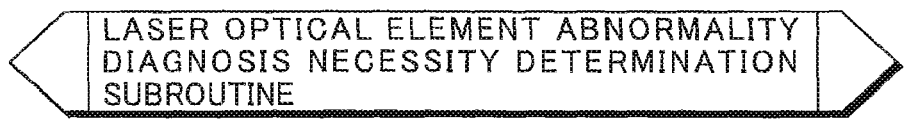
LASER OPTICAL ELEMENT ABNORMALITY DIAGNOSIS NECESSITY DETERMINATION SUBROUTINE
(b) TIME MANAGEMENT ROUTINE
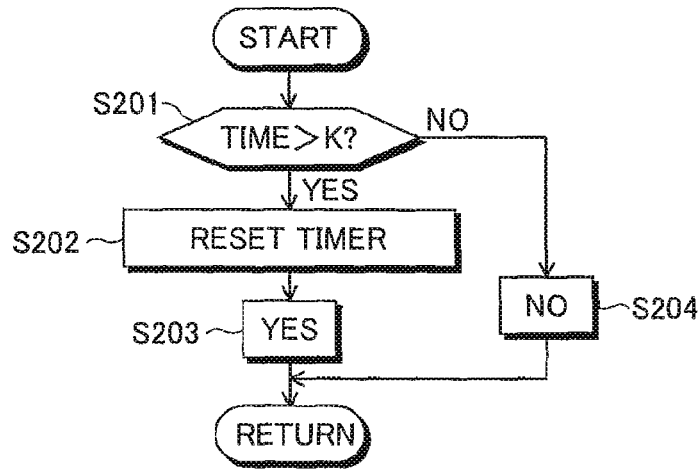
(c) EUV LIGHT OUTPUT MANAGEMENT ROUTINE
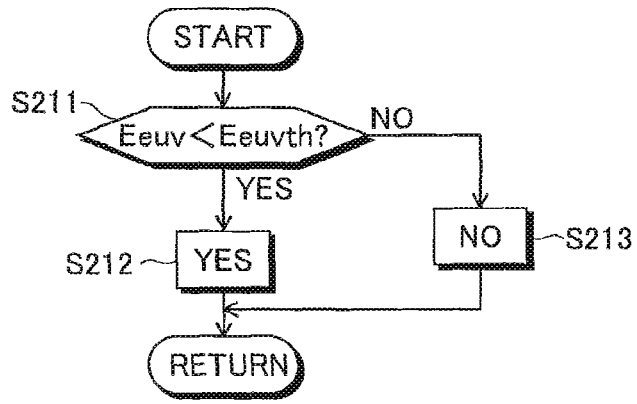
(d) PULSE NUMBER MANAGEMENT ROUTINE
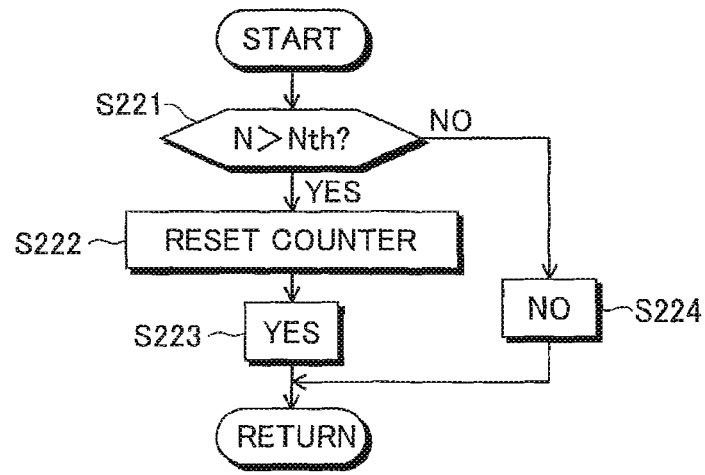

FIG.26
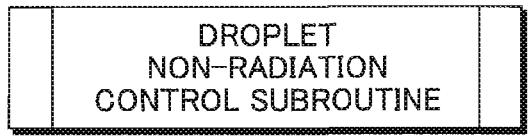
(a) DROPLET GENERATION STOP ROUTINE
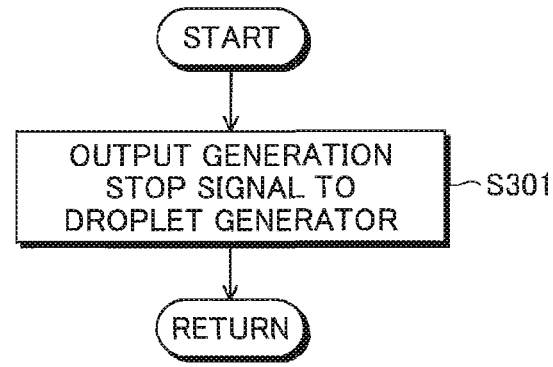
(b) DROPLET/LASER BEAM TIMING CHANGING ROUTINE
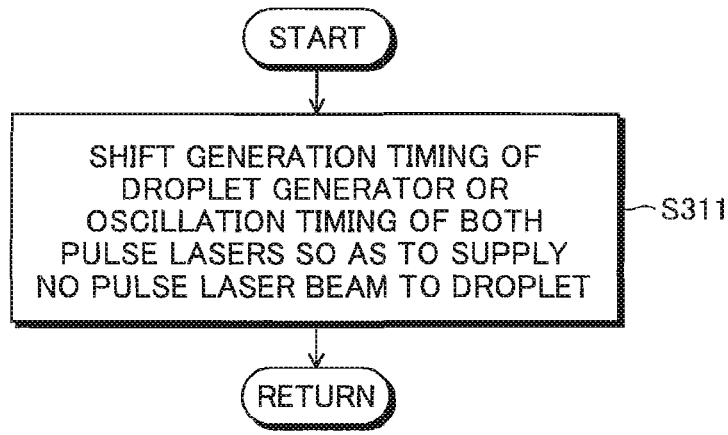
(c) PULSE LASER OPTICAL AXIS CHANGING ROUTINE
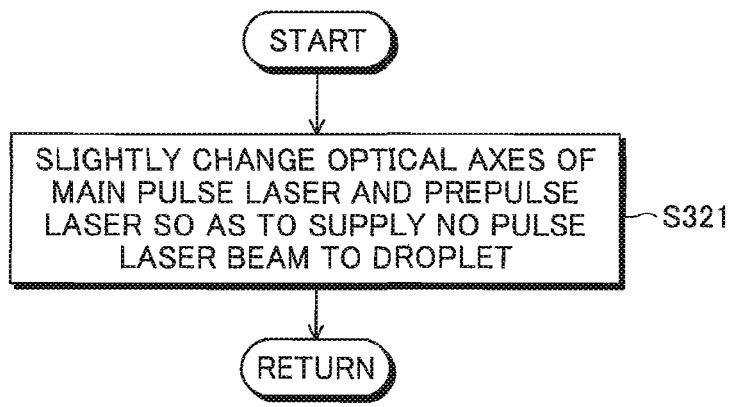

FIG.34
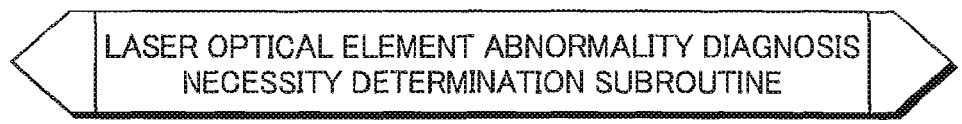
LASER OPTICAL ELEMENT ABNORMALITY DIAGNOSIS NECESSITY DETERMINATION SUBROUTINE
(e) OPTICAL ELEMENT HEATING VALUE MANAGEMENT ROUTINE
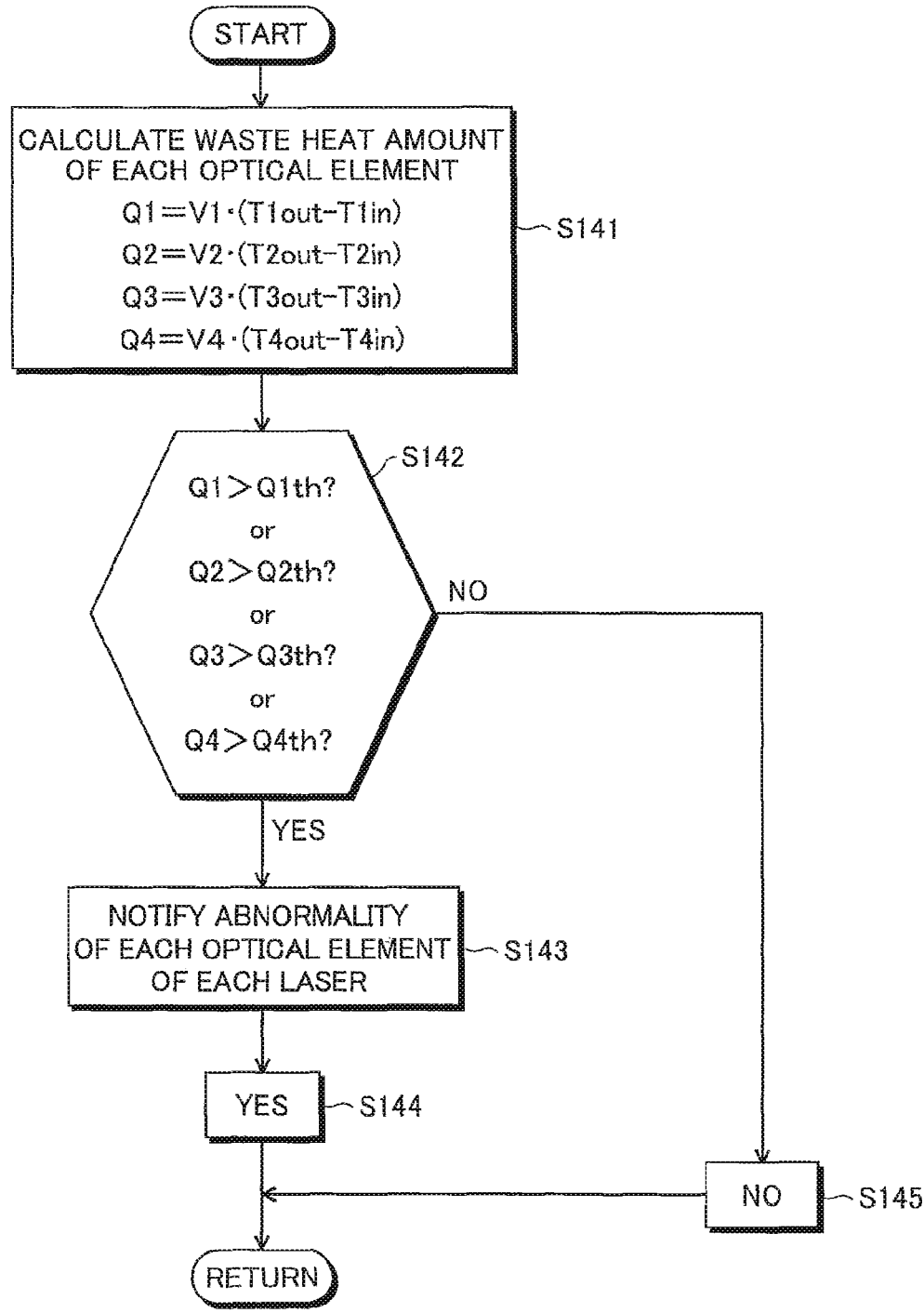

EXTREME ULTRA VIOLET LIGHT SOURCE APPARATUS

BACKGROUND OF THE INVENTION

1. Field of the Invention

The present invention relates to an LPP (laser produced plasma) type EUV (extreme ultra violet) light source apparatus which generates extreme ultra violet light to be used for exposing semiconductor wafers, etc.

2. Description of a Related Art

Recent years, as semiconductor processes become finer, photolithography has been making rapid progress to finer fabrication. In the next generation, microfabrication at 60 nm to 45 nm, further, microfabrication at 32 nm and beyond will be required. Accordingly, in order to fulfill the requirement for microfabrication at 32 nm and beyond, for example, exposure equipment is expected to be developed by combining an EUV light source generating EUV light having a wavelength of about 13 nm and reduced projection reflective optics.

As the EUV light source, there are three kinds of light sources, which include an LPP (laser produced plasma) light source using plasma generated by applying a laser beam to a target, a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be considerably made larger, that the light emission of only the necessary waveband can be performed by selecting the target material, and that an extremely large collection solid angle of $2\pi$ to $5\pi$ steradian can be ensured because it is a point light source having substantially isotropic angle distribution and there is no structure surrounding the light source such as electrodes. Therefore, the LPP light source is considered to be predominant as a light source for EUV lithography requiring power of more than 100 watts.

FIG. 35 shows the outline of a conventional LPP type EUV light source apparatus. As shown in FIG. 35, the EUV light source apparatus includes a driver laser 101, an EUV light generating chamber 102, a target material supply unit 103, and laser beam focusing optics 104.

The driver laser 101 is a master oscillator power amplifier type laser apparatus which generates a drive laser beam to be used for exciting a target material.

The EUV light generating chamber 102 is a chamber in which EUV light is generated and which is evacuated by a vacuum pump 105 to facilitate turning the target material into plasma and prevent the EUV light from being absorbed. Furthermore, a window 106 for passing a laser beam 120 generated by the driver laser 101 into the EUV light generating chamber 102 is attached to the EUV light generating chamber 102. In addition, a target injection nozzle 103a, a target collecting cylinder 107, and an EUV light collector mirror 108 are located in the EUV light generating chamber 102.

The target material supply unit 103 supplies the target material to be used for generating EUV light into the EUV light generating chamber 102 through the target injection nozzle 103a which is a part of the target material supply unit 103. Target material, which has become unnecessary without laser beam irradiation, among the supplied target material is collected by the target collecting cylinder 107.

The laser beam focusing optics 104 includes a mirror 104a for reflecting the laser beam 120 emitted from the driver laser 101 toward the EUV light generating chamber 102, a mirror adjusting mechanism 104b for adjusting the position and angle (tilt angle) of the mirror 104a, a focusing element 104c for focusing the laser beam 120 reflected by the mirror 104a, and a focusing element adjusting mechanism 104d for moving the focusing element 104c along the optical axis of the laser beam. The laser beam 120 focused by the laser beam focusing optics 104 reaches the trajectory of target material through the window 106 and a hole formed in the midsection of the EUV light collector mirror 108. Thus, the laser beam focusing optics 104 focuses a laser beam 120 so as to make a focus on the trajectory of target material. As a result, the target material 109 is excited and turned into plasma, and EUV light 121 is generated from the plasma.

The EUV light collector mirror 108 is a concave mirror on the surface of which an Mo/Si film reflecting light having a wavelength of 13.5 nm, for example, at a high reflectance is formed, and reflects the generated EUV light 121 to focus it on an IF (intermediate focusing point). The EUV light 121 reflected by the EUV light collector mirror 108 passes through a gate valve 110 provided to the EUV light generating chamber 102 and a filter 111 which eliminates unnecessary light (electromagnetic waves (light) having a shorter wavelength than EUV light, and light having a longer wavelength than EUV light, e.g. ultra violet light, visible light, infrared light, etc.) from the light generated from the plasma to allow passage of only desired EUV light, e.g. light having a wavelength of 13.5 nm. EUV light 121 focused on the IF (intermediate focusing point) is then guided to an exposure unit or the like through transmission optics.

Since large energy is radiated from plasma generated in the EUV light generating chamber 102, temperature of the components in the EUV light generating chamber 102 rises due to this radiation. A technology of preventing such temperature rise of components is known (see Japanese Unexamined Patent Application Publication JP-P 2003-229298A, for example).

JP-P2003-229298A describes an X-ray generator including an X-ray source which turns a target material into plasma and radiates X-ray from the plasma, and a vacuum vessel which accommodates the X-ray source, and the X-ray generator is characterized by an inner wall made of a material having high absorption ratio for electromagnetic waves in a range from infrared to X-ray inside the vacuum vessel. According to the X-ray generator, the components in the vacuum vessel can be prevented from being heated unnecessarily due to radiation energy reflected and scattered by the inner wall of the vacuum vessel.

By the way, the plasma generated in the EUV light generating chamber 102 as shown in FIG. 35 diffuses with the passage of time, and a part of the diffused plasma scatters as atoms and ions. These atoms and ions are called debris and irradiated to the inner wall and structure of the EUV light generating chamber 102. Due to the irradiation of debris scattered from the plasma as described above and electromagnetic waves generated from the plasma, the following phenomena may occur.

(a) Atoms scattered from the plasma adhere to the surface of the window 106 on the internal side of the EUV light generating chamber 102. The atoms adhered to the surface of the window 106 on the internal side of the EUV light generating chamber 102 absorb a laser beam 120.

(b) Ions scattered from the plasma are applied to the surface of the window 106 on the internal side of the EUV light generating chamber 102, and the surface of the window 106 on the internal side of the EUV light generating chamber 102 is deteriorated (the surface becomes rough and not smooth). As a result, the window 106 becomes to absorb a laser beam 120 emitted from the driver laser 101.

(c) Ions scattered from the plasma are applied to the inner wall and structures of the EUV light generating chamber 102. Atoms scattered from the inner wall and structures of the EUV light generating chamber 102 by this spattering adhere to the surface of the window 106 on the internal side of the EUV light generating chamber 102. Atoms adhered to the surface of the window 106 on the internal side of the EUV light generating chamber 102 absorb a laser beam 120.

(d) The window 106 absorbs electromagnetic waves (light) having a short wavelength generated from plasma, and thereby, quality of its material is deteriorated. As a result, the window 106 becomes to absorb a laser beam 120.

(e) When the operation period of the EUV light source apparatus becomes long to some extent, the material of the window 106 is deteriorated or damaged by the irradiation of the laser beam 120 during this period. As a result, the window 106 becomes to absorb a laser beam 120.

When the phenomena of (a) through (e) have occurred, the energy for turning target material into plasma decreases and the efficiency of generation of EUV light 121 decreases.

Furthermore, when the window 106 and/or atoms adhered to the window 106 absorb laser beam 120, the temperature of the window 106 rises, and distortion occurs on the substrate of the window 106, and therefore, the focusing property decreases. Such reduction in the focusing property results in more reduction in the efficiency of generation of EUV light 121. In addition, when the distortion of the substrate of the window 106 grows, the distortion, in turn, results in damage of the window 106.

Furthermore, there is a case where a part (e.g. lens, mirror, etc.) of the laser beam focusing optics 104 is located inside the EUV light generating chamber 102. In such a case, the phenomena (a) through (e) may occur also on the part of the laser beam focusing optics 104 located in the EUV light generating chamber 102. In particular, in the case where a mirror which reflects the laser beam is located in the EUV light generating chamber 102, when the phenomena (a) through (e) occur on the mirror, the laser beam reflectance of the reflection-increasing coating on the reflecting surface of the mirror decreases. As a result, the energy for turning target material into plasma decreases and the efficiency of generation of EUV light 121 decreases.

When the phenomena (a) through (e) have occurred and the window 106 and/or the laser beam focusing optics 104 have been deteriorated, the deteriorated optical elements need to be replaced with new optical elements.

However, there has been a problem that since a laser beam 120 is focused on a plasma generating position (the trajectory of target material) in the EUV light generating chamber 102, it is not easy to know whether the window 106 and/or the laser beam focusing optics 104 have been deteriorated and therefore it is difficult to take prompt countermeasure (optical element replacement).

On the other hand, as factors responsible for destabilizing generation of the plasma and eventually fluctuating or decreasing efficiency of generation of EUV light 121, there is a problem of displacement of focusing point (focus) of the laser beam 120, in addition to deterioration of the window 106 and the laser beam focusing optics 104. The displacement of focusing point of the laser beam 120 is caused by alignment deviation of the laser beam focusing optics 104, pointing deviation of the driver laser 101, and so on. Alignment deviation of the laser beam focusing optics 104 is mainly caused by deformation of the optical elements included in the laser beam focusing optics 104 or deformation of the optical element holders holding such optical elements because heat load is applied to the optical elements and the optical element holders along with operation of the EUV light source apparatus. Furthermore, pointing deviation of the driver laser 101 is mainly caused by deformation of the elements or the components in the driver laser 101 because heat load is applied to the elements and the components along with operation of the EUV light source apparatus.

When displacement of focusing point of the laser beam 120 as described above occurs, a focusing spot size or an intensity distribution in the plasma generating position (on the trajectory of target material) becomes inadequate or the laser beam 120 deviates from target material, and the generation of plasma is destabilized, and eventually, the efficiency of generation of EUV light 121 is fluctuated or decreased.

Focusing point displacement of the laser beam 120 can be corrected by readjusting the alignment of the laser beam focusing optics 104 without replacement of optical elements. Thereby, the focusing point of the laser beam 120 can be restored to the original position (plasma generating position), plasma generation can be stabilized, and, in turn, the efficiency of generation of EUV light 121 can be restored to the original value.

However, there has been a problem that since the laser beam 120 is focused in the EUV light generating chamber 102 (plasma generation position) it is not easy to know whether focusing point displacement of the laser beam 120 occurred and therefore it is difficult to take prompt countermeasure (readjusting the alignment of the laser beam focusing optics 104).

Furthermore, in particular, as the light output of the EUV light source apparatus increases, the amount of generated debris increases, and the surfaces of various optical elements such as the concave mirror 108 of the EUV light collecting optics become contaminated easily as well as the window 106, and therefore, the deterioration state should be adequately known and the optical elements should be cleaned or replaced.

SUMMARY OF THE INVENTION

In view of the about point, an object of the present invention is to provide an extreme ultra violet light source apparatus capable of promptly coping with reduction or fluctuation of an efficiency in EUV light generation caused by deterioration of the window for a driver laser and/or deterioration of the optical element of laser beam focusing optics located in the EUV light generating chamber.

In order to achieve the above object, an extreme ultra violet light source apparatus according to a first aspect of the present invention is an apparatus for generating extreme ultra violet light by applying a laser beam to a target material to turn the target material into plasma, and the apparatus includes: an extreme ultra violet light generating chamber in which extreme ultra violet light is generated; a target material supply unit for injecting a target material into the extreme ultra violet light generating chamber when the extreme ultra violet light is generated; a driver laser for emitting a laser beam; a window provided to the extreme ultra violet light generating chamber, for passing a laser beam into the extreme ultra violet light generating chamber; laser beam focusing optics including at least one optical element, the laser beam focusing optics focusing the laser beam emitted from the driver laser onto a trajectory of the target material injected into the extreme ultra violet light generating chamber to generate plasma; extreme ultra violet light collecting optics for collecting and outputting extreme ultra violet light radiated from the plasma; a temperature sensor for detecting a temperature of the window and/or optical elements provided in the extreme ultra violet light generating chamber; and a processing unit for determining deterioration of the window and/or the optical elements provided in the extreme ultra violet light generating chamber based on the temperature of the window and/or the optical elements detected by the temperature sensor when extreme ultra violet light is generated.

Furthermore, an extreme ultra violet light source apparatus according to a second aspect of the present invention is an apparatus for generating extreme ultra violet light by applying a laser beam to a target material to turn the target material into plasma, and the apparatus includes: an extreme ultra violet light generating chamber in which extreme ultra violet light is generated; a target material supply unit for injecting a target material into the extreme ultra violet light generating chamber when extreme ultra violet light is generated; a driver laser for emitting a laser beam; a window provided to the extreme ultra violet light generating chamber, for passing the laser beam into the extreme ultra violet light generating chamber; laser beam focusing optics including an optical element provided in the extreme ultra violet light generating chamber, the laser beam focusing optics focusing the laser beam emitted from the driver laser onto a trajectory of the target material injected into the extreme ultra violet light generating chamber to generate plasma; extreme ultra violet light collecting optics for collecting and outputting extreme ultra violet light radiated from the plasma; a cooling channel for supplying cooling water to the window and/or the optical element; a temperature sensor provided at a cooling water back-flow position of the cooling channel, for detecting a temperature of back-flow water; and a processing unit for obtaining an amount of waste heat carried by the cooling water based on the temperature detected by the temperature sensor when extreme ultra violet light is generated, and determining deterioration of the window and/or the optical element based on the amount of waste heat.

Incidentally, the driver laser may have a main pulse laser and a pre-pulse laser.

According to the present invention, deterioration, etc. of the window and/or the optical element of the EUV light generating chamber can be easily detected. Thereby, the reduction or fluctuation of the efficiency in EUV light generation can be promptly handled.

BRIEF DESCRIPTION OF THE DRAWINGS

FIG. 24 is a flow chart showing an optical element temperature management routine used in a laser optical element abnormality diagnosis necessity determination subroutine;

FIG. 25 is a flow chart showing three other routines used in the laser optical element abnormality diagnosis necessity determination subroutine;

FIG. 26 is a flow chart showing the contents of a droplet non-radiation control subroutine;

FIG. 34 is a flow chart showing an optical element waste heat amount management routine used in a laser optical element abnormality diagnosis necessity determination subroutine of the tenth embodiment.

DESCRIPTION OF THE PREFERRED EMBODIMENTS

Figure 1:
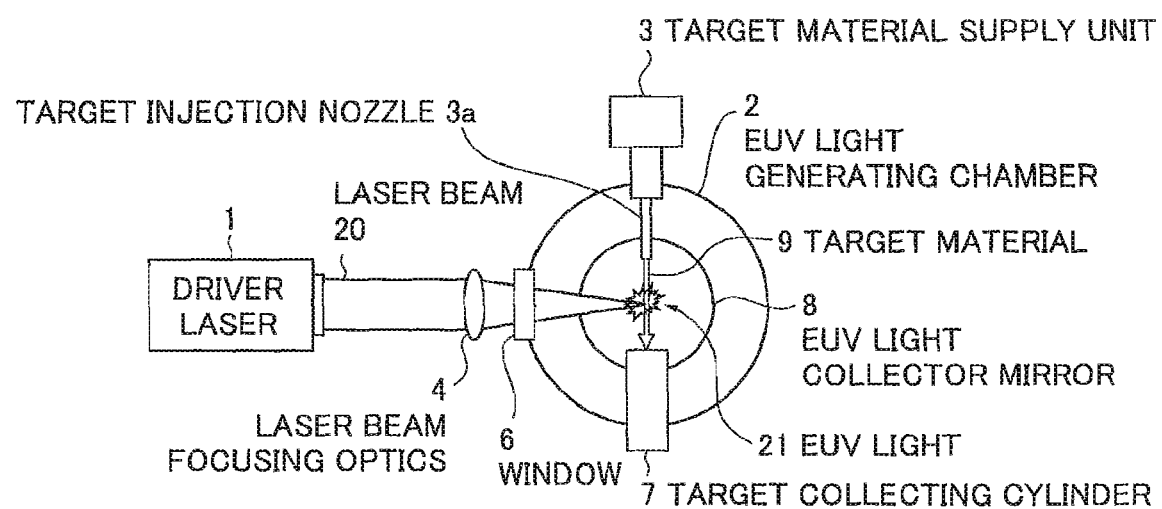
FIG. 1 is a schematic diagram showing the outline of an EUV light source apparatus according to the present invention.

Embodiments of the present invention will be described in detail below with reference to the drawings. The same reference numerals are attached to the same components to omit a description of them.

FIG. 1 is a schematic diagram showing the outline of an extreme ultra violet light source apparatus (simply referred to as "EUV light source apparatus" hereinafter) according to the present invention. As shown in FIG. 1 the EUV light source apparatus includes a driver laser 1, an EUV light generating chamber 2, a target material supply unit 3, and laser beam focusing optics 4.

The driver laser 1 is a master oscillator power amplifier type laser apparatus which generates a drive laser beam to be used for exciting a target material. As the driver laser 1, publicly known various lasers (for example, ultra violet lasers such as KrF and XeF lasers and infrared lasers such as Ar, $CO_2$, and YAG lasers) can be used.

The EUV light generating chamber 2 is a vacuum chamber in which EUV light is generated. A window 6 for passing a laser beam 20 generated by the driver laser 1 into the EUV light generating chamber 2 is attached to the EUV light generating chamber 2. In addition, a target injection nozzle 3a, a target collecting cylinder 7, and an EUV light collector mirror 8 are located in the EUV light generating chamber 2.

The target material supply unit 3 supplies a target material to be used for generating EUV light into the EUV light generating chamber 2 through the target injection nozzle 3a which is part of the target material supply unit 3. Target material, which has become unnecessary without being irradiated with a laser beam, among the supplied target material is collected by the target collecting cylinder 7. As a target material, publicly known various material (e.g. tin (Sn), xenon (Xe), etc.) can be used. Furthermore, the state of the target material may be any one of solid, liquid, and gas, and may be supplied to the space in the EUV light generating chamber 2 in any publicly known state such as a continuous flow (target injection flow) or a droplet. For example, when liquid xenon (Xe) target is used as the target material, the target material supply unit 3 includes a gas cylinder which supplies high purity xenon gas, a mass flow controller, a cooling apparatus for liquefying xenon gas, a target injection nozzle, etc. Furthermore, when a droplet is generated, a vibrator such as a piezoelectric element is added to the configuration including them.

The target material supply unit 3 supplies the target material into the EUV light generating chamber 2 when the EUV light source apparatus generates EUV light, while not supplying the target material into the EUV light generating chamber 2 when the EUV light source apparatus does not generate EUV light.

The laser beam focusing optics 4 focuses a laser beam 20 emitted from the driver laser 1 so as to make a focus on the trajectory of the target material. As a result, the target material 9 is excited and turned into plasma, and EUV light 21 is generated from the plasma. The laser beam focusing optics 4 may be composed of one optical element (e.g. one convex lens or the like) or may be composed of two or more optical elements. When the laser beam focusing optics 4 is composed of two or more optical elements, at least one of them can be located in the EUV light generating chamber 2.

The EUV light collector mirror 8 is, for example, a concave mirror having an Mo/Si film formed on the surface thereof, for reflecting light having a wavelength of 13.5 nm at a high reflectance, and collects the generated EUV light 21 by reflecting it and guides it to transmission optics. The EUV light 21 is further guided to an exposure unit or the like through the transmission optics. In FIG. 1, the EUV light collector mirror 8 collects the EUV light 21 toward the front of the paper.

Next, an EUV light source apparatus according to the first embodiment of the present invention will be described.

Figure 2:
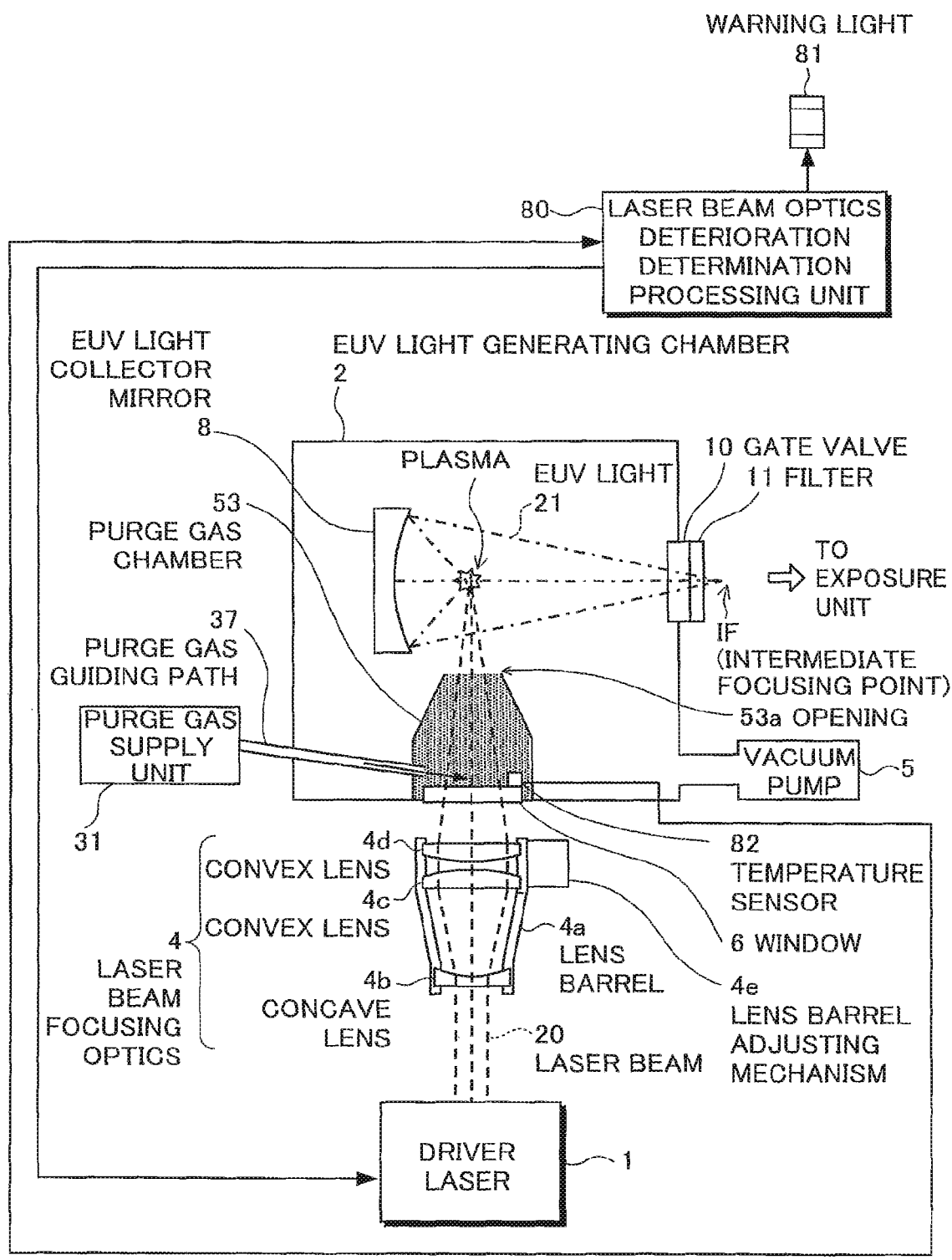
FIG. 2 is a schematic diagram showing an EUV light source apparatus according to a first embodiment of the present invention.

FIG. 2 is a schematic diagram showing an EUV light source apparatus according to this embodiment. In FIG. 2, the target material supply unit 3 and the target material collecting cylinder 7 (see FIG. 1) are omitted, and the target material is assumed to be injected in a direction perpendicular to the paper.

As shown in FIG. 2, a laser beam 20 emitted upward in the figure from the driver laser 1 enters the laser beam focusing optics 4.

The laser beam focusing optics 4 includes a lens barrel 4a, a concave lens 4b and convex lenses 4c and 4d located in the lens barrel 4a, and a lens barrel adjusting mechanism 4e. The laser beam 20 having entered the laser beam focusing optics 4 is diverged by the concave lens 4b, collimated by the convex lens 4c, and focused by the convex lens 4d. The laser beam 20 focused by the convex lens 4d passes through the window 6 and enters the EUV light generating chamber 2. As the material of the concave lens 4b, the convex lenses 4c and 4d, and the window 6, such materials are desirable that little absorbs a laser beam 20 like synthetic quartz, $CaF_2$, $MgF_2$, or the like. When an infrared laser such as a $CO_2$ laser is used as the driver laser 1, ZnSe, GaAs, Ge, Si, etc. are suitable for the material of the concave lens 4b, the convex lenses 4c and 4d, and the window 6. Furthermore, it is desirable that an anti-reflection (AR) coating by a dielectric multilayer film is applied to the surfaces of the concave lens 4b, the convex lenses 4c and 4d, and the window 6. Furthermore, the lens barrel adjusting mechanism 4e can adjust the position and angle (tilt angle) of the lens barrel 4a.

Figure 3A:
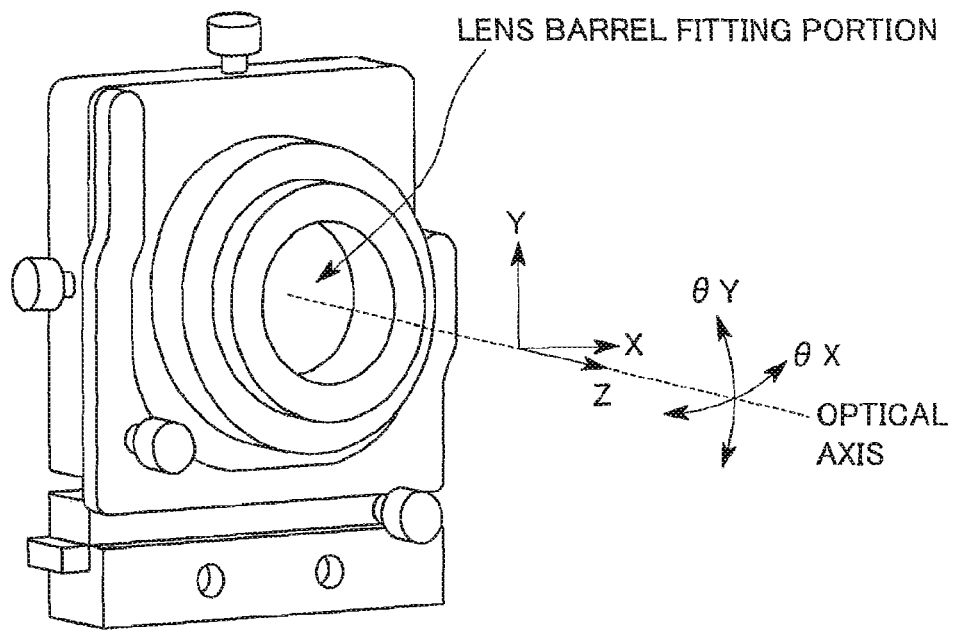
FIGS. 3A and 3B are schematic diagrams showing an example of a lens barrel adjusting mechanism in FIG. 2.
Figure 3B:
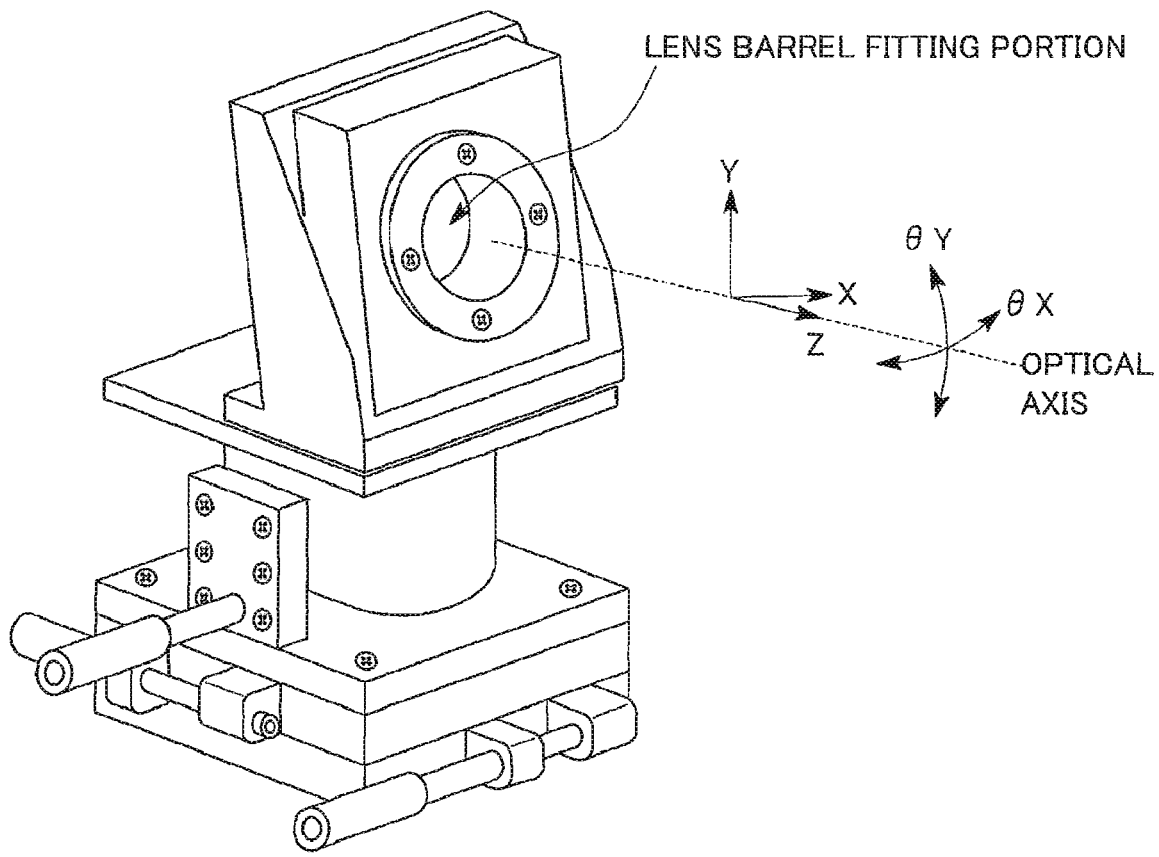

FIGS. 3A and 3B show an example of the lens barrel adjusting mechanism 4e. It is desirable that, as shown in FIGS. 3A and 3B, the lens barrel adjusting mechanism 4e is able to adjust the tilt angles of the lens barrel 4a in the directions of θx and θy in the figures in order to adjust the angle of the optical axis of a laser beam and is able to move the lens barrel 4a in the directions of x-axis, y-axis, and z-axis as shown in the figures while keeping the tilt angles of the lens barrel 4a.

Referring to FIG. 2 again, a temperature sensor 82 for detecting the temperature of the window 6 is attached to the window 6. As the temperature sensor 82, a sheath type thermocouple or the like, for example, can be used so as to maintain the vacuum state and clean state in the EUV light generating chamber 2. A signal or data representing the temperature of the window 6 detected by the temperature sensor 82 is sent to a laser beam optics deterioration determination processing unit 80 which executes processing for determining whether the window 6 is deteriorated or not. The laser beam optics deterioration determination processing unit 80 can be realized with a personal computer (PC) and a program. The laser beam optics deterioration determination processing unit 80 is connected with a warning light 81 for notifying, when the window 6 is determined to be deteriorated, a user (operator) of the fact.

A laser beam 20 having passed through the window 6 and entered the EUV light generating chamber 2 is focused on the trajectory of the target material. As a result, the target material is excited and turned into plasma, and EUV light 21 is generated.

In this way, incident light is once diverged and then focused, and thereby, the back focal distance can be made longer than the focal distance. Such optics is referred to as a retro-focus.

The EUV light collector mirror 8 is, for example, a concave mirror having an Mo/Si film formed on the surface thereof, for reflecting light having a wavelength of 13.5 nm at a high reflectance, and reflects the generated EUV light 21 to the right in the figure to focus it on an IF (intermediate focusing point). The EUV light 21 reflected by the EUV light collector mirror 8 passes through a gate valve 10 provided on the EUV light generating chamber 2 and a filter 11 which eliminates unnecessary light (electromagnetic waves (light) having a shorter wavelength than EUV light, and light having a longer wavelength than EUV light, e.g. ultra violet light, visible light, infrared light, etc.) among light generated from plasma so as to pass only desired EUV light (e.g. light having the wavelength of 13.5 nm). The EUV light 21 focused on the IF (intermediate focusing point) is then guided to an exposure unit or the like through transmission optics.

The EUV light source apparatus further includes a purge gas supply unit 31 for injecting and supplying purge gas, and a purge gas guiding path 37 for guiding the purge gas injected from the purge gas supply unit 31 to the surface of the window 6 on the internal side of the EUV light generating chamber 2. As the purge gas, inert gas (e.g. Ar, He, $N_2$, Kr, or the like) is desirable.

When the EUV light source apparatus does not generate EUV light, the purge gas supply unit 31 may not inject purge gas.

Furthermore, a purge gas chamber 53 surrounding the window 6 is attached to the inner wall of the EUV light generating chamber 2. The upper side in the figure of the purge gas chamber 53 has a shape of a tapered cylinder, and on the tip (upper side in the figure) thereof is formed with an opening 53a to pass a laser beam 20 having transmitted through the window 6.

Figure 4:
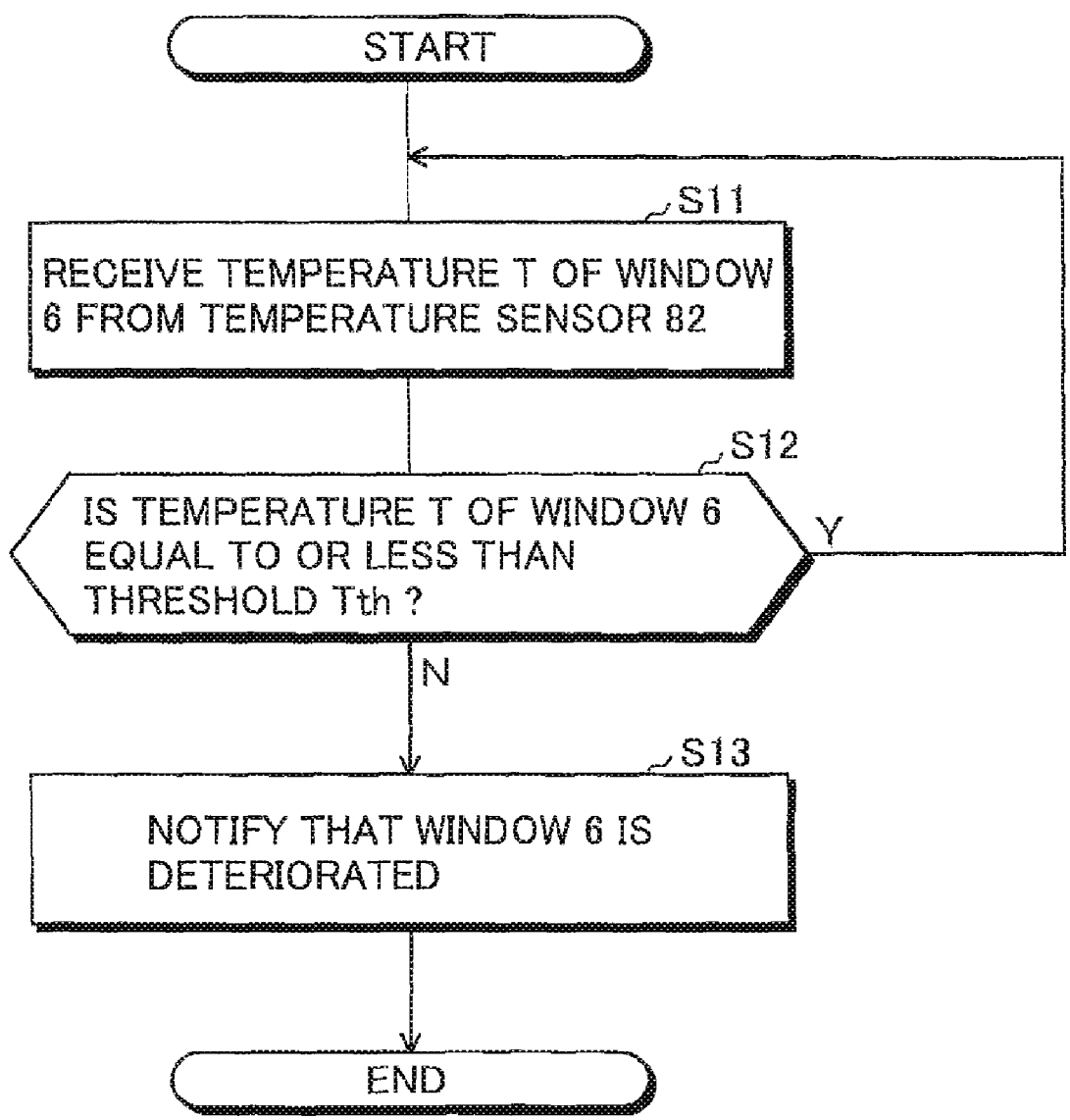
FIG. 4 is a flow chart showing processing executed by laser beam optics deterioration determination processing unit in FIG. 2.

Next, processing executed by the laser beam optics deterioration determination processing unit 80 will be described. FIG. 4 is a flow chart showing processing executed by the laser beam optics deterioration determination processing unit 80 when the EUV light source apparatus according to this embodiment generates EUV light.

First, the laser beam optics deterioration determination processing unit 80 receives a signal or data representing the temperature T of the window 6 from the temperature sensor 82 (step S11).

As previously described, when the window 6 is deteriorated, the window 6 absorbs a laser beam 20 and thereby the temperature of the window 6 rises.

Hence, at step S12, the laser beam optics deterioration determination processing unit 80 determines whether the temperature T of the window 6 is equal to or less than a predetermined threshold Tth. When the temperature T of the window 6 is equal to or less than the predetermined threshold Tth, the processing unit 80 determines that the window 6 is not deteriorated, and returns the processing to step S11. When the temperature T of the window 6 is larger than the predetermined threshold Tth, the processing unit 80 determines that the window 6 is deteriorated, and advances the processing to step S13.

When the temperature T of the window 6 is larger than the predetermined threshold Tth, in other words, when determining that the window 6 is deteriorated, the laser beam optics deterioration determination processing unit 80 notifies a user (operator) of the fact (step S13). The fact that the window 6 is deteriorated may be notified by lighting or flashing the warning light 81 or changing the flashing pattern of it, by sounding a buzzer or the like, or by displaying characters or images on a display device such as an LCD. Furthermore, at that time, the laser beam optics deterioration determination processing unit 80 may output an operation stop control signal to the driver laser 1 to stop the operation of the driver laser 1.

As described above, according to this embodiment, when EUV light is generated, it can be easily detected and notified to a user (operator) that the window 6 is deteriorated, so that the user (operator) is able to appropriately determine whether the window 6 should be replaced or not. As a result, it becomes possible to generate EUV light with stability.

In this embodiment, three lenses (concave lens 4b and convex lenses 4c and 4d) are used in the laser beam focusing optics 4, but four or more lenses may be used to reduce the aberration.

Next, an EUV light source apparatus according to the second embodiment of the present invention will be described.

Figure 5:
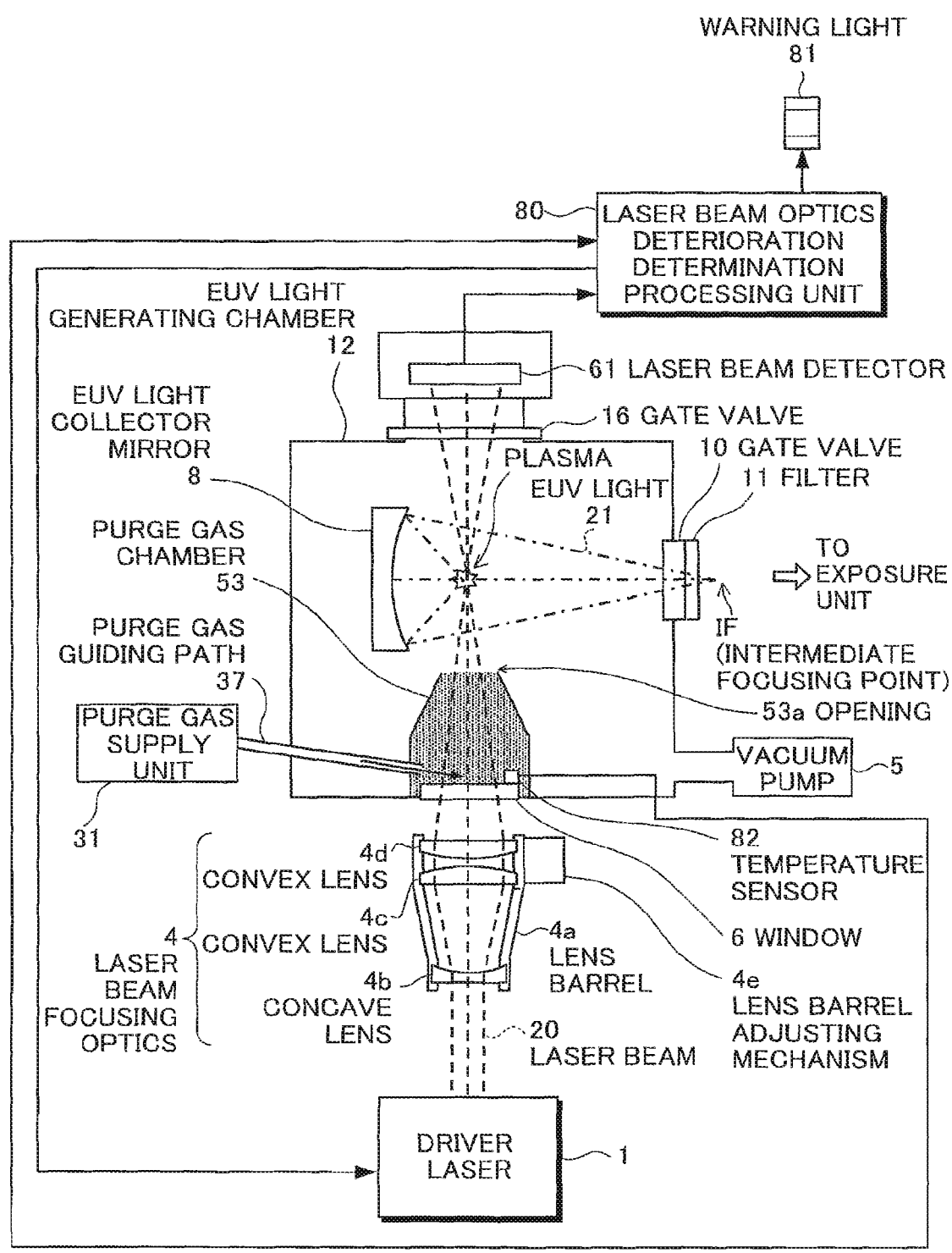
FIG. 5 is a schematic diagram showing the state at EUV light generation of an EUV light source apparatus according to a second embodiment of the present invention.
Figure 6:
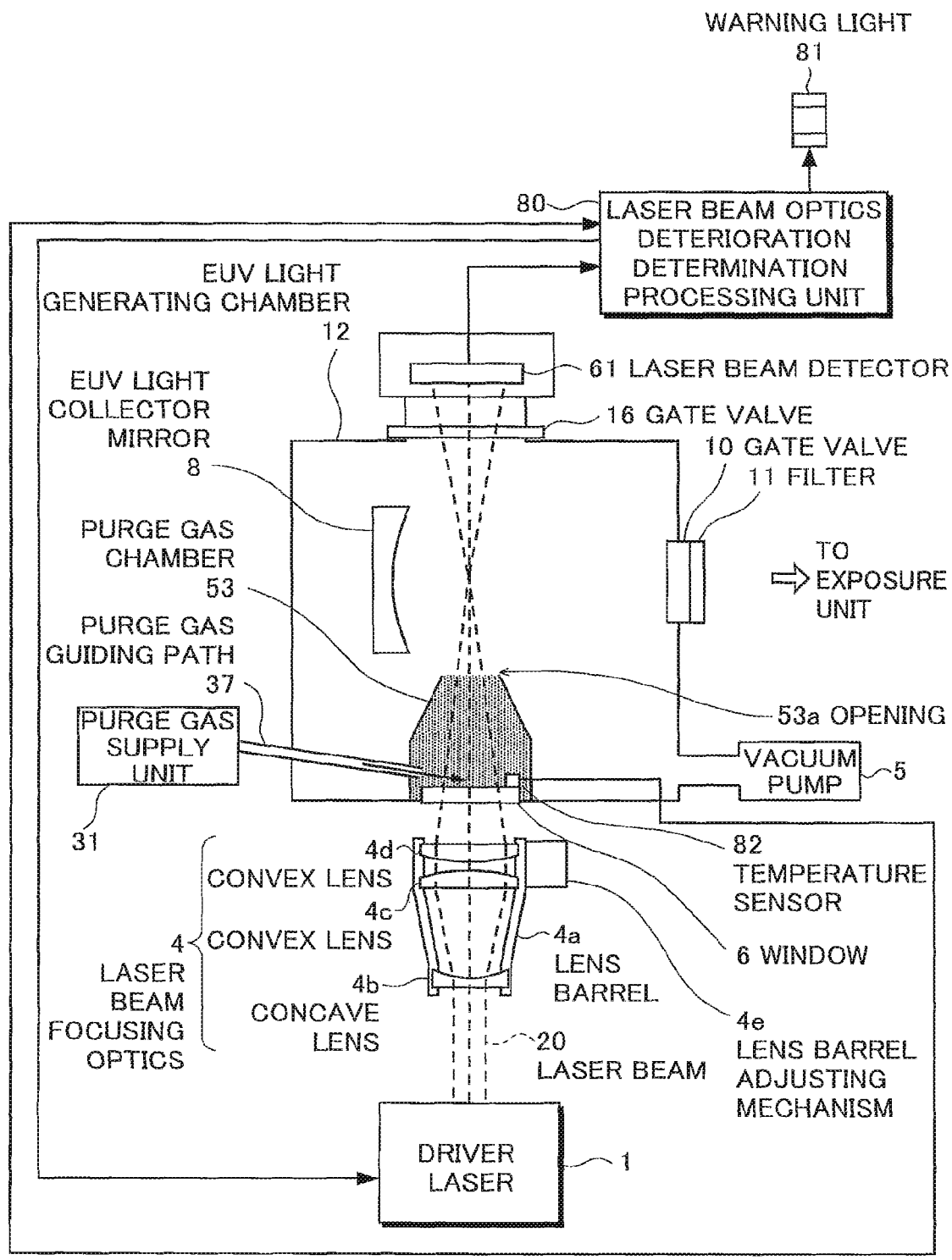
FIG. 6 is a schematic diagram showing the state at EUV light non-generation of the EUV light source apparatus according to the second embodiment of the present invention.

FIGS. 5 and 6 are schematic diagrams showing an EUV light source apparatus according to this embodiment. FIG. 5 is a schematic diagram showing the state at EUV light generation of the EUV light source apparatus according to this embodiment, and FIG. 6 is a schematic diagram showing the state at EUV light non-generation of the EUV light source apparatus according to this embodiment. In FIGS. 5 and 6, the target material supply unit 3 and the target material collecting cylinder 7 (see FIG. 1) are omitted, and the target material is assumed to be injected in a direction perpendicular to the paper.

As shown in FIGS. 5 and 6, the EUV light source apparatus includes a gate valve 16 and a laser beam detector 61 in addition to the EUV light source apparatus according to the first embodiment previously described (see FIG. 2). The gate valve 16 is closed when the EUV light source apparatus generates EUV light, and is opened when the EUV light source apparatus does not generate EUV light (see FIG. 6). For this reason, when the EUV light source apparatus generates EUV light, plasma, materials which have scattered from the inner wall, etc. of the EUV light generating chamber 12 because the wall, etc. have been cutaway (or sputtered) by the plasma, and the EUV light are not output to the outside of the EUV light generating chamber 12, being shielded by the gate valve 16.

The operation at EUV light generation (see FIG. 5) of the EUV light source apparatus according to this embodiment is the same as that at EUV light generation of the EUV light source apparatus according to the first embodiment previously described, and in that case, the laser beam optics deterioration determination processing unit 80 executes the processing shown in the flow chart of FIG. 4 previously described.

Next, the operation at EUV light non-generation of the EUV light source apparatus according to this embodiment will be described with reference to FIG. 6.

When the EUV light source apparatus does not generate EUV light, the target material supply unit 3 does not supply the target material into the EUV light chamber 12 and the gate valve 16 is opened, as previously described. For this reason, a laser beam which has transmitted through the window 6 and entered the EUV light generating chamber 12 passes through the gate valve 16 and exits upward in the figure from the EUV light generating chamber 12 while being dispersed without being applied to the target material.

On the upper side in the figure of the gate valve 16, a laser beam detector 61 for detecting a laser beam which passes through the gate valve 16 and exits from the EUV light generating chamber 12 is located. For the laser beam detector 61, a pyroelectric sensor is suitable, from the viewpoint of resistance to a laser beam.

A laser beam having passed through the gate valve 16 enters the laser beam detector 61, which detects the intensity of the incident laser beam. A signal or data representing the intensity of the laser beam detected by the laser beam detector 61 is sent to the laser beam optics deterioration determination processing unit 80.

Figure 7:
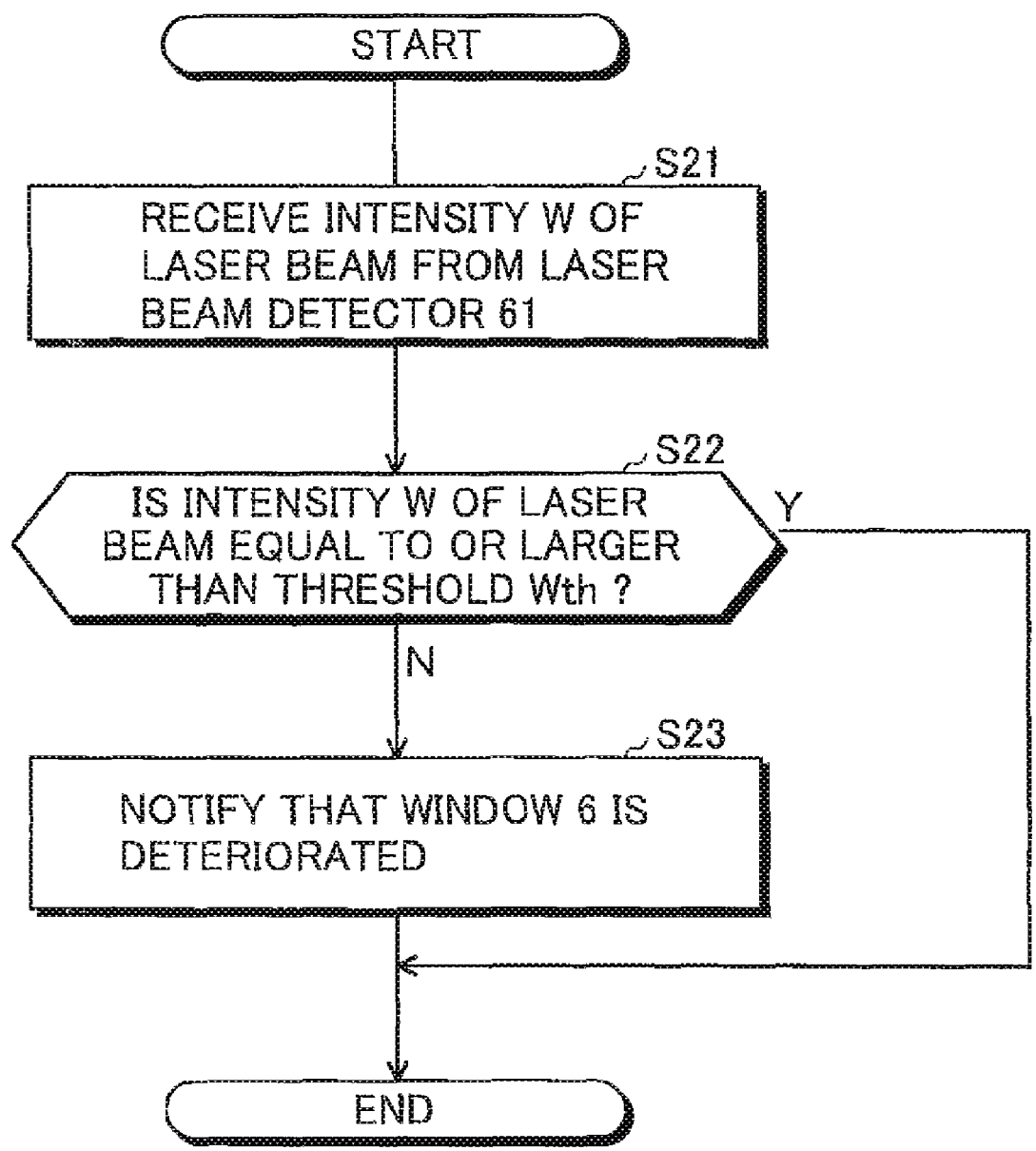
FIG. 7 is a flow chart showing processing executed by laser beam optics deterioration determination processing unit in FIGS. 5 and 6.

FIG. 7 is a flow chart showing processing executed by the laser beam optics deterioration determination processing unit 80. The laser beam optics deterioration determination processing unit 80 executes the processing shown in FIG. 7 when the EUV light source apparatus does not emit EUV light.

First, the laser beam optics deterioration determination processing unit 80 receives a signal or data representing the intensity W of a laser beam from the laser beam detector 61 (step S21).

As previously described, when the window 6 is deteriorated, the transmittance of the window 6 for a laser beam 20 decreases and thereby the intensity of a laser beam incident on the EUV light generating chamber 12 decreases.

Hence, at step S22, the laser beam optics deterioration determination processing unit 80 determines whether the intensity W of a laser beam is equal to or larger than a predetermined threshold Wth. When the intensity W of the laser beam is equal to or larger than the predetermined threshold Wth, the processing unit 80 determines that the window 6 is not deteriorated, and finishes the processing. When the intensity W of the laser beam is less than the predetermined threshold Wth, the processing unit 80 determines that the window 6 is deteriorated, and advances the processing to step S23. When the intensity W of a laser beam is equal to or larger than the predetermined threshold Wth, the processing unit may return the processing to step S21 so as to repeatedly execute the laser beam intensity determination.

When the intensity W of a laser beam is less than the predetermined threshold Wth, in other words, when determining that window 6 is deteriorated, the laser beam optics deterioration determination processing unit 80 notifies a user (operator) of the fact (step S23). The fact that the window 6 is deteriorated may be notified by lighting or flashing the warning light 81 or changing the flashing pattern of it, by sounding a buzzer or the like, or by displaying characters or images on a display device such as an LCD.

As described above, according to this embodiment, also when EUV light is not generated, it can be easily detected and notified to a user (operator) that the window 6 is deteriorated.

As a result, it can be determined more surely whether the window 6 is deteriorated or not.

Furthermore, in this embodiment, the gate valve 16 is closed when the EUV light source apparatus generates EUV light (see FIG. 5), so that the laser beam detector 61 can be prevented from being destroyed by plasma, materials, which have scattered from the inner wall, etc. of the EUV light generating chamber 12 because the inner wall, etc. are cut away by the plasma, or the EUV light.

Incidentally, a neutral density (ND) filter may be located on an optical path between the gate valve 16 and the laser beam detector 61 to adjust the intensity of a laser beam incident on the laser beam detector 61.

Next, an EUV light source apparatus according to the third embodiment of the present invention will be described.

Figure 8:
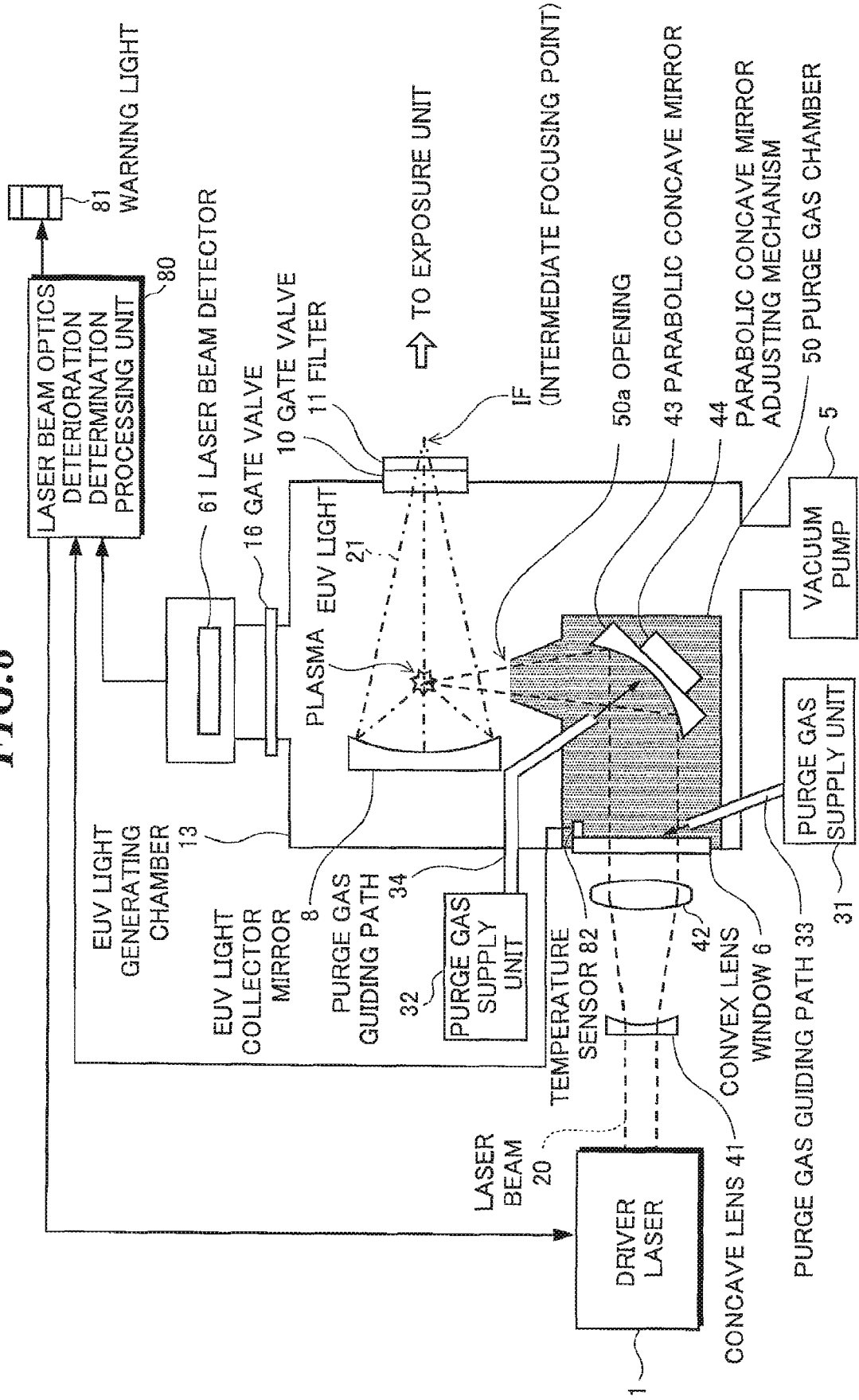
FIG. 8 is a schematic diagram showing the state at EUV light generation of an EUV light source apparatus according to a third embodiment of the present invention.
Figure 9:
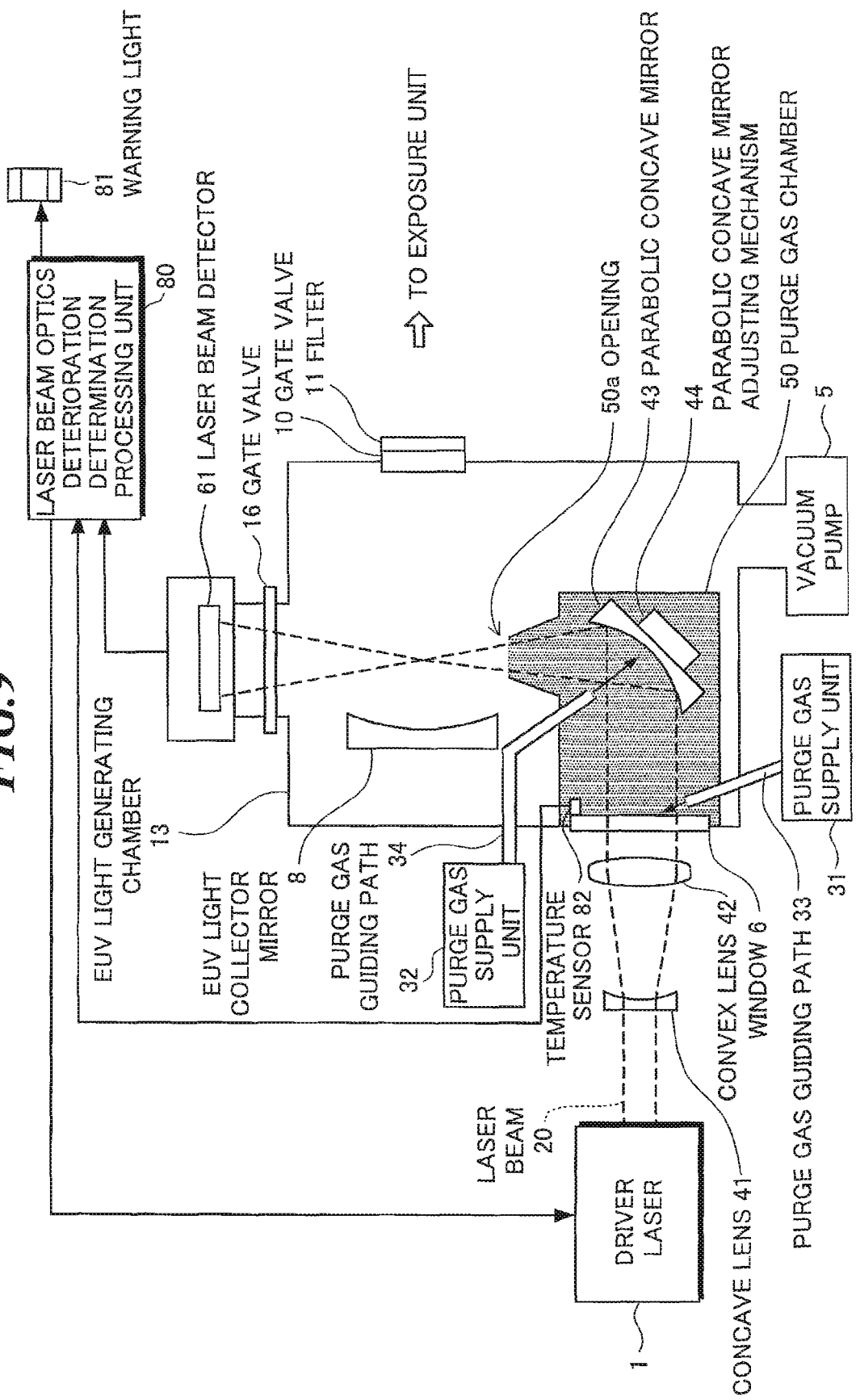
FIG. 9 is a schematic diagram showing the state at EUV light non-generation of the EUV light source apparatus according to the third embodiment of the present invention.

FIGS. 8 and 9 are schematic diagrams showing an EUV light source apparatus according to this embodiment. FIG. 8 is a schematic diagram showing the state at EUV light generation of the EUV light source apparatus according to this embodiment, and FIG. 9 is a schematic diagram showing the state at EUV light non-generation of the EUV light source apparatus according to this embodiment. In FIGS. 8 and 9, the target material supply unit 3 and the target material collecting cylinder 7 (see FIG. 1) are omitted, and the target material is assumed to be injected in a direction perpendicular to the paper.

First, the operation at EUV light generation of the EUV light source apparatus according to this embodiment will be described mainly with reference to FIG. 8, and then the operation at EUV light non-generation of the EUV light source apparatus according to this embodiment will be described mainly with reference to FIG. 9.

As shown in FIG. 8, a laser beam 20 emitted to the right in the figure from a driver laser 1 is diverged by a concave lens 41 and collimated by a convex lens 42, transmits through a window 6, and enters an EUV light generating chamber 13.

In the EUV light generating chamber 13, a parabolic concave mirror 43 and a parabolic concave mirror adjusting mechanism 44 adjusting the position and angle (tilt angle) of the parabolic concave mirror 43 are located. As the substrate material of the parabolic concave mirror 43, synthetic quartz, $CaF_2$, Si, Zerodur (registered trademark), Al, Cu, Mo, or the like may be used, and it is desirable that a reflective coating by a dielectric multilayer film is applied to the surface of such a substrate. Furthermore, as the parabolic concave mirror adjusting mechanism 44, a mechanism similar to that shown in FIGS. 3A and 3B may be used.

The laser beam 20 having transmitted through the window 6 and entered the EUV light generating chamber 13 is reflected upward in the figure and focused on the trajectory of the target material by the parabolic concave mirror 43. As a result, the target material is excited and turned into plasma, and EUV light 21 is generated from the plasma.

An EUV light collector mirror 8 reflects the generated EUV light 21 to the right in the figure to focus it on an intermediate focusing point (IF). The EUV light 21 reflected by the EUV light collector mirror 8 passes through a gate valve 10 and a filter 11. The EUV light 21 focused on the intermediate focusing point (IF) is then guided to an exposure unit or the like through transmission optics.

The EUV light source apparatus further includes purge gas supply units 31 and 32, a purge gas guiding path 33 for guiding purge gas injected from the purge gas supply unit 31 to the surface of the window 6 on the internal side of the EUV light generating chamber 13, and a purge gas guiding path 34 for guiding purge gas injected from the purge gas supply unit 32 to the reflecting surface of the parabolic concave mirror 43.

Furthermore, a purge gas chamber 50 which surrounds the window 6, the parabolic concave mirror 43, and the parabolic concave mirror driving mechanism 44 is attached to the inner wall of the EUV light generating chamber 13. The upper side in the figure of the purge gas chamber 50 has a shape of a tapered cylinder, and on the tip (upper side in the figure) thereof has an opening 50a to pass a laser beam 20 reflected by the parabolic concave mirror 43. On the upper part in the figure of the EUV light generating chamber 13, a gate valve 16 is located.

When the EUV light source apparatus according to this embodiment generates EUV light (see FIG. 8), a laser beam optics deterioration determination processing unit 80 executes the processing shown in the flow chart of FIG. 4 previously described, using a signal or data from a temperature sensor 82 attached to the window 6.

Next, the operation at EUV light non-generation of the EUV light source apparatus according to this embodiment will be described with reference to FIG. 9.

When the EUV light source apparatus does not generate EUV light, the target material supply unit 3 does not supply the target material into the EUV light generating chamber 13 and the gate valve 16 is opened as previously described. For this reason, a laser beam focused by the parabolic concave mirror 43 passes through the gate valve 16 and exits upward in the figure from the EUV light generating chamber 13 while dispersing without being applied to the target material.

On the upper side in the figure of the gate valve 16, a laser beam detector 61 is located, and a laser beam having passed through the gate valve 16 enters the laser beam detector 61, which detects the intensity of the incident laser beam. A signal or data representing the intensity of the laser beam detected by the laser beam detector 61 is sent to the laser beam optics deterioration determination processing unit 80.

When the EUV light source apparatus according to this embodiment does not generate EUV light (see FIG. 9), the laser beam optics deterioration determination processing unit 80 executes the processing shown in the flow chart of FIG. 7 previously described, using a signal or data from the laser beam detector 61. In this embodiment, the parabolic concave mirror 43 which is one of two or more optical elements constituting laser beam focusing optics is located in the EUV light generating chamber 13. Also when the reflecting surface of the parabolic concave mirror 43 is deteriorated, the reflectance of the parabolic concave mirror 43 for a laser beam decreases, and thereby the intensity of a laser beam irradiated onto the target material decreases. For this reason, when the intensity W of a laser beam detected by the laser beam detector 61 is less than the threshold Wth (see step S22 of FIG. 7), the laser beam optics deterioration determination processing unit 80 notifies that the window 6 and/or the parabolic concave mirror 43 are/is deteriorated (see step S23 of FIG. 7).

As described above, according to this embodiment, when EUV light is not generated, it can be easily detected and notified to a user (operator) that the window 6 and/or the parabolic concave mirror 43 are/is deteriorated, so that the user (operator) is able to appropriately determine whether the window 6 and/or the parabolic concave mirror 43 should be replaced or not. As a result, it becomes possible to generate EUV light with stability.

It is desirable that the concave lens 41, the convex lens 42, the window 6, and the parabolic concave mirror 43 are manufactured integrally as a unit to adjust the alignment (position and tilt angle) of the parabolic concave mirror 43 close to a design value, and the alignment of the parabolic concave mirror 43 has been finished so as to be able to obtain a designed laser beam focusing performance before the unit is built in the EUV light generating chamber 13.

Furthermore, in this embodiment, two lenses (the concave lens 41 and the convex lens 42) are used in the laser beam focusing optics, but three or more lenses may be used.

Next, an EUV light source apparatus according to the fourth embodiment of the present invention will be described.

Figure 10:
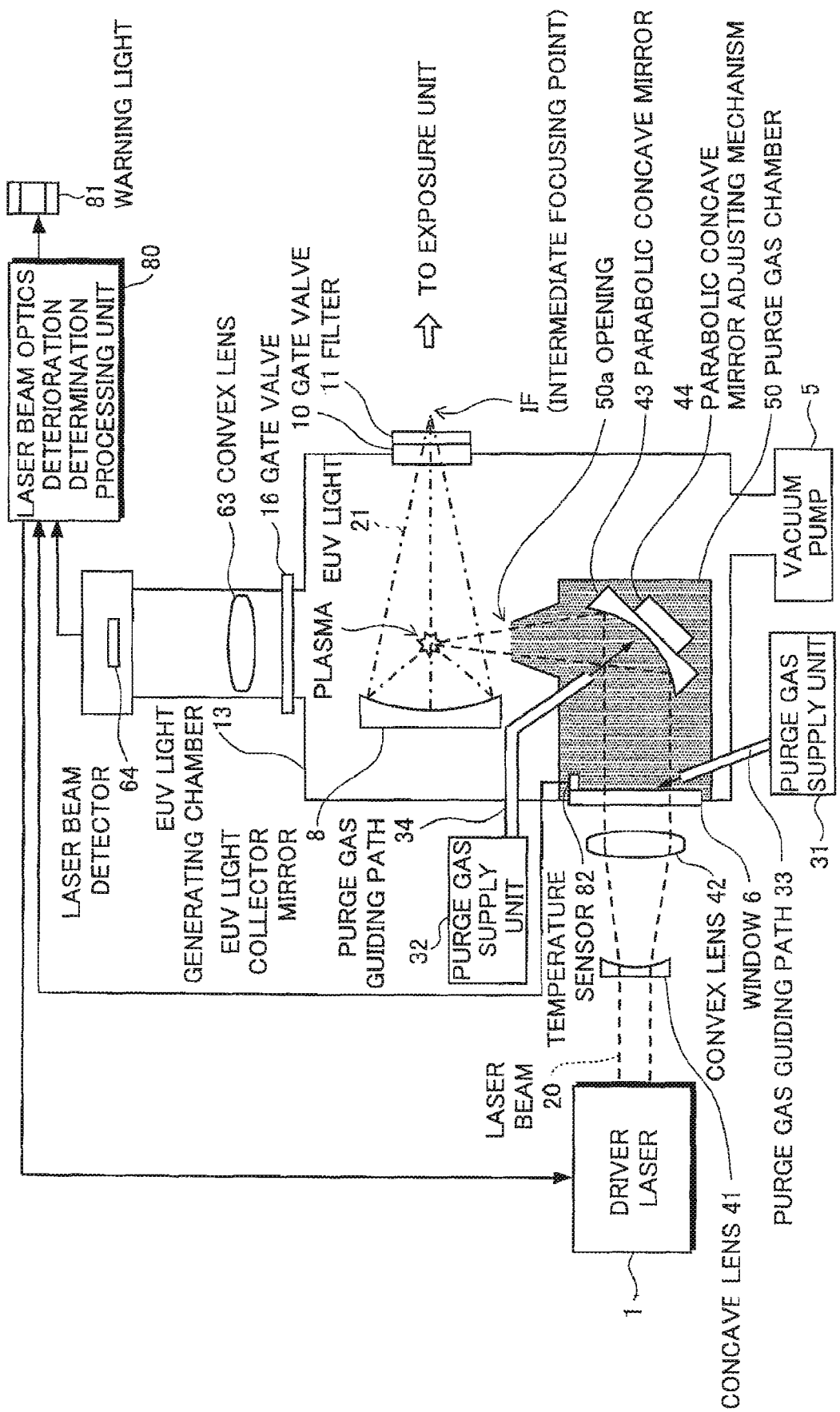
FIG. 10 is a schematic diagram showing the state at EUV light generation of an EUV light source apparatus according to a fourth embodiment of the present invention.
Figure 11:
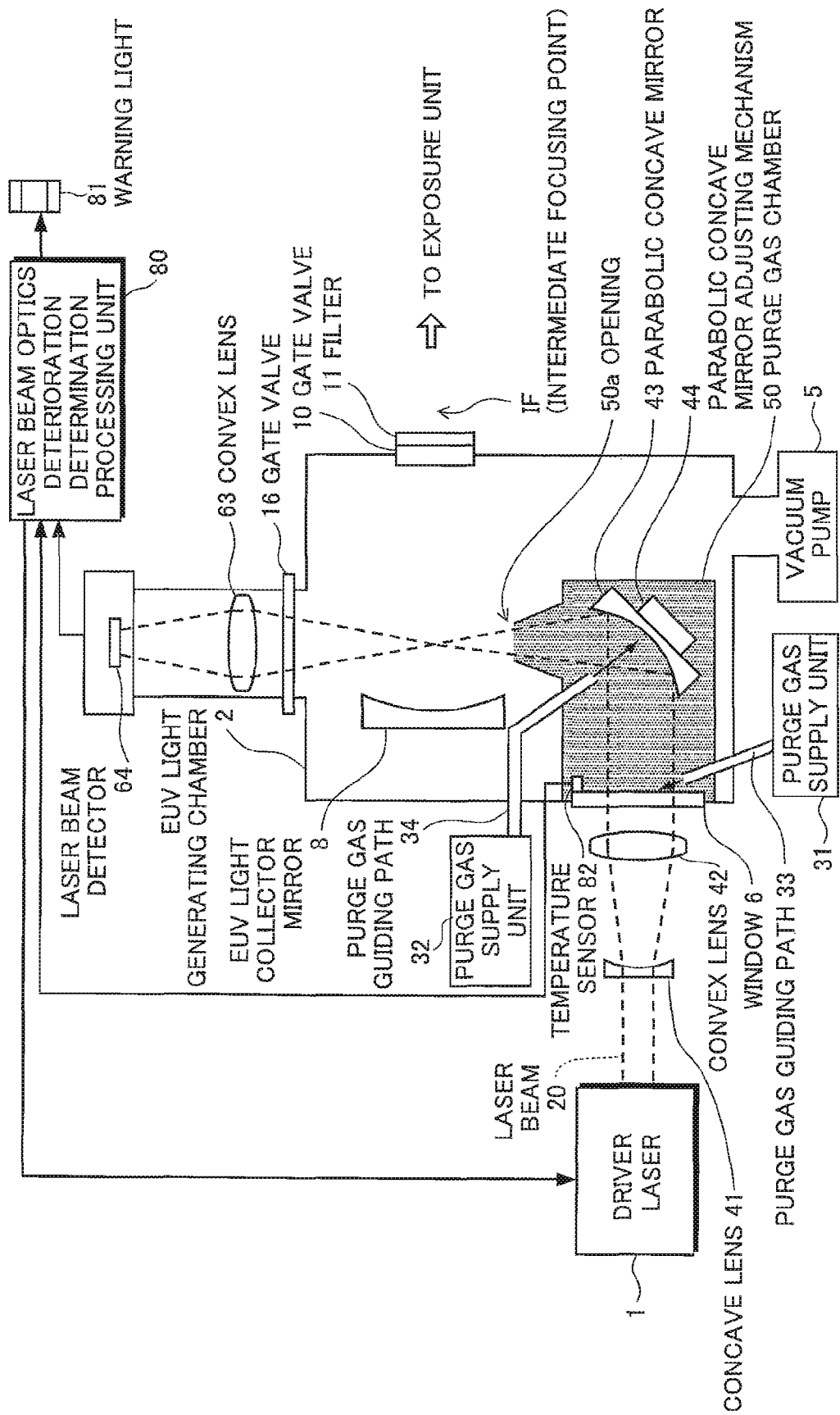
FIG. 11 is a schematic diagram showing the state at EUV light non-generation of the EUV light source apparatus according to the fourth embodiment of the present invention.

FIGS. 10 and 11 are schematic diagrams showing an EUV light source apparatus according to this embodiment. FIG. 10 is a schematic diagram showing the state at EUV light generation of the EUV light source apparatus according to this embodiment, and FIG. 11 is a schematic diagram showing the state at EUV light non-generation of the EUV light source apparatus according to this embodiment. In FIGS. 10 and 11, the target material supply unit 3 and the target material collecting cylinder 7 (see FIG. 1) are omitted, and the target material is assumed to be injected in a direction perpendicular to the paper.

As shown in FIGS. 10 and 11, the EUV light source apparatus includes a convex lens 63 focusing a laser beam passed through the gate valve 16 in addition to the EUV light source apparatus according to the third embodiment (see FIGS. 8 and 9) previously described. Furthermore, the EUV light source apparatus according to this embodiment includes a laser beam detector 64 instead of the laser beam detector 61 of the EUV light source apparatuses according to the second and third embodiments previously described. The laser beam detector 64 has smaller size than the laser beam detector 61.

The operation at EUV light generation of the EUV light source apparatus according to this embodiment (see FIG. 10) is the same as the operation at EUV light generation of the EUV light source apparatus according to the third embodiment previously described (see FIG. 8).

Next, the operation at EUV light non-generation of the EUV light source apparatus according to this embodiment (see FIG. 11) will be described.

As shown in FIG. 11, when the EUV light source apparatus according to this embodiment does not generate EUV light, a laser beam passed through the gate valve 16 is focused by the convex lens 63 and enters the laser beam detector 64.

At that time, the laser beam optics deterioration determination processing unit 80 executes the processing shown in the flow chart of FIG. 7 previously described, using a signal or data from the laser beam detector 64.

According to this embodiment, the size of the laser beam detector 64 can be made smaller than that of the laser beam detector 61 in the second and third embodiments previously described by further providing the convex lens 63 focusing a laser beam passed through the gate valve 16.

Next, an EUV light source apparatus according to the fifth embodiment of the present invention will be described.

Figure 12:
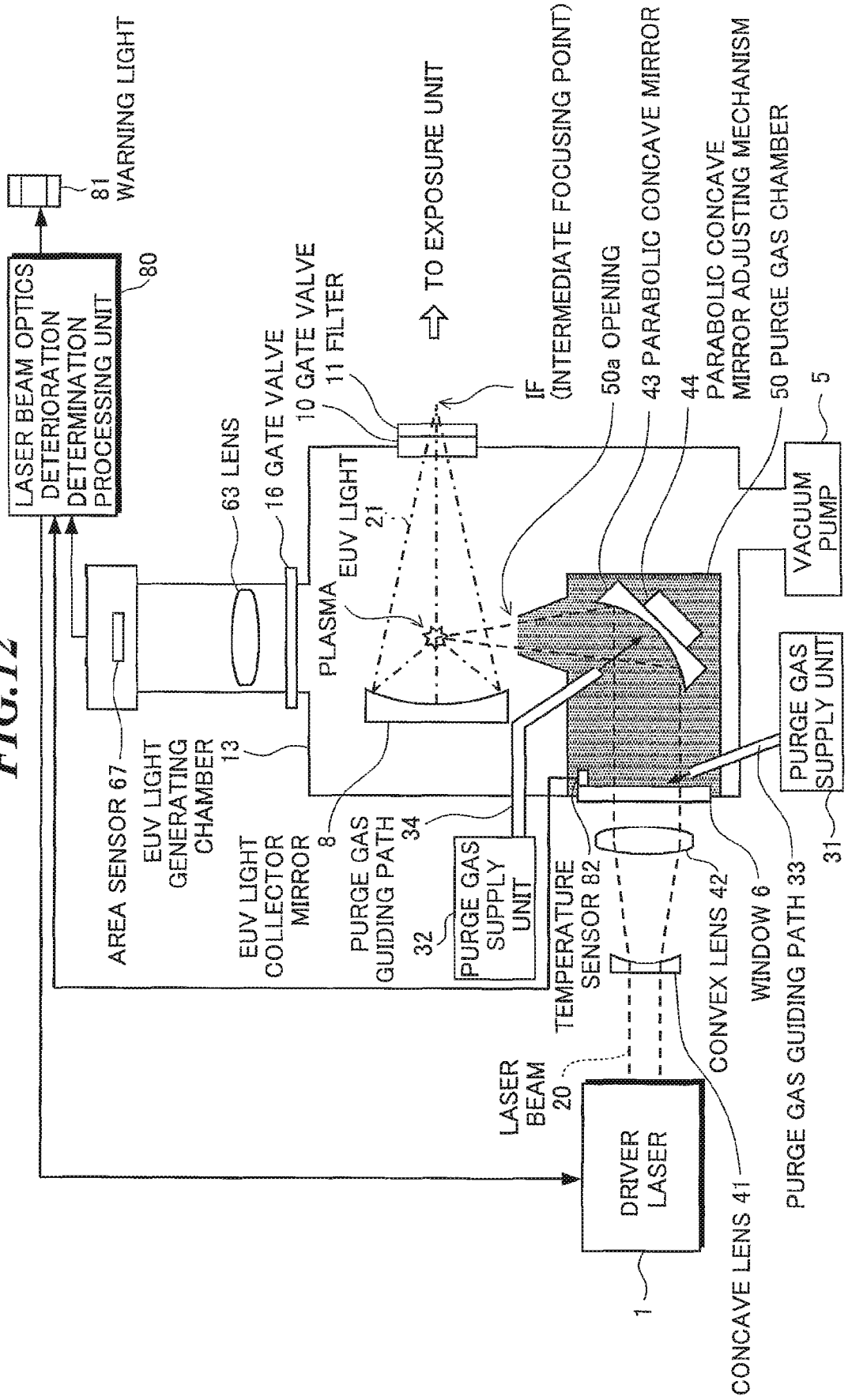
FIG. 12 is a schematic diagram showing the state at EUV light generation of an EUV light source apparatus according to a fifth embodiment of the present invention.
Figure 13:
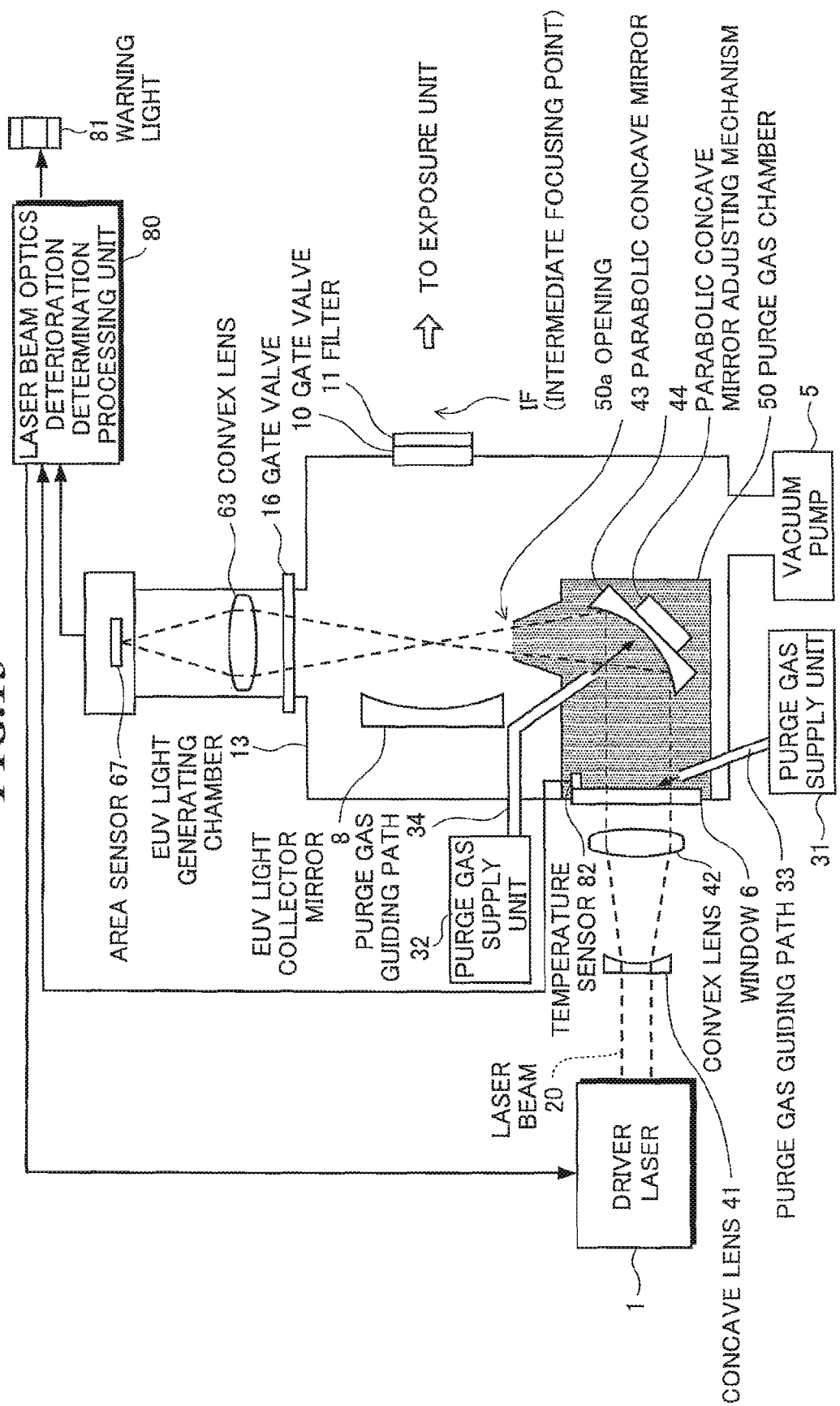
FIG. 13 is a schematic diagram showing the state at EUV light non-generation of the EUV light source apparatus according to the fifth embodiment of the present invention.

FIGS. 12 and 13 are schematic diagrams showing an EUV light source apparatus according to this embodiment. FIG. 12 is a schematic diagram showing the state at EUV light generation of the EUV light source apparatus according to this embodiment, and FIG. 13 is a schematic diagram showing the state at EUV light non-generation of the EUV light source apparatus according to this embodiment. In FIGS. 12 and 13, the target material supply unit 3 and the target material collecting cylinder 7 (see FIG. 1) are omitted, and the target material is assumed to be injected in a direction perpendicular to the paper.

As shown in FIGS. 12 and 13, the EUV light source apparatus includes an area sensor 67 capable of detecting a two-dimensional image of a laser beam instead of the laser beam detector 64 of the EUV light source apparatus according to the fourth embodiment (see FIGS. 10 and 11) previously described. As the area sensor 67, a CCD area sensor, a CMOS area sensor, or the like may be used. A convex lens 63 focuses a laser beam focused and then diverged by the parabolic concave mirror 43 so as to make a focus on the light-receiving surface of the area sensor 67. The area sensor 67 detects a two-dimensional image of an incident laser beam and sends an image signal representing the two-dimensional image to a laser beam optics deterioration determination processing unit 80. In this embodiment, the area sensor 67 is assumed to send an image signal of (N×M) pixels to the laser beam optics deterioration determination processing unit 80 (N and M are integers of two or larger).

The operation at EUV light generation of the EUV light source apparatus according to this embodiment (see FIG. 12) is the same as the operation of the EUV light source apparatus according to the fourth embodiment previously described.

Next, the operation at EUV light non-generation of the EUV light source apparatus according to this embodiment will be described with reference to FIG. 13.

As shown in FIG. 13, when the EUV light source apparatus according to this embodiment does not generate EUV light, a laser beam passed through a gate valve 16 is focused by the convex lens 63 and the image of the laser beam is formed on the light-receiving surface of the area sensor 67.

Figure 14:
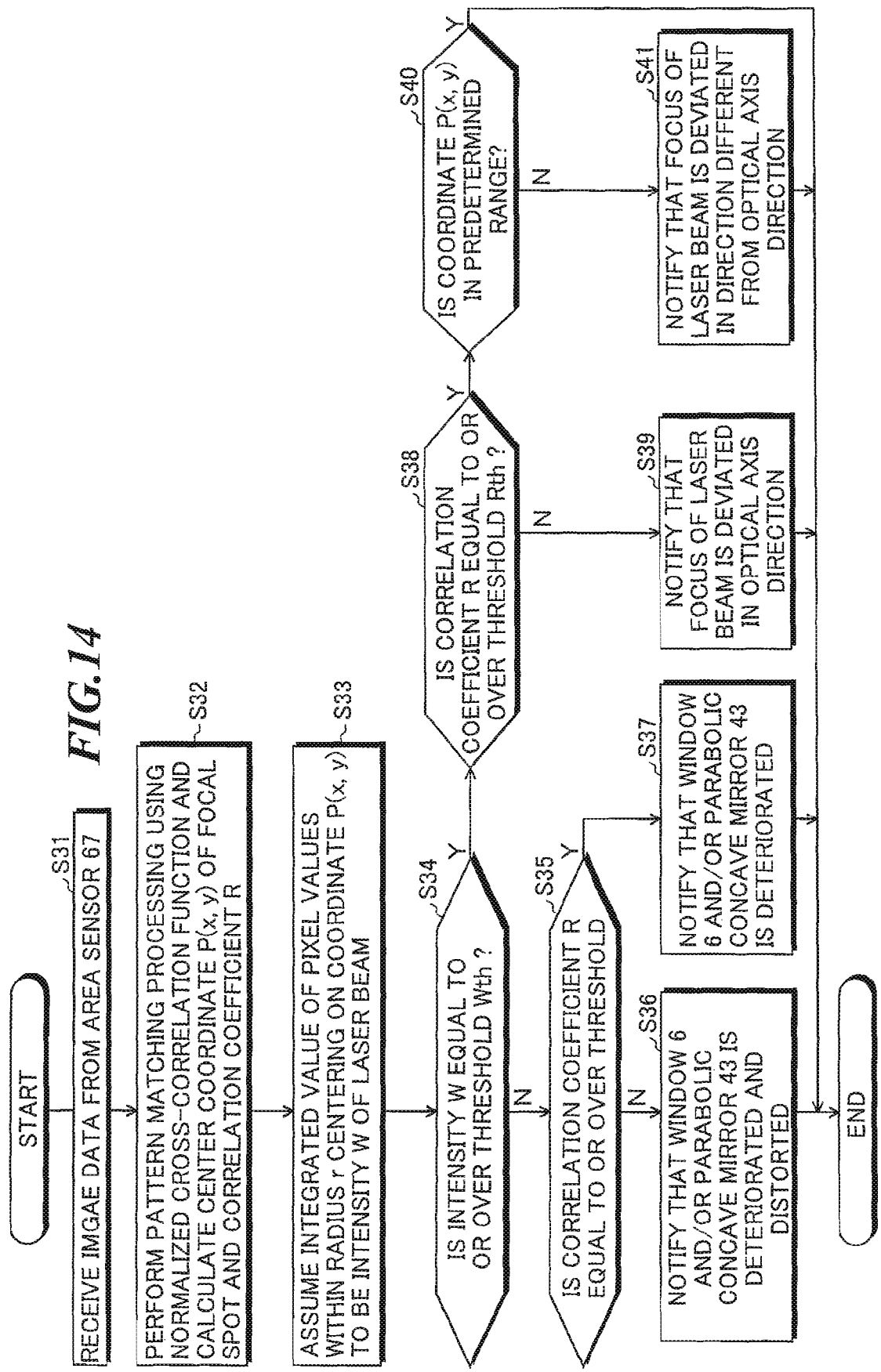
FIG. 14 is a flow chart showing processing executed by laser beam optics deterioration determination processing unit in FIGS. 12 and 13.

FIG. 14 is a flow chart showing the processing executed by the laser beam optics deterioration determination processing unit 80 when the EUV light source apparatus according to this embodiment does not generate EUV light (see FIG. 13).

Figure 15B:
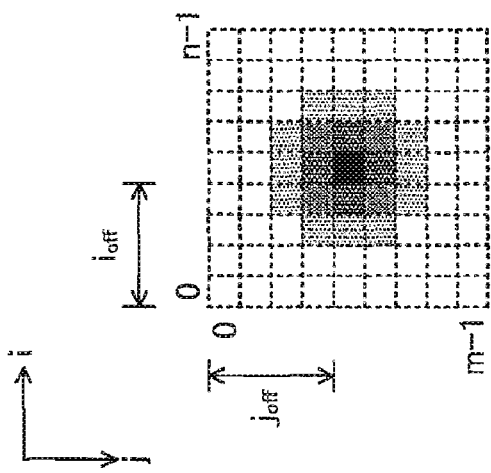
FIGS. 15A and 15B show an example of image data imaged by an area sensor in FIGS. 12 and 13.
Figure 15A:
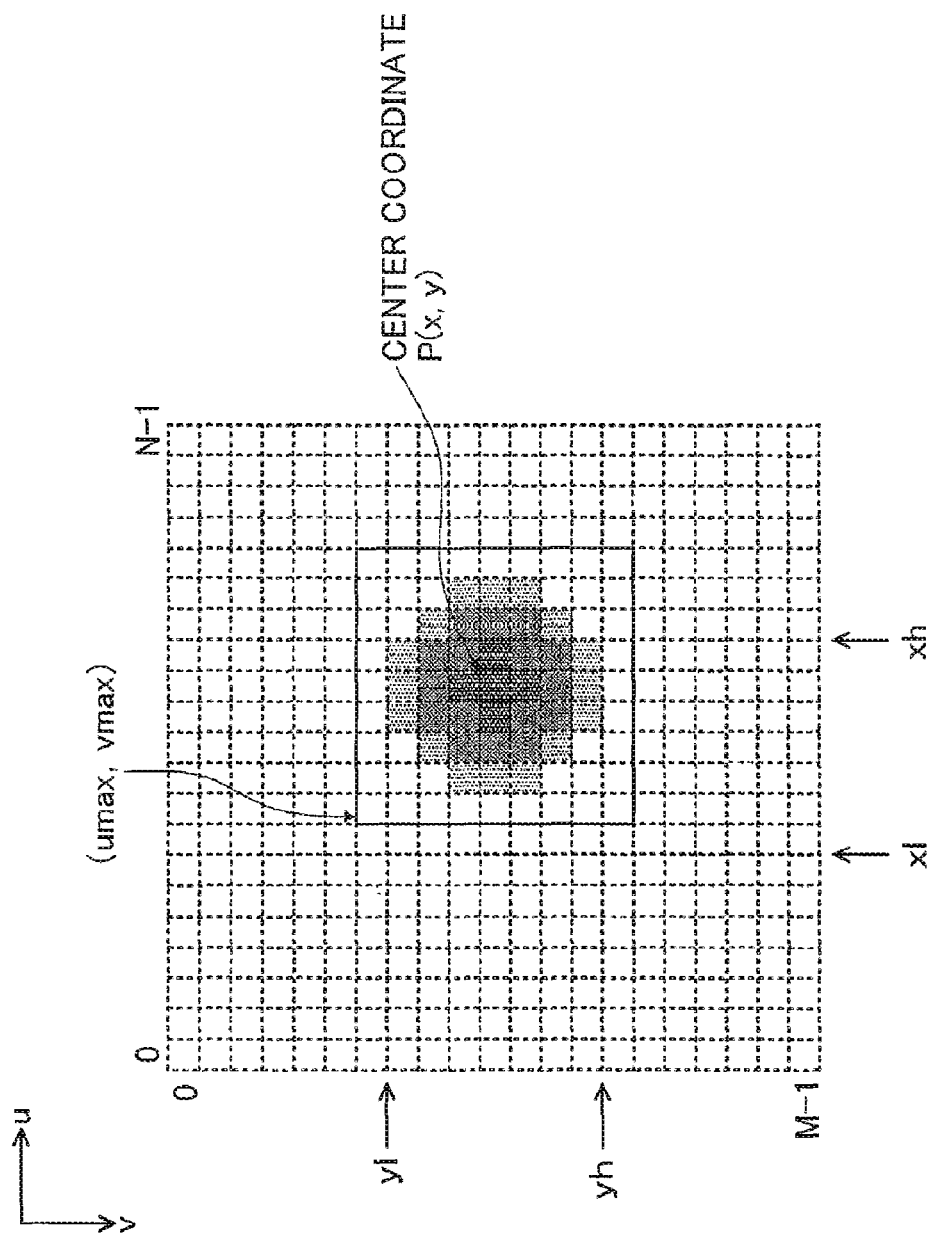
Figure 16:
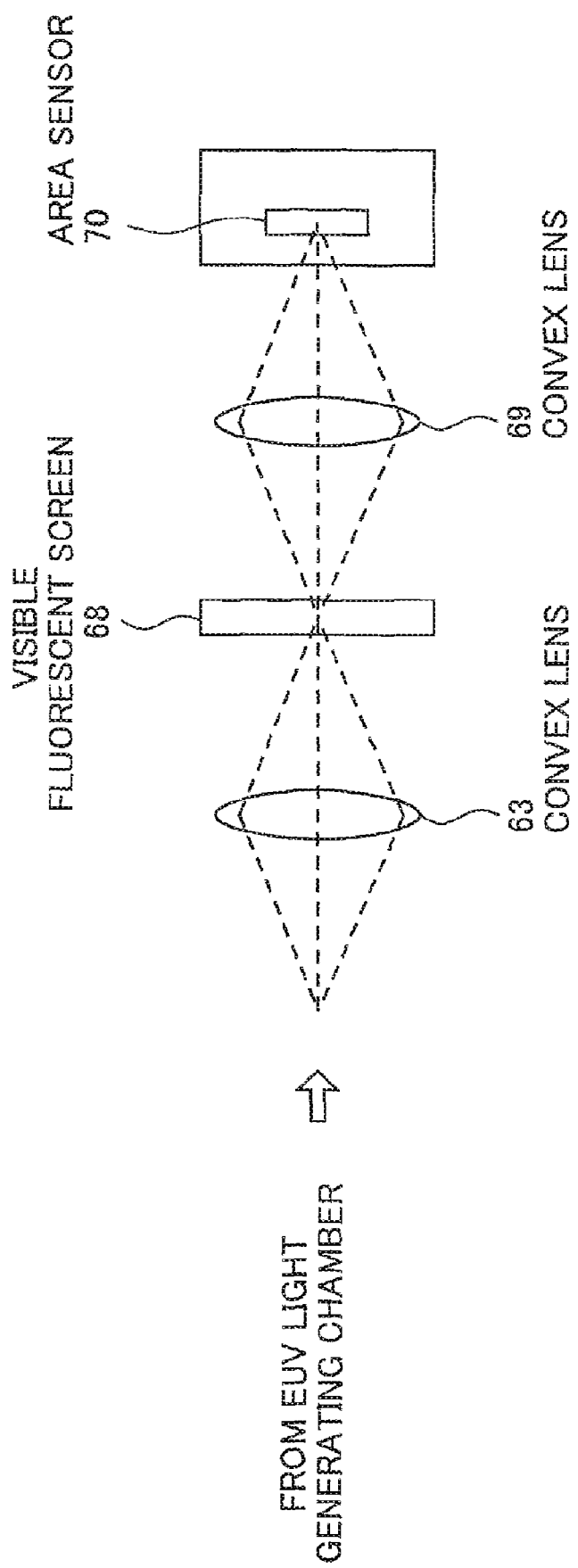
FIG. 16 is a schematic diagram showing an example using another area sensor as a substitute of the area sensor in FIGS. 12 and 13.

First, the laser beam optics deterioration determination processing unit 80 receives an image signal (referred to as "image data" hereinafter) representing the two-dimensional image of a laser beam from the area sensor 67 (step 31). FIG. 15A shows an example of image data which the laser beam optics deterioration determination processing unit 80 receives from the area sensor 67.

Next, the laser beam optics deterioration determination processing unit 80 performs pattern matching processing using a normalized cross-correlation function for predetermined template image data and shot image data, obtains the center coordinate P (x, y) of the focal spot of a laser beam in the shot image data, and calculates a correlation coefficient R at the time (step S32). In this embodiment, the template image data is image data of the focal spot of a laser beam at a normal state where the window 6 and the parabolic concave mirror 43 are not deteriorated and not deviated in alignment, and is assumed to be of (n×m) pixels (where n<N, m<M). FIG. 15B shows an example of template image. In the template image data shown in FIG. 15B, an offset in the direction of i-axis between the coordinate (0, 0) and the center coordinate of the focal spot is assumed to be $i_{off}$ and an offset in the direction of j-axis between them is assumed to be $j_{off}$.

Next, the pattern matching processing using a normalized cross-correlation function will be described. The pattern matching processing using a normalized cross-correlation function is processing of searching for an area having the highest correlation with the template image data (an area of (n×m) pixels in this embodiment) in shot image data by calculating a normalized cross-correlation coefficient NR(u, v) of each coordinate (u, v) of the shot image data with the following equation (1) and searching for the maximum value of the normalized cross-correlation coefficient NR(u, v) where each of the pixel values constituting the template image data is assumed to be T(i, j) (where $0 \leq i \leq n-1$ and $0 \leq j \leq m-1$) and each of the pixels constituting the shot image data is assumed to be F(u, v) (where $0 \leq u \leq N-1$ and $0 \leq v \leq M-1$)

$$NR(u,v) = \frac{\sum_{i=0}^{n-1}\sum_{j=0}^{m-1}(F(i+u, j+v) - \overline{F}(u, v))(T(i, j) - \overline{T})}{\sqrt{\sum_{i=0}^{n-1}\sum_{j=0}^{m-1}(F(i+u, j+v) - \overline{F}(u, v))^2} \sqrt{\sum_{i=0}^{n-1}\sum_{j=0}^{m-1}(T(i, j) - \overline{T})^2}} \quad (1)$$

where $$\overline{F}(u, v) = \frac{\sum_{i=0}^{n-1}\sum_{j=0}^{m-1} F(i+u, j+v)}{n \cdot m} \quad (2)$$

$$\overline{T} = \frac{\sum_{i=0}^{n-1}\sum_{j=0}^{m-1} T(i, j)}{n \cdot m} \quad (3)$$

A value is assumed to be x which is obtained by adding the offset $i_{off}$ previously described to the u-axis component umax of the coordinate (umax, vmax) of the shot image data by which the value of the equation (1) becomes the maximum, a value is assumed to be y which is obtained by adding the offset $j_{off}$ previously described to the v-axis component vmax of the coordinate (umax, vmax), and the coordinate (x, y) is assumed to be the center coordinate P (x, y) of a focal spot.

Furthermore, NR(umax, vmax) is assumed to be a correlation coefficient R.

In other words, $$x = u\text{max} + i_{off} \quad (4)$$

$$y = v\text{max} + j_{off} \quad (5)$$

$$R = NR(u\text{max}, v\text{max}) \quad (6)$$

Referring to FIG. 14 again, the laser beam optics deterioration determination processing unit 80 integrates the pixel values of pixels lying within a predetermined radius r centering on the center coordinate P(x, y) of the focal spot and assumes the integrated value to be the intensity W of the laser beam (step S33).

Next, at step S34, the laser beam optics deterioration determination processing unit 80 determines whether the intensity W of the laser beam is equal to or larger than a predetermined threshold Wth. When the intensity W of the laser beam is less than the predetermined threshold Wth, the processing unit 80 determines that the window 6 and/or the parabolic concave mirror 43 are/is deteriorated, and advances the processing to step S35. When the intensity W of the laser beam is equal to or larger than the predetermined threshold Wth, the processing unit 80 determines that the window 6 and the parabolic concave mirror 43 are not deteriorated, and advances the processing to step S38.

In step S35, the laser beam optics deterioration determination processing unit 80 further determines whether the correlation coefficient R is equal to or larger than a predetermined threshold Rth. When the correlation b coefficient R is less than the predetermined threshold Rth, the processing unit 80 determines that the distribution of the focal point is abnormal, and that the window 6 and/or the parabolic concave mirror 43 are/is distorted, and advances the processing to step S36. When the correlation coefficient R is equal to or larger than the predetermined threshold Rth, the processing unit 80 determines that the distribution of the focal point is normal, and that the window 6 and the parabolic concave mirror 43 are not distorted, and advances the processing to step S37.

When the intensity W of the laser beam is less than the predetermined threshold Wth and the correlation coefficient R is less than the predetermined threshold Rth, the laser beam optics deterioration determination processing unit 80 determines that the window 6 and/or the parabolic concave mirror 43 are/is deteriorated and that the window 6 and/or the parabolic concave mirror 43 is distorted, and notifies a user (operator) of the fact (step S36). In this case, the user (operator) is able to make the EUV light source apparatus normally generate EUV light by replacing the window 6 and/or the parabolic concave mirror 43. The fact that the window 6 and/or the parabolic concave mirror 43 are/is deteriorated and distorted may be notified by lighting or flashing a warning light 81 or changing the flashing pattern of it, by sounding a buzzer or the like, or by displaying characters or images on a display device such as an LCD.

On the other hand, when the intensity W of the laser beam is less than the predetermined threshold Wth and the correlation coefficient R is equal to or larger than the predetermined threshold Rth, the laser beam optics deterioration determination processing unit 80 determines that the window 6 and/or the parabolic concave mirror 43 are/is deteriorated, and notifies the user (operator) of the fact (step S37). In this case also, the user (operator) is able to make the EUV light source apparatus normally generate EUV light by replacing the window 6 and/or the parabolic concave mirror 43.

In step S38, the laser beam optics deterioration determination processing unit 80 determines whether the correlation coefficient R is equal to or larger than the predetermined threshold Rth also when the intensity W of the laser beam is equal to or larger than the predetermined threshold Wth. When the correlation coefficient R is less than the predetermined threshold Rth, the processing unit 80 determines that the focus of the laser beam is deviated in the direction of the optical axis of the laser beam (the direction of z-axis in FIGS. 3A and 3B), and advances the processing to step S39. When the correlation coefficient R is equal to or larger than the predetermined threshold Rth, the processing unit 80 determines that the focus of the laser beam is not deviated in the direction of the optical axis, and advances the processing to step S40.

When the intensity W of the laser beam is equal to or larger than the predetermined threshold Wth and the correlation coefficient R is less than the predetermined threshold Rth, the laser beam optics deterioration determination processing unit 80 determines that the focus of the laser beam is deviated in the direction of the optical axis of the laser beam (the direction of z-axis in FIGS. 3A and 3B), and notifies a user (operator) of the fact (step S39). In this case, the user (operator) is able to make the EUV light source apparatus generate desired EUV light by operating the parabolic concave mirror adjusting mechanism 44 to move the parabolic concave mirror 43 in the direction of z-axis in FIGS. 3A and 3B.

On the other hand, when the intensity W of the laser beam is equal to or larger than the predetermined threshold Wth and the correlation coefficient R is equal to or larger than the predetermined threshold Rth, the laser beam optics deterioration determination processing unit 80 further determines whether the center coordinate P (x, y) of the focal spot is located within a predetermined range (step S40). The processing unit 80 is able to determine whether the center coordinate P(x, y) of the focal spot is located within the predetermined range by determining whether x is located between predetermined thresholds xl and xh (see FIG. 15A), in other words, whether xl<x<xh holds, and by determining whether y is located between predetermined thresholds yl and yh (see FIG. 15A), in other wards, whether yl<y<yh holds.

In step S40, the laser beam optics deterioration determination processing unit 80 determines that the window 6 and/or the parabolic concave mirror 43 are/is not deteriorated, distorted, nor deviated in alignment, and finishes the processing, when the center coordinate P(x, y) of the focal spot is located in the predetermined range, while The processing unit 80 determines that the focus of the laser beam is deviated in a direction different from the optical axis of the laser beam and the parabolic concave mirror 43 is deviated in x, y alignment, and advances the processing to step S41, when the center coordinate P(x, y) of the focal spot is not located in the predetermined range. When the parabolic concave mirror 43 is deviated in x, y alignment, the parabolic concave mirror 43 may be deviated in the direction of x-axis and/or the direction of y-axis in FIGS. 3A and 3B, or the tilt angle of the parabolic concave mirror 43 may be deviated in the θx direction and/or the θy direction in FIGS. 3A and 3B. While the window 6 and the parabolic concave mirror 43 have no abnormality, the processing unit 80 may return the processing to step S31 to repeatedly make determinations about the intensity of the laser beam.

In step S41, the laser beam optics deterioration determination processing unit 80 notifies a user (operator) that the parabolic concave mirror 43 has been deviated in x, y alignment. In this case, the user (operator) is able to make the EUV light source apparatus generate desired EUV light by operating the parabolic concave mirror adjusting mechanism 44 to move the parabolic concave mirror 43 in the direction of x-axis and/or the direction of y-axis in FIGS. 3A and 3B and adjust the tilt angle of the parabolic concave mirror 43.

As described above, according to this embodiment, when EUV light is not generated, it can be easily detected and notified to a user (operator) that the window 6 and/or the parabolic concave mirror 43 are/is deteriorated and/or distorted, and/or that the focus of the laser beam is deviated, so that the user (operator) is able to appropriately determine whether the window 6 and/or the parabolic concave mirror 43 should be replaced, and/or whether alignment adjustment should be made. As a result, EUV light can be generated with stability.

In this embodiment, although it is assumed that a laser beam focused by the convex lens 63 is made directly enter the area sensor 67, the laser beam focused by the convex lens 63 may be made directly enter a visible fluorescent screen 68 to be converted to a visible beam, which may be focused by the convex lens 69 and entered in a common area sensor 70 which is sensitive to visible light. Thus, an inexpensive area sensor 70 which is sensitive to visible light can be used instead of the expensive area sensor 67 which is sensitive to a laser beam. Furthermore, even if the EUV light source apparatus according to this embodiment has been used for a long term and the visible fluorescent screen 68 is deteriorated, the area sensor 70 can be restricted from being deteriorated. In that case, only the visible fluorescent screen 68 which is cheaper than the area sensor 70 needs to be replaced while the area sensor 70 does not need to be replaced.

Next, an EUV light source apparatus according to the sixth embodiment of the present invention will be described.

Figure 17:
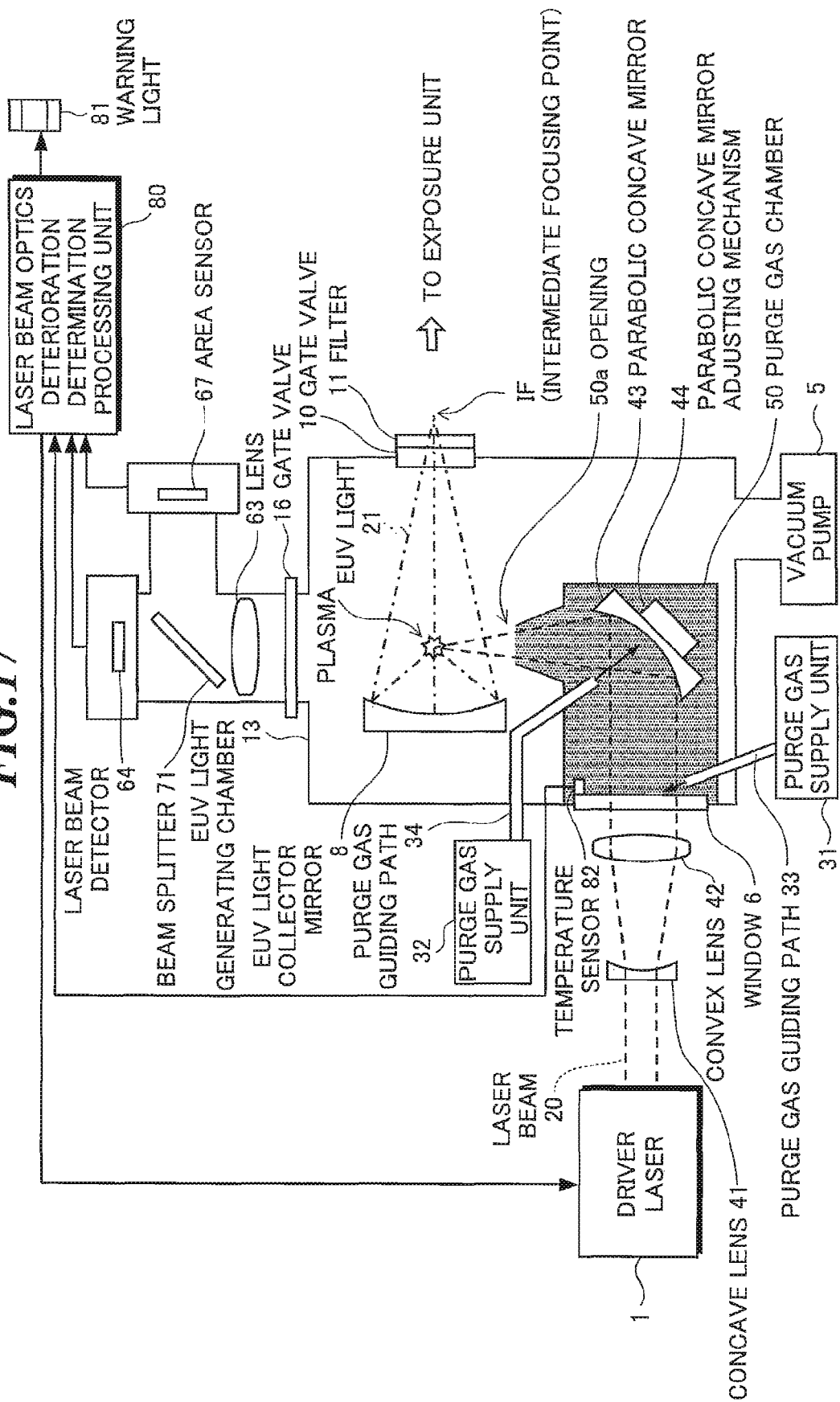
FIG. 17 is a schematic diagram showing the state at EUV light generation of an EUV light source apparatus according to a sixth embodiment of the present invention.
Figure 18:
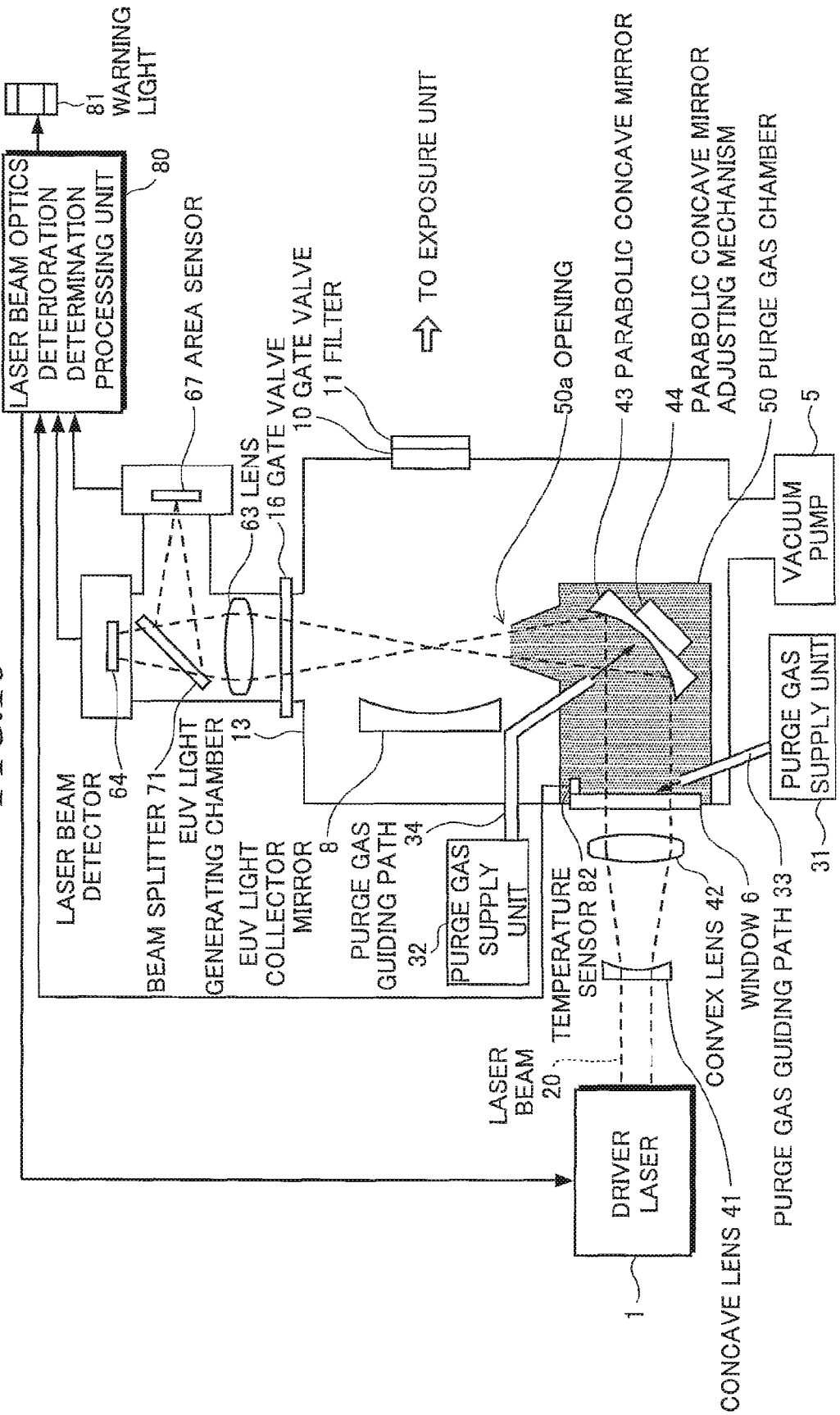
FIG. 18 is a schematic diagram showing the state at EUV light non-generation of the EUV light source apparatus according to the sixth embodiment of the present invention.

FIGS. 17 and 18 are schematic diagrams showing an EUV light source apparatus according to this embodiment. FIG. 17 is a schematic diagram showing the state at EUV light generation of the EUV light source apparatus according to this embodiment, and FIG. 18 is a schematic diagram showing the state at EUV light non-generation of the EUV light source apparatus according to this embodiment. In FIGS. 17 and 18, the target material supply unit 3 and the target material collecting cylinder 7 (see FIG. 1) are omitted, and the target material is assumed to be injected in a direction perpendicular to the paper.

As shown in FIGS. 17 and 18, the EUV light source apparatus includes a beam splitter 71 splitting a laser beam focused by the convex lens 63, and an area sensor 67 in the EUV light source apparatus according to the fifth embodiment (see FIGS. 12 and 13) previously described in addition to the EUV light source apparatus according to the fourth embodiment (see FIGS. 10 and 11) previously described.

The operation at EUV light generation of the EUV light source apparatus according to this embodiment (see FIG. 17) is the same as that of the EUV light source apparatus according to the fifth embodiment previously described.

Next, the operation at EUV light non-generation of the EUV light source apparatus according to this embodiment will be described with reference to FIG. 18.

When the EUV light source apparatus according to this embodiment does not generate EUV light, a laser beam passed through the gate valve 16 is focused by the convex lens 63 and split in a first direction (upward in the figure) and a second direction (rightward in the figure) by the beam splitter 71. A laser beam passed through the beam splitter 71 in the first direction enters the laser beam detector 64, and a laser beam passed through the beam splitter 71 in the second direction enters the area sensor 67.

When the EUV light source apparatus according to this embodiment does not generate EUV light, the laser beam optics deterioration determination processing unit 80 executes the processing shown in the flow chart of FIG. 7 using a signal or data from the laser beam detector 64, and executes the processing shown in the flow chart of FIG. 14 using image data from the area sensor 67.

As described above, according to this embodiment, the intensity of a laser beam can be detected by the laser beam detector 64, and the center coordinate, etc. of the laser beam can be detected by the area sensor 67. As a result, it can be determined more surely whether the window 6 and/or the parabolic concave mirror 43 are/is deteriorated and so on.

Next, an EUV light source apparatus according to the seventh embodiment of the present invention will be described.

Figure 19:
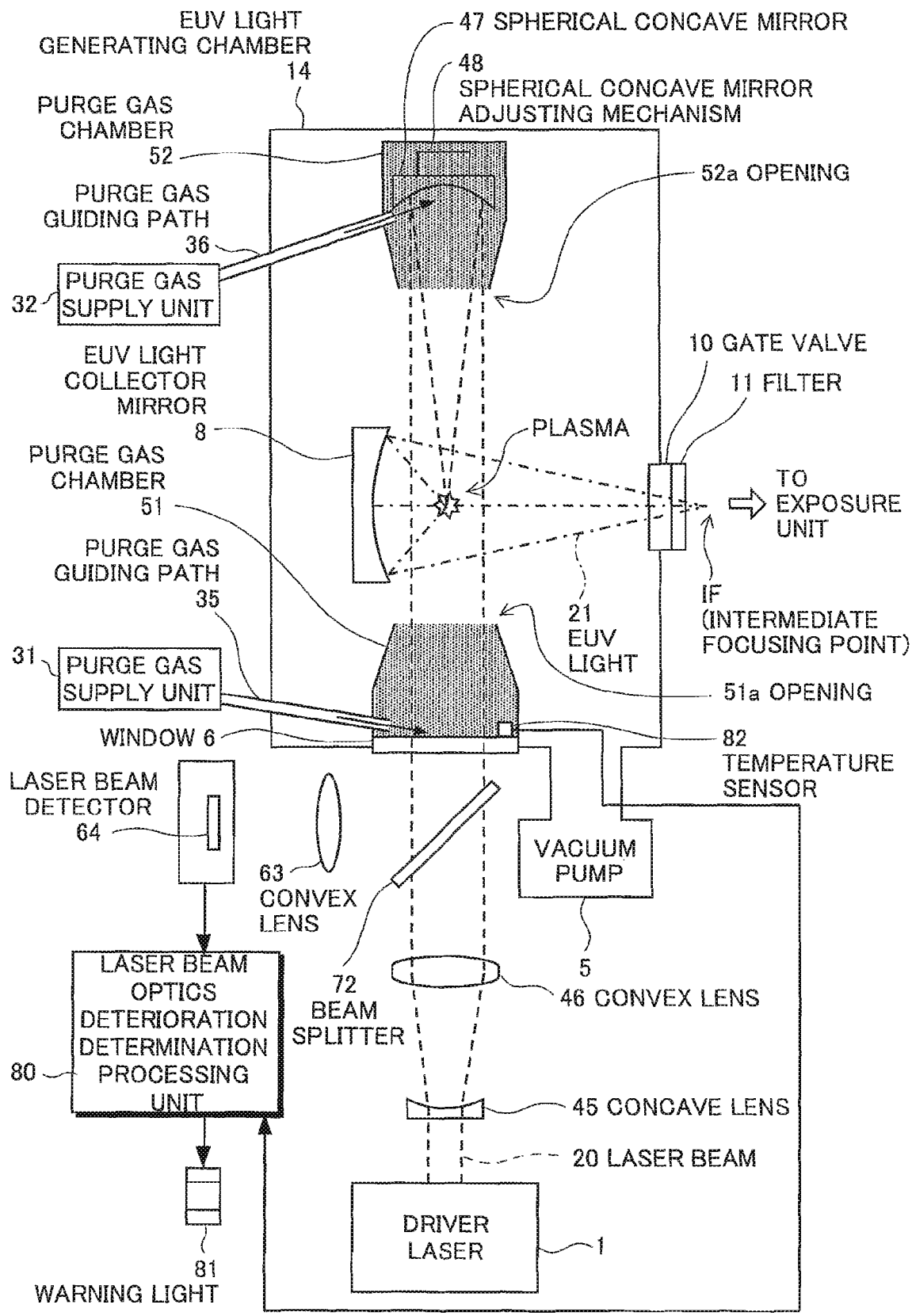
FIG. 19 is a schematic diagram showing the state at EUV light generation of an EUV light source apparatus according to a seventh embodiment of the present invention.
Figure 20:
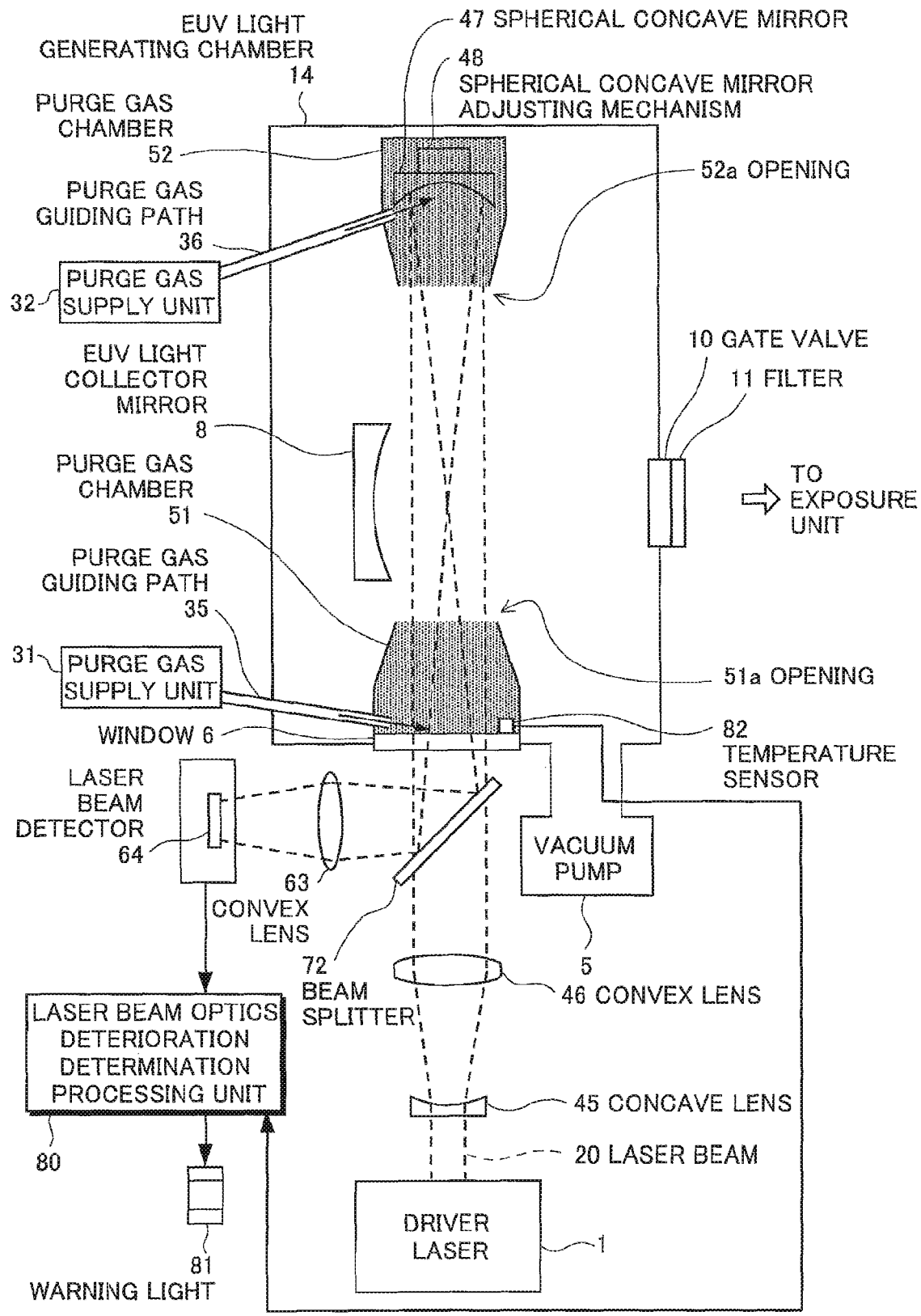
FIG. 20 is a schematic diagram showing the state at EUV light non-generation of the EUV light source apparatus according to the seventh embodiment of the present invention.

FIGS. 19 and 20 are schematic diagrams showing an EUV light source apparatus according to this embodiment. FIG. 19 is a schematic diagram showing the state at EUV light generation of the EUV light source apparatus according to this embodiment, and FIG. 20 is a schematic diagram showing the state at EUV light non-generation of the EUV light source apparatus according to this embodiment. In FIGS. 19 and 20, the target material supply unit 3 and the target material collecting cylinder 7 (see FIG. 1) are omitted, and the target material is assumed to be injected in a direction perpendicular to the paper.

First, the operation at EUV light generation of the EUV light source apparatus according to this embodiment will be described with reference to mainly FIG. 19, and then the operation at EUV light non-generation of the EUV light source apparatus according to this embodiment will be described with reference to mainly FIG. 20.

As shown in FIG. 19, a laser beam 20 emitted upward in the figure from a driver laser 1 is diverged by a concave lens 45 and collimated by a convex lens 46, passes through a beam splitter 72 and a window 6, and enters an EUV light generating chamber 14.

In the EUV light generating chamber 14, a spherical concave mirror 47 and a spherical concave mirror adjusting mechanism 48 adjusting the position and angle (tilt angle) of the spherical concave mirror 47 are located.

The laser beam 20 passed through the window 6 and entered the EUV light generating chamber 14 is reflected downward in the figure by the spherical concave mirror 47 to be focused on the trajectory of the target material. As a result, the target material is excited and turned into plasma, and EUV light 21 is generated.

An EUV light collector mirror 8 reflects the generated EUV light 21 to the right in the figure to focus it on an intermediate focusing point (IF). The EUV light 21 reflected by the EUV light collector mirror 8 passes through a gate valve 10 provided in the EUV light generating chamber 14, and a filter 11. The SIN light 21 focused on the intermediate focusing point (IF) is then guided to an exposure unit or the like through transmission optics.

The EUV light source apparatus further includes purge gas supply units 31 and 32, a purge gas guiding path 35 for guiding purge gas injected from the purge gas supply unit 31 to a surface of the window 6 on the internal side of the EUV light generating chamber 14, and a purge gas guiding path 36 for guiding purge gas injected from the purge gas supply unit 32 to a reflecting surface of the spherical concave mirror 47.

In addition, a purge gas chamber 51 which surrounds the window 6, and a purge gas chamber 52 which surrounds the spherical concave mirror 47 and the spherical concave mirror driving mechanism 48, are located in the EUV light generating chamber 14. The upper side in the figure of the purge gas chamber 51 has shape of a tapered cylinder, and on the tip (upper side in the figure) thereof has an opening 51a for passing a laser beam 20 passed through the window 6. Furthermore, the lower side in the figure of the purge gas chamber 52 has shape of a tapered cylinder, on the tip (lower side in the figure) thereof has an opening 52a for passing a laser beam 20 passed through the window 6 and a laser beam 20 reflected by the spherical concave mirror 47.

When the EUV light source apparatus according to this embodiment generates EUV light (see FIG. 19), a laser beam optics deterioration determination processing unit 80 executes the processing shown in the flow chart of FIG. 4 previously described, using a signal or data from a temperature sensor 82 attached to the window 6.

Next, the operation at EUV light non-generation of the EUV light source apparatus according to this embodiment will be described with reference to FIG. 20.

When the EUV light source apparatus does not generate EUV light, the target material supply unit 3 does not supply the target material into the EUV light generating chamber 14 as previously described. For this reason, a laser beam focused by the spherical concave mirror 47 passes through the window 6 and exits downward in the figure from the EUV light generating chamber 14 while being dispersing without irradiating onto the target material.

The laser beam which is emitted downward in the figure from the EUV light generating chamber is reflected to the left in the figure by the beam splitter 72 and focused by the convex lens 63, and enters the laser beam detector 64. When the EUV light source apparatus according to this embodiment does not generate EUV light, the laser beam optics deterioration determination processing unit 80 executes the processing shown in the flow chart of FIG. 7 previously described.

According to this embodiment, the spherical concave mirror 47 may correct the chromatic aberrations of the concave lens 45 and the convex lens 46 and therefore the laser beam 20 may be focused more efficiently comparing to the case where a parabolic concave mirror is used. As a result, EUV light can be efficiently generated.

In stead of or in addition to the laser beam detector 64, an area sensor 67 maybe provided. In that case, the laser beam optics deterioration determination processing unit 80 may execute the processing shown in the flow chart of FIG. 14 when the EUV light source apparatus according to this embodiment does not generate EUV light.

Next, an EUV light source apparatus according to the eighth embodiment of the present invention will be described.

Figure 21:
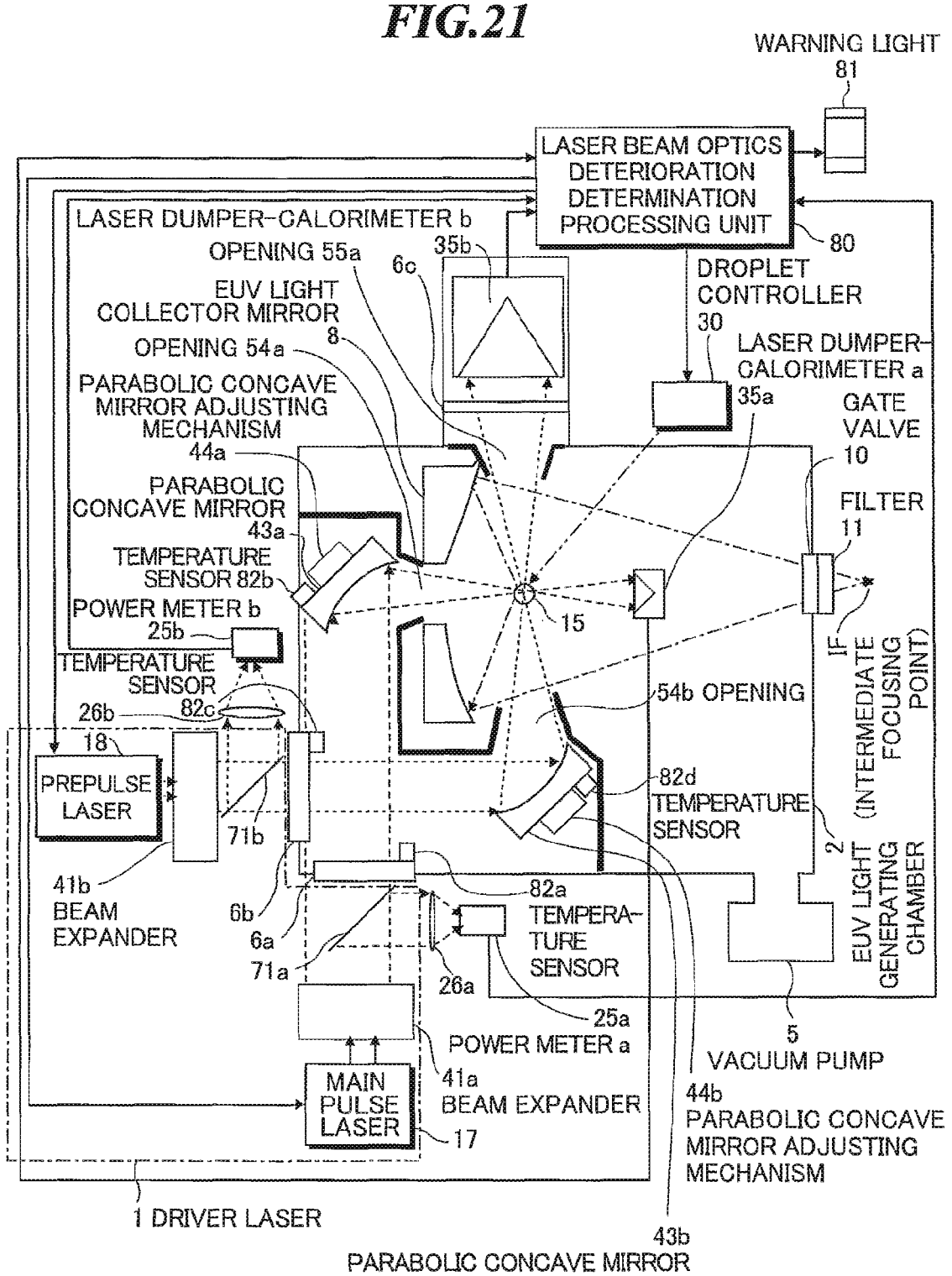
FIG. 21 is a schematic plan view showing the outline of an EUV light source apparatus according to an eighth embodiment of the present invention.
Figure 22:
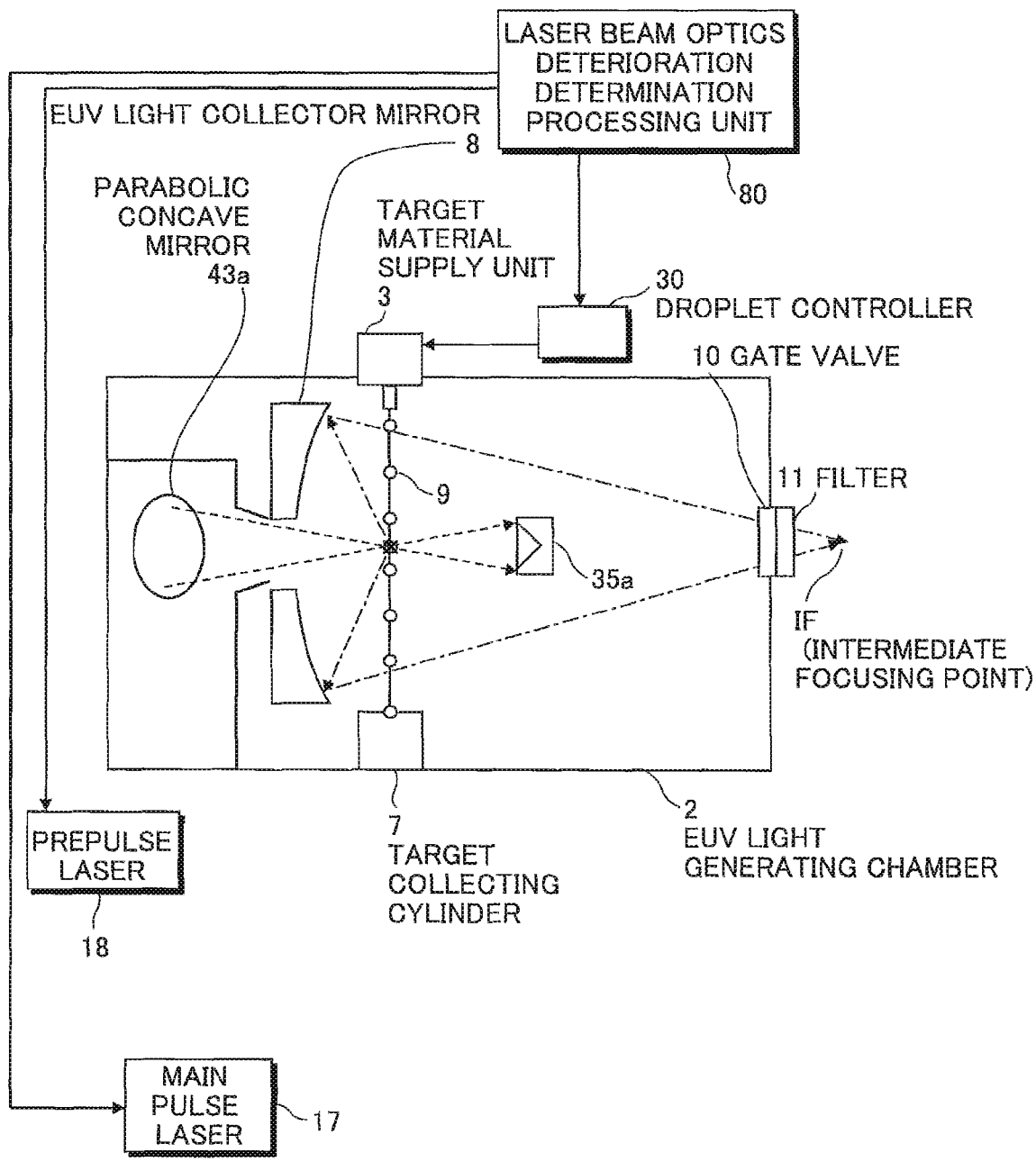
FIG. 22 is a schematic elevation view of the EUV light source apparatus according to the eighth embodiment.

FIG. 21 is a schematic plan view showing the outline of an EUV light source apparatus according to this embodiment, and FIG. 22 is its schematic elevation view.

The EUV light source apparatus of this embodiment is characterized in that it is able to accurately detect deterioration, etc. in laser beam focusing optics of an EUV light generating chamber and thereby promptly cope with a reduction and a fluctuation in the efficiency of EUV light generation. The EUV light source apparatus of this embodiment includes, as shown in the figures, a driver laser 1, an EUV light generating chamber 2, a target material supply unit 3, and laser beam focusing optics including a beam expander 41*a*.

The EUV light source apparatus of this embodiment is a system efficiently causing plasma emission by irradiating a target droplet with a pre-pulse laser beam to expand the target or turn the target into plasma and irradiating the target which has been expanded or turned into plasma with a main pulse laser beam.

The driver laser 1 is a master oscillator power amplifier type laser apparatus generating a drive laser beam used for exciting the target material, and includes a main pulse laser 17 and a pre-pulse laser 18 as shown in FIG. 21 with a chain line. As the driver laser 1, publicly known various lasers (for example, ultra violet lasers such as KrF and XeF and infrared lasers such as Ar, $CO_2$, and YAG) can be used.

The EUV light generating chamber 2 is a vacuum chamber in which EUV light is generated. Windows 6*a* and 6*b* to pass laser beams generated by the main pulse laser 17 and the pre-pulse laser 18 of the driver laser 1 to the inside of the EUV light generating chamber 2 are attached to the EUV light generating chamber 2. In addition, a target injection nozzle of the target material supply unit 3, a target collecting cylinder 7, and an EUV light collector mirror 8 are located in the EUV light generating chamber 2.

The target material supply unit 3 supplies the target material used to generate EUV light into the EUV light generating chamber 2 through the target injection nozzle. Target material which has remained without being irradiated with a laser beam of the supplied target material is collected by the target collecting cylinder 7. As a target material, publicly known various material (e.g. tin (Sn), xenon (Xe), etc.) can be used. Furthermore, the state of the target material may be any one of solid, liquid, and gas, and may be supplied to the space in the EUV light generating chamber 2 in any publicly known state such as a continuous flow (target injection flow) or a droplet. For example, when liquid xenon (Xe) target is used as the target material, the target material supply unit 3 is composed of a gas cylinder which supplies high purity xenon gas, a mass flow controller, a cooling apparatus to liquefy xenon gas, a target injection nozzle, etc. On the other hand, when tin (Sn) is used as the target material, the target material supply unit 3 is composed of a heating apparatus for heating to liquefy Sn, a target injection nozzle, etc. Furthermore, when droplets are to be generated, a vibrator such as a piezoelectric element is added to the configuration.

The target material supply unit 3 is controlled by a droplet controller 30 and supplies the target material into the EUV light generating chamber 2 when the EUV light source apparatus generates EUV light, while the target material supply unit 3 does not supply the target material into the EUV light generating chamber 2 when the EUV light source apparatus does not generate EUV light.

Pre-pulse laser beam focusing optics is composed of a beam expander 41*b*, a window 6*b*, and a parabolic concave mirror 43*b*, and focuses a laser beam emitted from the pre-pulse laser 18 so as to make a focus on the trajectory of the target material through an opening 54*b*. Furthermore, main pulse laser beam focusing optics is composed of a beam expander 41*a*, a window 6*a*, and a parabolic concave mirror 43*a*, and focuses a laser beam emitted from the main pulse laser 17 so as to make a focus on the target material 9 expanded by a pre-pulse laser beam. As a result, the target material 9 is excited and turned into plasma, and EUV light is generated. The laser beam focusing optics may be composed of one optical element (e.g. one piece of convex lens, or the like), and may be composed of two or more optical elements. When laser beam focusing optics is composed of two or more optical elements, some of them may be located in the EUV light generating chamber 2.

When an excimer laser, a harmonic light of a YAG laser, or a fundamental wave YAG laser is used as the main pulse laser 17 or the pre-pulse laser 18, the material of the concave lenses and the convex lenses constituting the expanders 41*a* and 41*b*, and the windows 6 is desirable to be selected from material absorbing little of a laser beam, such as synthetic quartz, $CaF_2$, $MgF_2$, or the like. When an infrared laser such as a $CO_2$ laser is used as the main pulse laser 17, ZnSe, GaAs, Ge, Si, diamond, etc. are suitable for the material of the concave lenses, the convex lenses, and the windows 6. Furthermore, it is desirable that an anti-reflection (AR) coating by a dielectric multilayer film is applied to the surfaces of the concave lenses, the convex lenses, and the windows 6.

The EUV light collector mirror 8 is an elliptical concave mirror having an Mo/Si film formed on the surface thereof for reflecting light having a wavelength of 13.5 nm, for example, at a high reflectance, and focuses the EUV light generated from plasma by reflecting the EUV light and guides it to transmission optics. Thereafter, the EUV light is guided to an exposure unit or the like through the transmission optics.

As shown in FIG. 21, a pre-pulse laser beam is expanded by the beam expander 41*b*, part of the expanded laser beam is branched by a beam splitter 71*b* and enters a power meter 25*b* through a convex lens 26*b*, and thus an output Wp0 of the pre-pulse laser before entering the EUV light generating chamber 2 is monitored.

On the other hand, a pre-pulse laser beam transmitted through the beam splitter 71*b* passes through the window 6*b*, enters the EUV light generating chamber 2, is incident and reflected by an off-axis parabolic concave mirror 43*b*, and is focused and irradiated onto a droplet 9 supplied from the target material supply unit 3 in synchronization with the timing of the droplet 9 arriving at a predetermined position. Then, the droplet 9 onto which the laser beam has been irradiated is instantaneously expanded or turned into plasma.

On the other hand, a main pulse laser beam is expanded by the beam expander 41*a* and split by a beam splitter 71*a*, split part of the expanded laser beam enters a power meter 25*a* through a convex lens 26*a*, and thus an output Wm0 of the main pulse laser before entering the EUV light generating chamber 2 is monitored. The remainder after the split transmits through the window 6*a*, enters the EUV light generating chamber 2, is incident and reflected by an off-axis parabolic concave mirror 43*a*, and is focused and irradiated onto a target which has been expanded by a pre-pulse laser beam through an opening 54*a*.

Since the main pulse laser beam irradiates a droplet 9 which has been expanded or turned into plasma by being irradiated with the pre-pulse laser beam, EUV light generation with a high efficiency of conversion to EUV can be achieved.

As the substrate material of the parabolic concave mirror 43b for focusing a pre-pulse laser beam, synthetic quartz, $CaF_2$, Si, Zerodur (registered trademark), Al, Cu, Mo, or the like may be used, and it is desirable that a high reflective coating by a dielectric multilayer film is applied to the surface of such a substrate.

Furthermore, when the main pulse laser 17 is a $CO_2$ laser, Cu or the like in which a cooling apparatus is built may be used as the substrate material of the parabolic concave mirror 43a for focusing a main pulse laser beam, and it is desirable that a high reflective coating by Au is applied to the surface of such a substrate.

The EUV light source apparatus of this embodiment includes temperature monitors installed on laser optical elements.

Temperature sensors 82a, 82b, 82c, and 82d such as thermometers, platinum resistance temperature detectors, or radiation thermometers are installed on the window 6a and the parabolic concave mirror 43a for the main pulse laser and the window 6b and the parabolic concave mirror 43b for the pre-pulse laser. If these optical elements are deteriorated, they absorb the laser beam, generate heat, and rise in temperature. For this reason, the temperature sensors are provided to detect deterioration of the optical elements by detecting the temperatures thereof.

The EUV light source apparatus of this embodiment further includes a laser dumper-calorimeter 35a for the main pulse laser beam and a laser dumper-calorimeter 35b for the pre-pulse laser beam, and is able to measure energies in a target position (focal point 15) of the pre-pulse laser beam and the main pulse laser beam.

When the energy in the target position (focal point 15) of the laser beam is measured, the laser beam optics deterioration determination processing unit 80 sends a command to the droplet controller 30 and the main pulse laser 17 or the pre-pulse laser 18 so that there is no droplet in the focal point 15 position at a time when the laser beam is focused and irradiated thereto.

The pre-pulse laser beam is once focused on the focal point 15 by the parabolic concave mirror 43b, and passes through the focal point 15 without colliding with a droplet. After that, while spreading, the pre-pulse laser beam passes through the opening 55a, passes through the window 6c, enters the laser dumper-calorimeter 35b, and is absorbed by the laser dumper-calorimeter 35b. The energy Wp at the focal point 15 of the pre-pulse laser beam is detected by a calorimeter part of the laser dumper-calorimeter 35b.

Furthermore, the main pulse laser beam is once focused on the focal point 15 by the parabolic concave mirror 43a, and passes through the focal point 15 without colliding with a droplet. After that, while spreading, it enters the laser dumper-calorimeter 35a and is absorbed by the laser dumper-calorimeter 35a. The energy Wm at the focal point 15 of the main pulse laser beam is detected by a calorimeter part of the laser dumper-calorimeter 35a.

It is desirable that debris shields surrounded with walls excluding portions which open in the shape of a funnel toward the focal point 15 are installed in order to protect the windows 6a, 6b, and 6c and the parabolic concave mirrors 43a and 43b from debris.

As shown in FIG. 21, the focal point 15 of the laser beam is a point where the optical path of the main pulse laser beam traveling in parallel with the paper in the figure and the optical path of the pre-pulse laser beam traveling in a direction perpendicular to the main pulse laser beam cross the trajectory of a droplet 9 perpendicular to the paper. In the case of metal target such as Sn, when the target is expanded or turned into plasma by the pre-pulse laser beam, the center position of the target expanded or turned into plasma may be somewhat displaced. In such a case, the focal point of the pre-pulse laser beam does not always meet the focal point of the main pulse laser beam. However, the displacement between two of the focal points is very small, so that no error is caused in detecting the energies of both of the laser beams. In this specification, it is described that the focal points 15 meet each other. However, even if there is a distance between two of the focal points, it is so small that there is no problem in applying this embodiment.

Methods of preventing any droplet from existing on a focal point 15 when measuring irradiated energy of laser beams include the following three methods.

(a) A method of measuring energies of the main pulse laser beam and the pre-pulse laser beam while stopping generation of droplets. This method has an advantage of measuring energies without changing the optical axes of both of the laser beams.

(b) A method of measuring energies of the laser beams while avoiding a collision between a droplet and the pulse laser beam by shifting the droplet generation timing or the oscillation timing of the main pulse laser beam or the pre-pulse laser beam. If generation of droplets is once stopped, considerable time is needed until droplets are regularly generated. This method has an advantage of needing only short time to return to a normal state because only the timing of droplet generation is shifted. Furthermore, the optical axes of the laser beams are not changed. On the other hand, the method of measuring energies of the laser beams while avoiding collision between droplets and the laser beams by shifting the oscillation timing of the main pulse laser beam or the pre-pulse laser beam has an advantage that the rise time of EUV light can be short enough because it is not necessary to change the droplet generation timing, but only the laser oscillation timing should be changed, and therefore a very stable state can be maintained with respect to the optical axes of both of the lasers and the droplet generation timing.

(c) A method of measuring energy of the laser beams in such a way that the generation of droplets is left as it is and the optical axes of the main pulse laser beam and the pre-pulse laser beam are slightly shifted from a target so that each of them does not contact with the droplet or the target expanded or turned into plasma. This method has an advantage that the rise time at the re-start can be short because the energies of laser beams are detected while steady generation of the droplets without stopping falls of the droplets.

Figure 23:
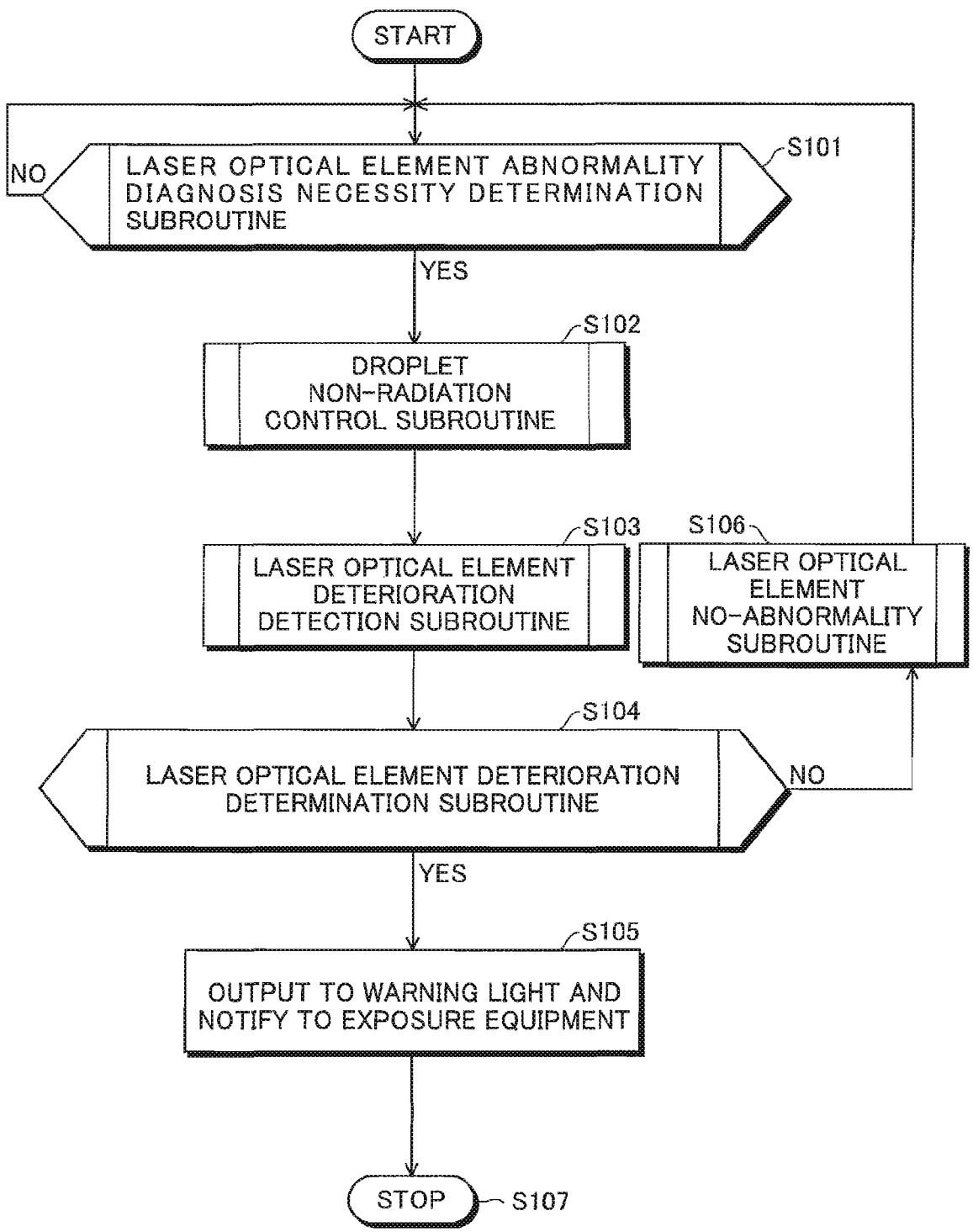
FIG. 23 is a main flow chart illustrating a procedure example of detecting deterioration of laser optics executed by the EUV light source apparatus of the eighth embodiment.

FIG. 23 is a main flow chart illustrating an example of a procedure of detecting laser optics deterioration executed by the laser beam optics deterioration determination processing unit 80 in the EUV light source apparatus of this embodiment.

The laser beam optics deterioration determination processing unit 80 first executes a laser optical element abnormality diagnosis necessity determination subroutine (S101), and determines whether a deterioration diagnosis for laser optical element is made or not. When it is determined that the diagnosis is not made (in the case of NO), the procedure returns to S101 and executes the subroutine again and again until the deterioration diagnosis is to be made.

On the other hand, when it is determined that an optical element deterioration diagnosis is to be made (in the case of YES), the procedure goes to the next step, and a droplet non-radiation control subroutine (S102) is executed. Subsequently, a laser optical element deterioration detection subroutine (S103) is executed. Based on the result of the subroutine, a laser optical element deterioration determination subroutine (S104) is executed with respect to the pre-pulse laser and the main pulse laser. When it is determined that there is deterioration (YES), the procedure goes to step S105, where an output is sent to the warning light to notify an operator and an exposure equipment controller that optical element deterioration has occurred. After that the EUV light source apparatus is stopped (S107). On the other hand, when the laser optical element deterioration determination subroutine (S104) is executed with respect to the pre-pulse laser and the main pulse laser and it is determined that the deterioration is in an allowable range (NO), the procedure goes to a laser optical element no-abnormality subroutine (S106). After that, the procedure returns to the first step S101 and repeats this routine.

FIGS. 24 and 25 are flow charts showing the contents of the laser optical element abnormality diagnosis necessity determination subroutine (S101).

As criteria of determining whether an abnormality diagnosis of optical element is necessary or not, a criterion based on an elapsed time from the last diagnosis, a criterion based on EUV light output, a criterion based on a cumulative value of the number of laser beam pulses after the last diagnosis, and a criterion based on the temperatures of optical elements of the laser beam focusing optics provided in the EUV light generating chamber are used. Some of these criteria may be selected and used, or all of them may be used, and if any one of them is not satisfied, an abnormality diagnosis may be made.

An optical element temperature management routine (a) is shown in FIG. 24, and a time management routine (b), an EUV light output management routine (c), and a pulse number management routine (d) are shown in FIG. 25. These routines are shown to be executed individually. If these routines are connected in series and the procedure goes to the next routine when one routine is executed and the result of NO is obtained, an abnormality diagnosis may be made when all conditions are checked and any one of them is satisfied.

The optical element temperature management routine (a) is a routine for managing the temperatures of optical elements and determining that an abnormality diagnosis is made when the temperature of any one of the optical elements each of which is managed in temperature exceeds a predetermined threshold.

First, it is determined whether the temperature T1 of the window 6a for the main pulse laser exceeds its threshold T1th, whether the temperature T2 of the parabolic concave mirror 43a for the main pulse laser exceeds its threshold T2th, whether the temperature T3 of the window 6b for the pre-pulse laser exceeds its threshold T3th, or whether the temperature T4 of the parabolic concave mirror 43b for the pre-pulse laser exceeds its threshold T4th (S131). When any one of the temperatures exceeds its threshold, it is notified an operator or external equipment such as exposure equipment that abnormality has occurred on any optical element for the lasers (S132), and it is determined that an abnormality diagnosis is necessary (YES) (S113), and the processing exits the temperature management routine.

On the other hand, when all of the temperatures of optical elements to be managed do not exceed their threshold at step S131, it is determined that no abnormality diagnosis is necessary (NO) (S134), and the processing exits the temperature management routine.

When either a window or a parabolic concave mirror which is located in the EUV light generating chamber and may be contaminated by debris, of optical elements in focusing optics for a driver laser, is deteriorated in the optical characteristic, the window or the parabolic concave mirror excessively absorbs a laser beam to become hotter than the normal state. So that when the temperature rise is detected with a temperature sensor by the optical element temperature management routine, the presence of abnormality can be confirmed by further executing an abnormality diagnosis procedure.

If a temperature sensor which measures a higher temperature than a threshold is identified, an optical element which is possibly deteriorated can be identified.

In addition, it is not determined by the optical element temperature management routine whether an abnormality diagnosis is necessary or not, but a deteriorated optical element may be identified directly from a result obtained by executing this routine and may be given with a warning.

The time management routine (b) is a routine for making an abnormality diagnosis in a fixed cycle. It is determined using a timer whether measured time has reached time K which is a diagnosis cycle (S201). When the measured time is less than time K, it is determined that no abnormality diagnosis is necessary (NO), and the processing exits this routine. When time K has passed, the timer is reset (S202) and it is determined that an abnormality diagnosis is necessary (YES) (S203), and the processing exits the time management routine.

The EUV light output management routine (c) is a routine for monitoring an EUV light output and making an abnormal diagnosis if the EUV light output does not reach a predetermined value.

An EUV light output Eeuv measured by an EUV light output measuring device is compared with a predetermined threshold Eeuvth (S211). When Eeuv is not less than Eeuvth, it is determined that no abnormality diagnosis is necessary (NO) (S212), and the processing exits this routine. When Eeuv is less than Eeuvth, it is determined that an abnormality diagnosis is necessary (YES) (S212), and the processing exits the EUV light output management routine.

The pulse number management routine (d) is a routine for making an abnormality diagnosis whenever the number of EUV light irradiation pulses reaches a predetermined number.

The number of EUV light pulses N is counted by a counter and the counter value is compared with a preset threshold Nth (S221). When N does not exceed Nth, it is determined that no abnormality diagnosis is necessary (NO) (S224), and the processing exits this routine. When N exceeds Nth, the counter is reset (S222) and it is determined that an abnormality diagnosis is necessary (YES) (S223), and the processing exits the pulse number management routine.

FIG. 26 is a flow chart showing the contents of the droplet non-radiation control subroutine (S102). The laser beam optics deterioration determination processing unit 80 previously selects and executes one of three methods of preventing any droplet from existing on a focal point 15 of a laser beam in order to measure the application energy of the laser beam on the fecal point 15. Thus, the droplet non-radiation control subroutine (S102) has a droplet generation stop routine (a), a droplet/laser beam timing changing routine (b), and a pulse laser optical axis changing routine (c), and the laser beam optics deterioration determination processing unit 80 executes any one of the routines previously selected.

The droplet generation stop routine (a) is a routine for outputting a droplet generation stop signal to the target material supply unit 3 through the droplet controller 30 (S301) to stop the droplet generation and then returning. Since no droplet come to exist on the focal point 15 of the laser beam by executing this routine, a pre-pulse laser beam and a main pulse laser beam come to enter the calorimeter without being applied to a droplet.

The drop/laser beam timing changing routine (b) is a routine for shifting the droplet generation timing of the target material supply unit 3 from the pre-pulse laser beam oscillation timing and the main pulse laser beam oscillation timing through the droplet controller 30, or shifting these pulse laser oscillation timings from the droplet generation timing through the pre-pulse laser controller and the main pulse laser controller so as to apply no pulse laser beam to a droplet (S311) and then returning.

The pulse laser optical axis changing routine (c) is a routine for slightly changing the optical axis of the pre-pulse laser and the optical axis of the main pulse laser from the trajectory of a droplet (S321) to make both of the pulse laser beams enter the calorimeter without contacting with the droplet and then returning. Since the diameter of a droplet is the order of 30 to 100 μm, it is sufficient to shift the optical axes by about several hundreds of μm, and the shift of the optical axes does not influence the energy measurements of both of the pulse lasers.

Figure 27:
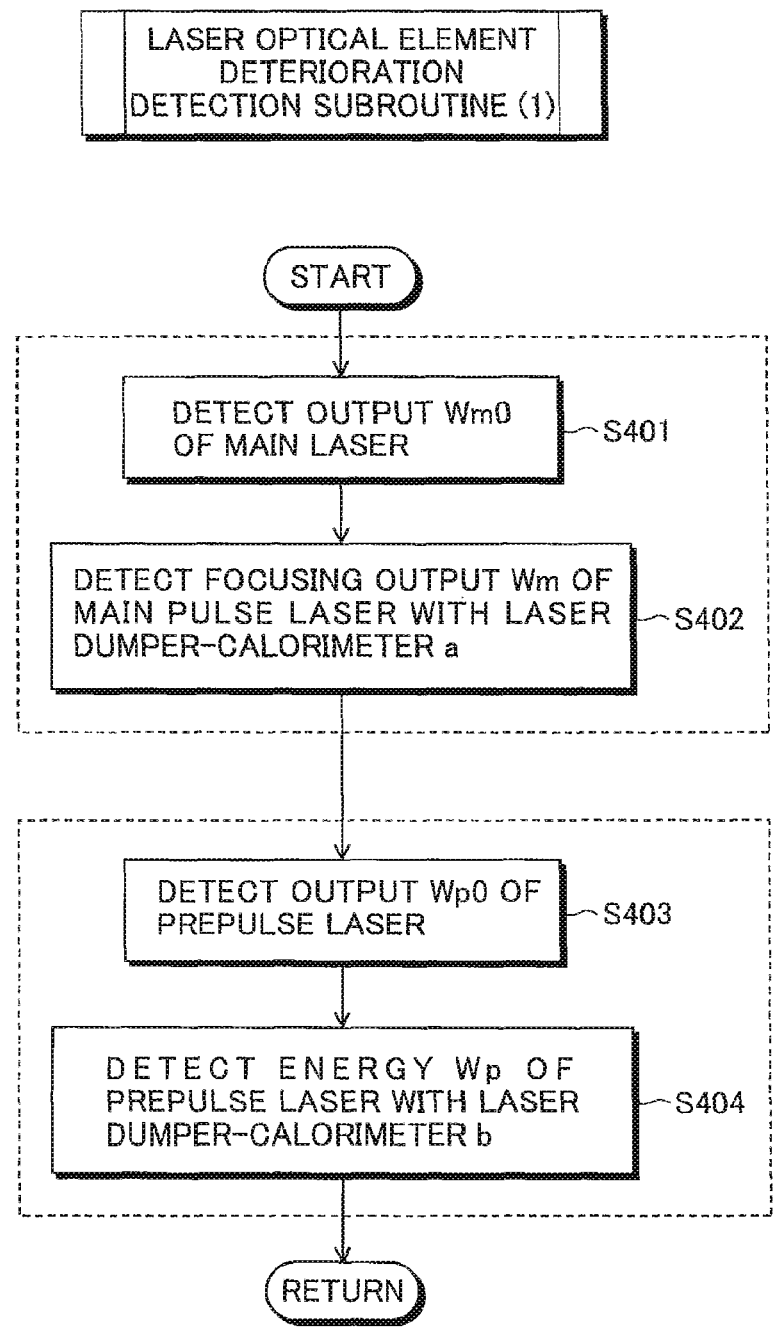
FIG. 27 is a flow chart showing the contents of a first example of a laser optical element deterioration detection subroutine.

FIG. 27 is a flow chart showing the contents of a first example of the laser optical element deterioration detection subroutine (S103). The laser beam optics deterioration determination processing unit 80 measures the application energy of a laser beam on a focal point 15, and detects a laser optical element deterioration state based on decline of the energy output. The laser optical element deterioration detection subroutine (S103) is composed of a routine for detecting deterioration about main pulse laser optical elements (a) and a routine for detecting deterioration about pre-pulse laser optical elements (b).

The main pulse laser optical element deterioration detection routine (a) first detects an output Wm0 of the main pulse laser before entering the EUV light generating chamber 2 with the power meter 25a for the main pulse laser (S401). Next, the main pulse laser optical element deterioration detection routine (a) measures an output Wm at the focal point 15 of the main pulse laser with the laser dumper-calorimeter 35a for the main pulse laser (S402), and then advances to the next pre-pulse laser optical element deterioration detection routine.

The pre-pulse laser optical element deterioration detection routine (b) first detects an output Wp0 of the pre-pulse laser before entering the EUV light generating chamber 2 with the power meter 25b for the pre-pulse laser (S403). Next, the pre-pulse laser optical element deterioration detection routine (b) measures an output Wp at the focal point 15 of the pre-pulse laser with the laser dumper-calorimeter 35b for the pre-pulse laser, and then returns to the main routine.

The measurements of the output Wm0 of the main pulse laser before entering the EUV light generating chamber 2 and the output Wp0 of the pre-pulse laser before entering the EUV light generating chamber 2 may be substituted with the outputs of the power monitors contained in the lasers.

Figure 28:
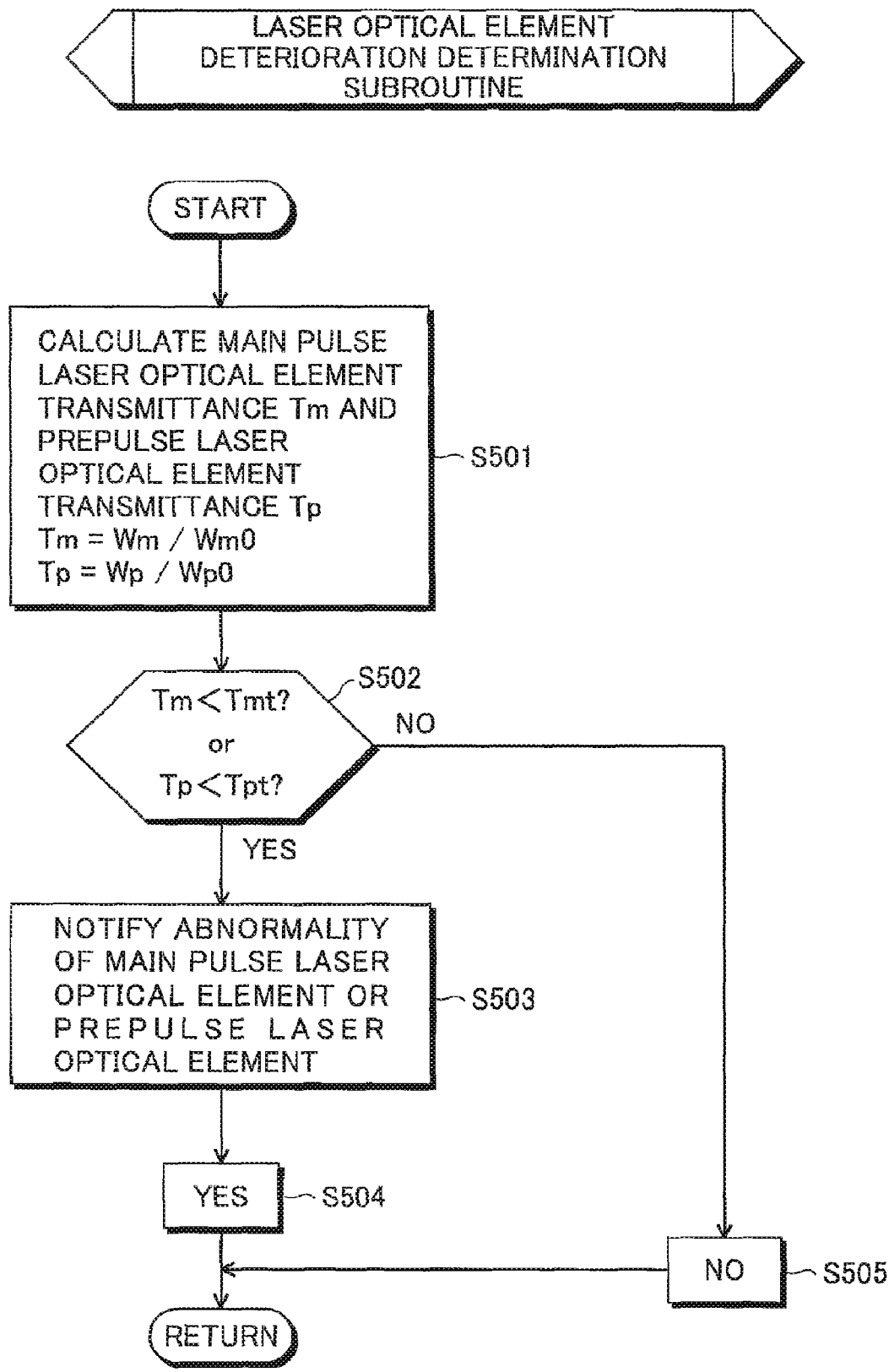
FIG. 28 is a flow chart showing the contents of the laser optical element deterioration determination subroutine.

FIG. 28 is a flow chart showing the contents of the laser optical element deterioration determination subroutine (S104). The laser beam optics deterioration determination processing unit 80 calculates the transmittances of optical elements installed in the EUV light generating chamber 2 among optical elements used for the pre-pulse laser and the main pulse laser, and determines the deterioration states of them.

The laser optical element deterioration determination subroutine (S104) first calculates the total transmittances Tm and Tp of optical elements used for the main pulse laser and the pre-pulse laser according to the following formulas using the laser outputs Wm0 and Wp0 before entering the EUV light generating chamber 2 and the laser outputs Wm and Wp at the focal point 15 (S501).

$Tm = Wm/Wm0$ $Tp = Wp/Wp0$

Next, this subroutine compares the total transmittances Tm and Tp with the transmittance lower limit thresholds Tmt and Tpt (S502) to determine the deterioration states of the optical elements. If any of the total transmittances Tm and Tp of the main pulse laser and the pre-pulse laser is less than the respective lower limit thresholds Tmt and Tpt, this subroutine determines that any optical element is deteriorated, notifies abnormality (S503) determines that there is any deterioration (YES) (S504), and returns to the main routine. If any of the total transmittances Tm and Tp does not reach the respective lower limit threshold Tmt and Tpt, this routine determines that there is no deterioration (NO) (S505), and returns to the main routine.

When the laser optical element deterioration determination subroutine (S104) determines that the deterioration of the optical elements of the pre-pulse laser and the main pulse laser is in an allowable range, the laser beam optics deterioration determination processing unit 80 executes the laser optical element no-abnormality notification subroutine (S106).

Figure 29:
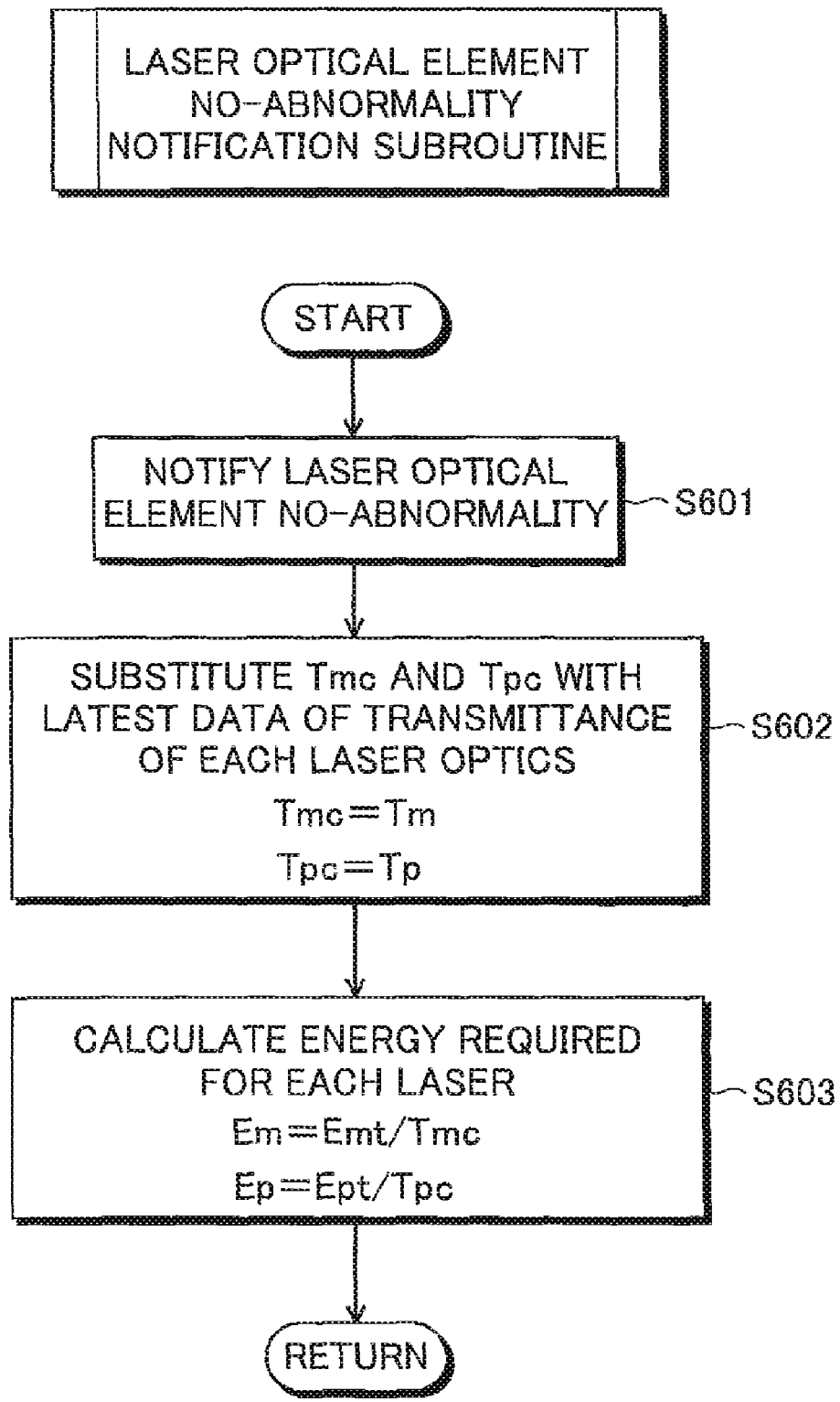
FIG. 29 is a flow chart showing the contents of a laser optical element no-abnormality notification subroutine.

FIG. 29 is a flow chart showing the contents of the laser optical element no-abnormality notification subroutine (S106).

This subroutine first notifies an operator or exposure equipment that there is no abnormality in the optical elements for the lasers (S601). Then, this subroutine substitutes the respective total transmittances Tmc and Tpc of the optical elements of the main pulse laser and the pre-pulse laser with the latest measured values Tm and Tp, (S602) so as to make a determination indicator accurately reflect the current status.

$Tmc = Tm$ $Tpc = Tp$

This subroutine may store transmittance changes of the optics of the lasers with time.

In addition, this subroutine calculates output energies Em and Ep required for the pulse lasers from the total transmittances and the laser beam energies Emt and Ept needed at the focal point 15 using the following formulas (S603), and then returns to the main flow.

$Em = Emt/Tmc$ $Ep = Ept/Tpc$

The laser beam optics deterioration determination processing unit 80 adjusts the outputs of the lasers based on this result, which is not shown in the flow chart. In the main flow, the energies of the main pulse laser 17 and the pre-pulse laser 18 are controlled using the latest total transmittances Tmc and Tpc of the optical elements of the main pulse laser and the pre-pulse laser, respectively.

The following advantages can be expected by the above processing.

(1) Since laser beams can be focused and applied to a droplet based the latest transmittances of the optics for the lasers, the pulse energy of EUV light can be stabilized.

(2) Deterioration of the optics of the lasers can be predicted by measuring the transmittance variations with time of the optics of the both lasers, and preventive maintenance can be performed. For example, the EUV light source apparatus can be prevented from suddenly stopping and replaced and repaired at a convenient time for maintenance by warning in advance, and therefore the downtime of the apparatus decreases.

Figure 30:
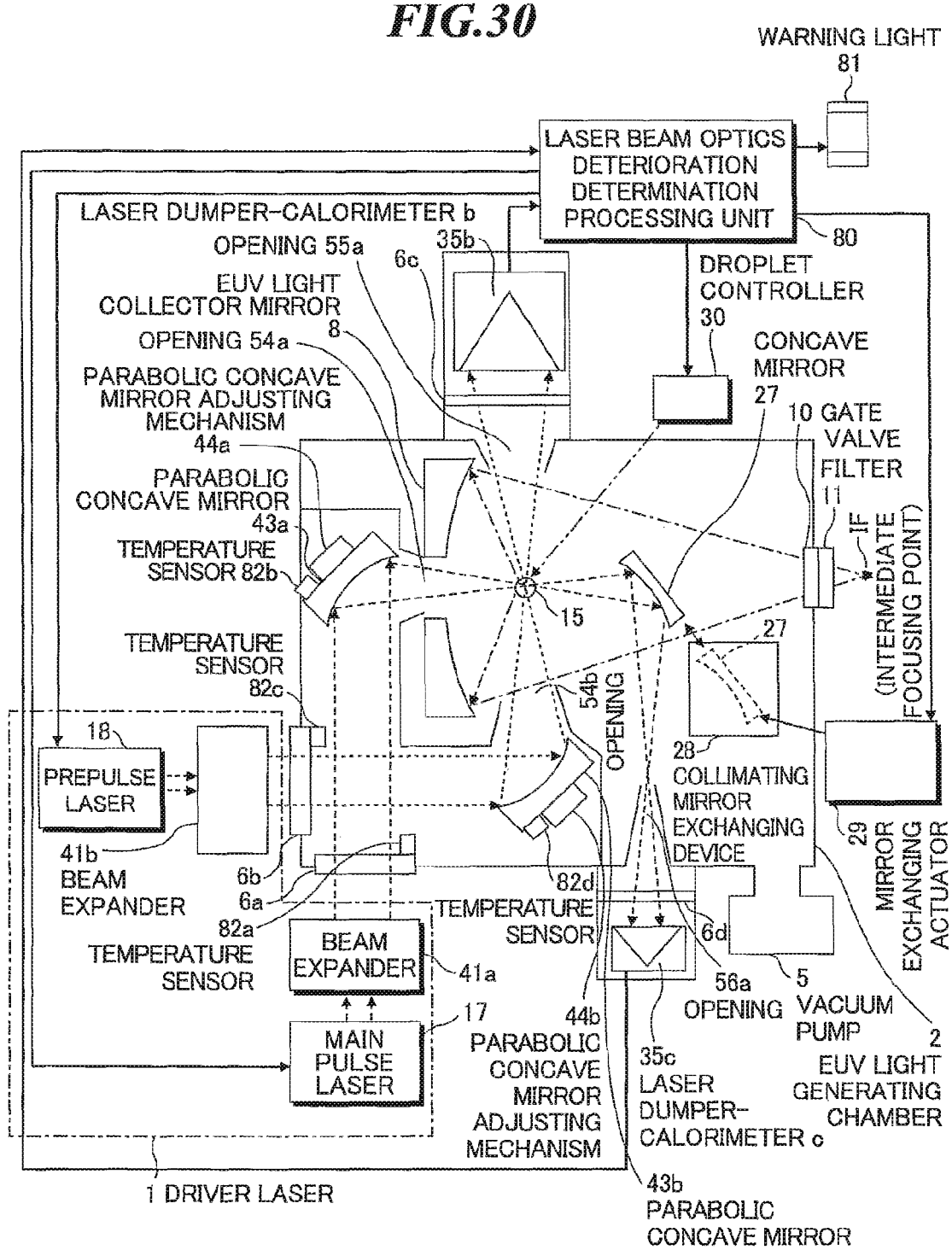
FIG. 30 is a schematic diagram showing the outline of an EUV light source apparatus according to a ninth embodiment of the present invention.

FIG. 30 is a schematic diagram showing the outline of an EUV light source apparatus according to the ninth embodiment of the present invention. The EUV light source apparatus of this embodiment is different from the EUV light source of the eighth embodiment only in that a calorimeter for a main pulse laser beam is located so as to be protected against debris, and other components are almost the same.

In other words, a laser dumper-calorimeter 35c for the main pulse laser beam is located outside an opening 56a provided on the wall of the EUV light generating chamber 2, instead of being located close to the focal point 15. Then, the main pulse laser beam which is once focused on the focal point 15 and then disperses is reflected and focused again by a concave mirror 27, passes through a hole of the opening 56a forming a debris shield and through a window 6d, and reaches the laser dumper-calorimeter 35c.

In addition, the concave mirror 27 is stored in usual in a protection housing of a focusing (or collimating) mirror exchanging device 28 and protected against debris, and is inserted into the path of the main pulse laser beam by a mirror exchanging actuator 29 only at measurement. Thus, the concave mirror 27 is not contaminated by debris and little deteriorated.

Furthermore, the laser dumper-calorimeter 35c is effectively prevented by the debris shield and the window 6d from being deteriorated by debris.

When the total transmittance of the optical elements for the main pulse laser is measured, the concave mirror 27 which is not contaminated and not deteriorated is drawn out and used, so that an accurate measurement result can be obtained.

Power meters which measure outputs before the main pulse laser beam and the pre-pulse laser beam enter the EUV light generating chamber 2 are not shown in FIG. 30. The power meters can be substituted by the laser output monitors contained in the lasers and the measured values of the laser output monitors can be assumed to be Wm0 and Wp0.

Furthermore, after the energy of the main pulse laser beam has been measured, the concave mirror 27 which is not deteriorated may be returned into the housing of the focusing (or collimating) mirror exchanging device 28, and a regularly used original concave mirror may be used to dump the main pulse laser beam incident on the mirror to the laser dumper-calorimeter 35c. Furthermore, a laser dump may be provided in the downstream of the concave mirror 27 and dump the laser beam to the laser dump after the concave mirror 27 is retracted.

Figure 31:
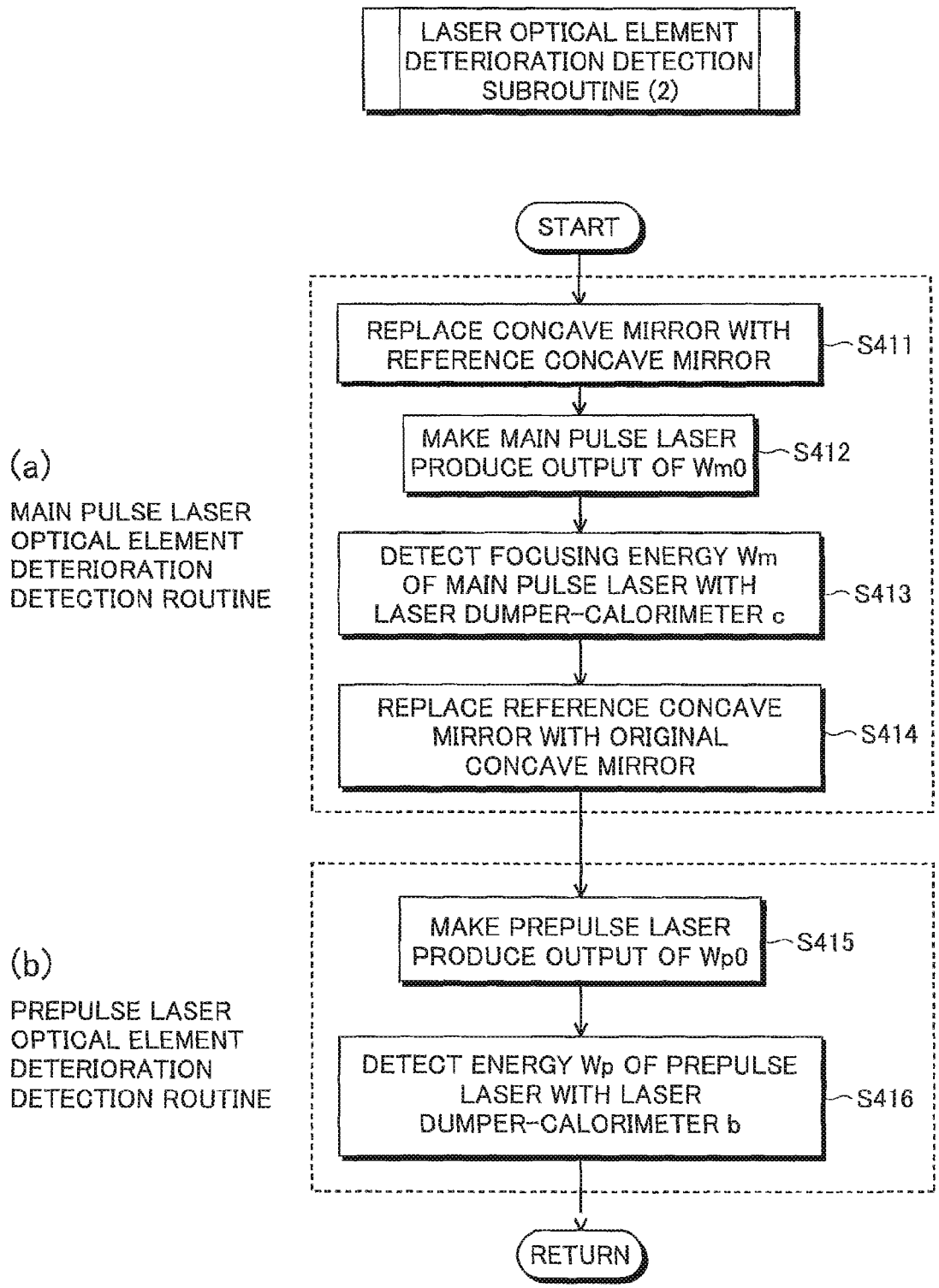
FIG. 31 is a flow chart showing the contents of the laser optical element deterioration detection subroutine of a second example applied in the ninth embodiment.

FIG. 31 is a flow chart showing the contents of the laser optical element deterioration detection subroutine of the second example (S103) which is applied instead of the laser optical element deterioration detection subroutine of the first example, when the main flow chart of the EUV light source apparatus of the present invention is applied to the ninth embodiment. The subroutine of the second example is mainly different from the subroutine of the first example in the main pulse laser optical element deterioration detection routine (a), and there is little difference in other parts between them. The laser optical element deterioration detection subroutine (S103) of the second example will be described below.

The main pulse laser optical element deterioration detection routine (a) of the laser optical element deterioration detection subroutine (S103) of the second example, first conducts the work of drawing the reference concave mirror 27 which has not been contaminated with debris from the housing of the focusing (or collimating) mirror exchanging device 28 and placing it in a measurement optical path (S411).

Next, this routine uses the power monitor contained in the main pulse laser to output main pulse laser beam fixed with the power at Wm0 (S412). This routine measures an output Wm of the main pulse laser at the focal point 15 with the laser dumper-calorimeter 35c for the main pulse laser (S413), replaces the reference concave mirror 27 with the original mirror (S414), and goes to the next pre-pulse laser optical element deterioration detection routine (b).

In the pre-pulse laser optical element deterioration detection routine (b), the pre-pulse laser apparatus first outputs pre-pulse laser beam fixed with the power at Wp0 (S415). The laser dumper-calorimeter 35b for the pre-pulse laser then measures an output Wp at the focal point 15 of the pre-pulse laser in this routine (S416) and the routine returns to the main routine.

Figure 32:
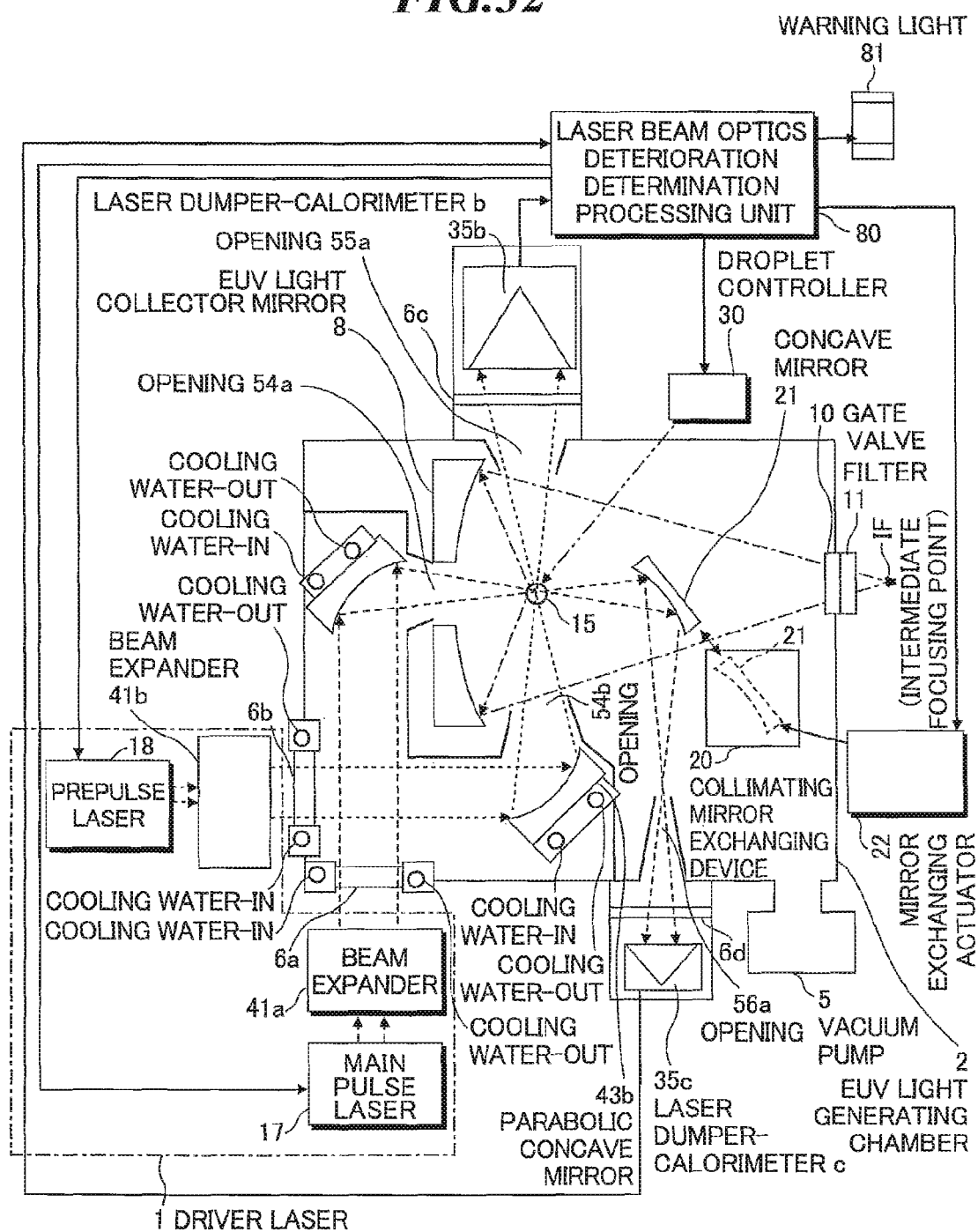
FIG. 32 is a schematic diagram showing the outline of an EUV light source apparatus according to a tenth embodiment of the present invention.
Figure 33:
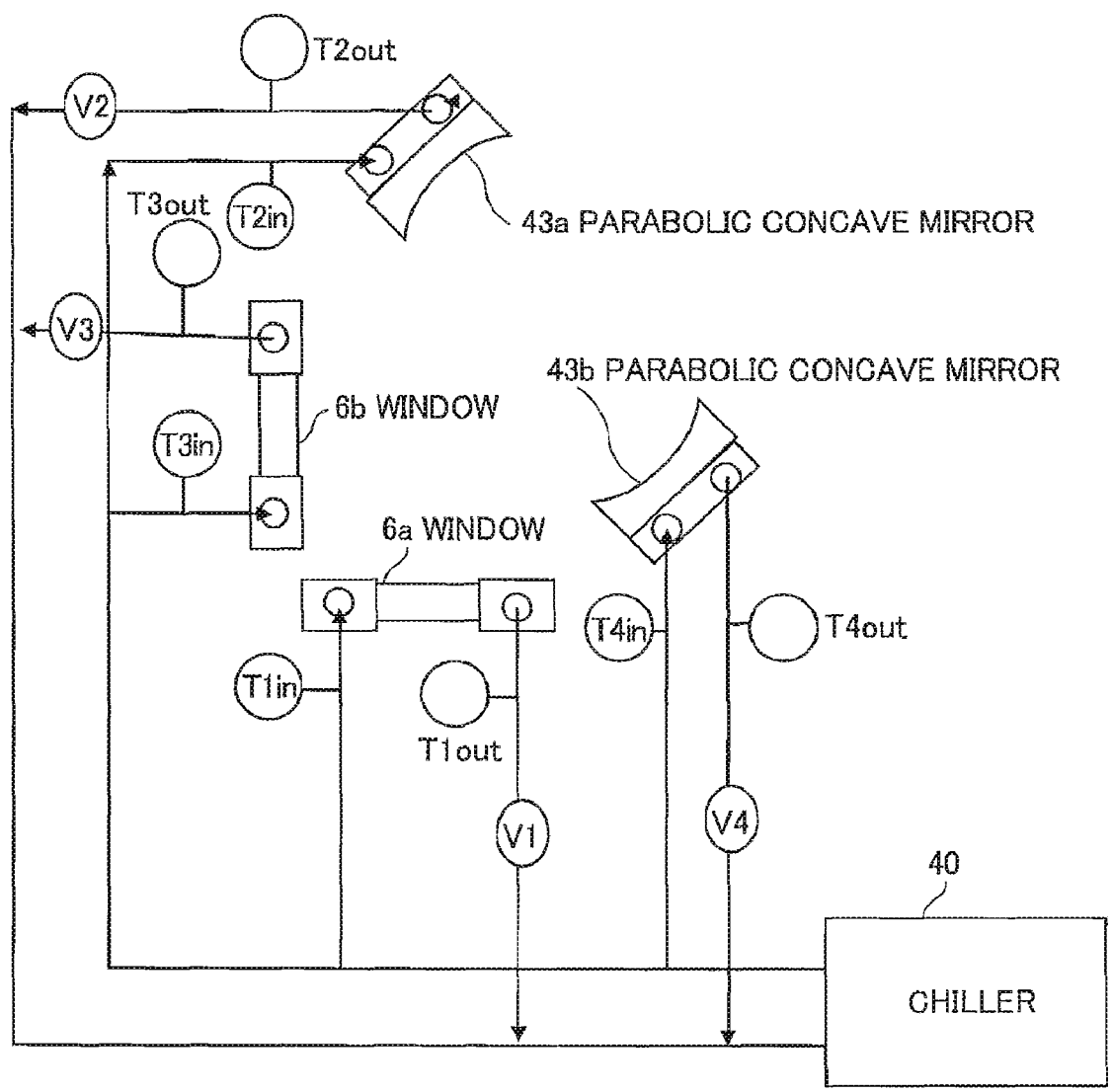
FIG. 33 is a cooling water circulation circuit diagram in the tenth embodiment.
Figure 35:
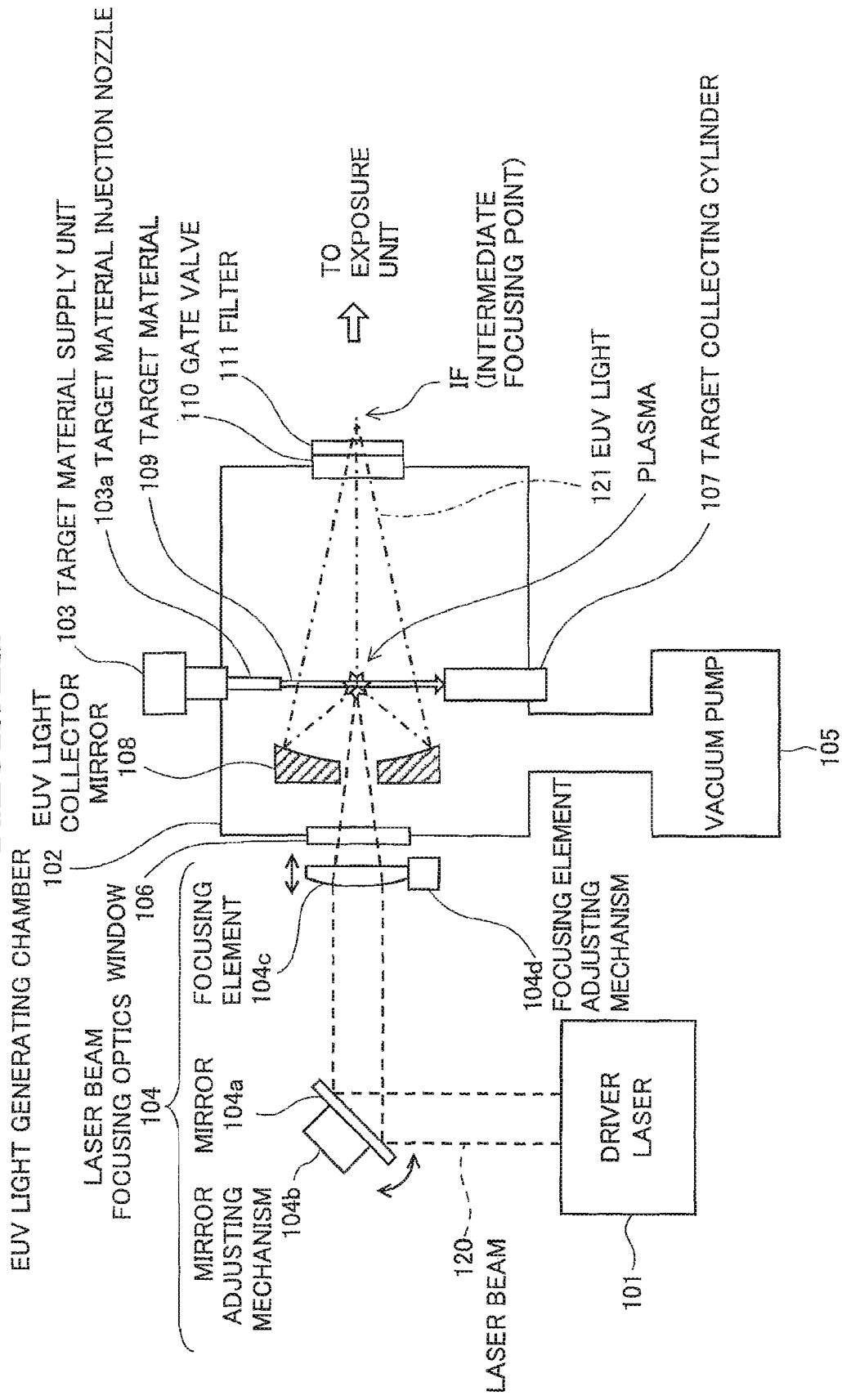
FIG. 35 is a schematic diagram showing the outline of a conventional EUV light source apparatus.

FIG. 32 is a schematic diagram showing the outline of an EUV light source apparatus according to the tenth embodiment of the present invention, and FIG. 33 is a cooling water circulation circuit diagram in the tenth embodiment. The EUV light source apparatus of this embodiment is characterized in that cooling water is supplied to the laser optical elements to perform waste heat amount management as compared with the EUV light source apparatus of the ninth embodiment shown in FIG. 30. Other components are almost the same.

Since the output of the main pulse laser is 10 to 20 kW, even if surface deterioration has not occurred on the optical elements, the wave front is distorted because of heat generation, so that it is desirable that the optical elements are cooled to maintain the focusing performance.

Hence, in the EUV light source apparatus according to this embodiment, cooling water is supplied to the window 6a and the parabolic concave mirror 43a for the main pulse laser and the window 6b and the parabolic concave mirror 43b for the pre-pulse laser so that the optical elements are not distorted by thermal stress, etc.

Since the output of the pre-pulse laser is between 100 and 200 W, if the optical elements are not deteriorated by debris, it is not necessary to cool them. However, even when the optical elements are somewhat deteriorated and absorb heat, cooling of the optical elements makes the distortion of the wave front suppressed to maintain the focusing performance. Thus, it is also desirable for the focusing performance to cool the optical elements for the lasers.

As shown in FIG. 33, cooling water output from a chiller 40 is distributed in parallel and supplied to optical elements including the windows 6a and 6b and the parabolic concave mirrors 43a and 43b, and after cooling down the optical elements, the cooling water is discharged to a return pipe to the chiller 40 in parallel. With respect to each of the optical elements, a cooling water inlet temperature Tin (T1in, T2in, T3in, T4in), a cooling water outlet temperature Tout (T1out, T2out, T3out, T4out), and a cooling water flow rate V (V1, V2, V3, V4) are measured, a waste heat amount is calculated to detect the deterioration state of the concerned optical elements, and thus an appropriate management is performed on optical elements.

When cooling water of a constant temperature is supplied to the optical elements, waste heat amounts can be calculated using the measured values of cooling water flow rates and outlet temperatures.

A system in which cooling water is circulated in parallel through all the related optical elements is shown in the figure. However, it is needless to say that without limitation to this example, pipes may be installed in series for all of the optical elements, or series piping arrangement and parallel piping arrangement may be combined, for example. In short, any piping arrangement which does not influence the focusing performance of the main pulse laser and the pre-pulse laser may be provided to measure inlet and outlet temperatures and a cooling water flow rate with respect to each of the optical elements.

Furthermore, for example, if a series piping arrangement is provided so that cooling water flow rates for all of the optical elements become the same value, only the inlet and outlet temperatures of each of the optical elements may be measured.

FIG. 34 is a flow chart showing an optical element waste heat amount management routine (e) which is used as a routine for determining whether an optical element abnormality diagnosis is necessary in the laser optical element abnormality diagnosis necessity determination subroutine (S101) of the tenth embodiment.

The optical element waste heat amount management routine (e) is a subroutine for determining whether an abnormality diagnosis is made based on the waste heat amount of each of the optical elements taken out by cooling water. The waste heat amount Q of each of the optical elements can be obtained according to the formula of $Q=V(Tout-Tin)$ using a cooling water flow rate V, a cooling water inlet temperature Tin, and a cooling water outlet temperature Tout.

First, the waste heat amount Q (Q1, Q2, Q3, Q4) is obtained using the measured values of cooling water flow rates V, cooling water inlet temperatures Tin, and cooling water outlet temperatures Tout with respect to each of the window 6a and the parabolic concave mirror 43a for the main pulse laser and the window 6b and the parabolic concave mirror 43b for the pre-pulse laser (S141).

Next, it is determined whether the waste heat amount Q1 of the window 6a for the main pulse laser exceeds its threshold Q1*th*, whether the waste heat amount Q2 of the parabolic concave mirror 43a for the main pulse laser exceeds its threshold Q2*th*, whether the waste heat amount Q3 of the window 6b for the pre-pulse laser exceeds its threshold Q3*th*, or whether the waste heat amount Q4 of the parabolic concave mirror 43b for the pre-pulse laser exceeds its threshold Q4*th* (S142). When any one of the waste heat amounts exceeds its threshold, it is notified to an operator or external equipment such as exposure equipment that abnormality has occurred on any optical element for the lasers (S143), and it is determined that an abnormality diagnosis is necessary (YES) (S144). Then the processing exits the optical element waste heat management routine.

On the other hand, when any of the waste heat amounts of optical elements to be managed does not exceed its threshold at step S142, it is determined that no abnormality diagnosis is necessary (NO) (S145) and the processing exits the waste heat amount management routine.

In the above description, the cooling water inlet temperature Tin, the cooling water outlet temperature Tout, and the cooling water flow rate V are measured and the waste heat amount Q is obtained for each of the optical elements, and it is determined whether a diagnosis is necessary or not. However, without limitation to this example, it can be determined whether an abnormality diagnosis is necessary or not based on other measured values corresponding to the waste heat amounts.

For example, when the cooling water is supplied in series, flow rate measurement may be conducted only at one point. Furthermore, when a flow rate is controlled to be a predetermined value, flow rate measurement is not necessary and the management may be performed using differences in temperature between inlets and outlets of the cooling water.

Furthermore, when cooling water inlet temperatures and flow rates at the optical elements are controlled to be identical, the management may be performed only using cooling water outlet temperatures Tout at the optical elements.

Furthermore, in the embodiments of FIGS. 30 and 32, a main laser beam is focused by the concave mirror 21, 27 and guided to the opening 56a. However, without limitation to these embodiments, the opening 56a maybe somewhat widened and the main laser beam may be once collimated by the concave mirror to be guided to the opening 56a. In addition, when a plane mirror is used instead of the concave mirror 21, 27, there is no problem if a spread main laser beam can be guided to the opening 56a and the laser dumper-calorimeter a 35c. Thus, any optical element which only does reflect the main pulse laser beam and guide it to the laser dumper-calorimeter may be used. However, when the main pulse laser beam is once focused by the concave mirror 21, 27 to be guided to the small opening 56a like the embodiments of FIGS. 30 and 32, the contamination of the window 6d by debris can be prevented and therefore a great effect can be obtained. Furthermore, an optical element may also be used to guide the pre-pulse laser beam to a laser dumper-calorimeter.

The invention claimed is:

1. An extreme ultra violet light source apparatus for generating extreme ultra violet light by applying a laser beam to a target material to turn the target material into plasma, said apparatus comprising:
   an extreme ultra violet light generating chamber in which extreme ultra violet light is generated;
   a target material supply unit for injecting a target material into said extreme ultra violet light generating chamber when the extreme ultra violet light is generated;
   a driver laser for emitting a laser beam;
   a window provided to said extreme ultra violet light generating chamber, for passing the laser beam into said extreme ultra violet light generating chamber;
   laser beam focusing optics including at least one optical element, said laser beam focusing optics focusing the laser beam emitted from said driver laser onto a trajectory of the target material injected into said extreme ultra violet light generating chamber to generate plasma;
   extreme ultra violet light collecting optics for collecting and outputting extreme ultra violet light radiated from said plasma;
   a temperature sensor for detecting a temperature of said window; and
   a processing unit for determining deterioration of said window based on the temperature of said window detected by said temperature sensor when extreme ultra violet light is generated.

2. The extreme ultra violet light source apparatus according to claim 1, wherein said processing unit outputs a control signal for stopping emission of the laser beam to said driver laser, when determining that said window is deteriorated.

3. The extreme ultra violet light source apparatus according to claim 1, further comprising:
a laser beam detector provided outside said extreme ultra violet light generating chamber, for detecting intensity of the laser beam, which has been dispersed without being applied to the target material after being focused by said laser beam focusing optics and output from said extreme ultra violet light generating chamber, when extreme ultra violet light is not generated,
wherein said processing unit determines deterioration of said window and/or said at least one optical element based on the intensity of the laser beam detected by said laser beam detector when extreme ultra violet light is not generated.

4. The extreme ultra violet light source apparatus according to claim 3, wherein said processing unit outputs a control signal for stopping emission of the laser beam to said driver laser when determining that said window is deteriorated.

5. The extreme ultra violet light source apparatus according to claim 3, further comprising:
a shielding means for shielding materials and electromagnetic waves generated in said extreme ultra violet light generating chamber to protect said laser beam detector when extreme ultra violet light is generated.

6. The extreme ultra violet light source apparatus according to claim 1, further comprising:
laser beam re-focusing optics provided outside said extreme ultra violet light generating chamber, for focusing again the laser beam, which has been dispersed without being applied to the target material after being focused by said laser beam focusing optics and output from said extreme ultra violet light generating chamber, when extreme ultra violet light is not generated; and
an area sensor for detecting an image of the laser beam focused by the laser beam re-focusing optics,
wherein said processing unit determines deterioration and/or distortion of said window and/or said at least one optical element, and/or determines whether a focus of the laser beam focused by said laser beam focusing optics is deviated from a position where the plasma is to be generated, based on the image of the laser beam detected by said area sensor when extreme ultra violet light is not generated.

7. The extreme ultra violet light source apparatus according to claim 6, further comprising:
a visible fluorescent screen for converting the laser beam focused by the laser beam re-focusing optics to visible light; and
a visible light focusing system for focusing the visible light converted by said visible fluorescent screen onto a light-receiving surface of said area sensor.

8. The extreme ultra violet light source apparatus according to claim 6, further comprising:
a shielding means for shielding materials and electromagnetic waves generated in said extreme ultra violet light generating chamber to protect said area sensor when extreme ultra violet light is generated.

9. An extreme ultra violet light source apparatus for generating extreme ultra violet light by applying a laser beam to a target material to turn the target material into plasma, said apparatus comprising:
an extreme ultra violet light generating chamber in which extreme ultra violet light is generated;
a target material supply unit for injecting a target material into said extreme ultra violet light generating chamber when extreme ultra violet light is generated;
a driver laser for emitting a laser beam;
a window provided to said extreme ultra violet light generating chamber, for passing the laser beam into said extreme ultra violet light generating chamber;
laser beam focusing optics including an optical element provided in said extreme ultra violet light generating chamber, said laser beam focusing optics focusing the laser beam emitted from said driver laser onto a trajectory of the target material injected into said extreme ultra violet light generating chamber to generate plasma;
extreme ultra violet light collecting optics for collecting and outputting extreme ultra violet light radiated from said plasma;
a plurality of temperature sensors, each provided to respective one of said window and said optical element, for detecting temperatures thereof; and
a processing unit for determining deterioration of said window and said optical element based on the temperatures of said window and said optical element detected by said plurality of temperature sensors when extreme ultra violet light is generated.

10. The extreme ultra violet light source apparatus according to claim 9, wherein said driver laser includes a pre-pulse laser and a main pulse laser, and said window and said laser beam focusing optics are provided for each of said pre-pulse laser and said main pulse laser.

11. The extreme ultra violet light source apparatus according to claim 9, wherein said processing unit outputs a control signal for stopping emission of the laser beam to said driver laser when determining that said window is deteriorated.

12. The extreme ultra violet light source apparatus according to claim 9, further comprising:
a first energy detector for detecting energy of the laser beam, which has been dispersed without being applied to the target material after being focused by said laser beam focusing optics, when extreme ultra violet light is not generated,
wherein said processing unit determines deterioration of said window and said optical element based on the energy of the laser beam detected by said first energy detector when extreme ultra violet light is not generated.

13. The extreme ultra violet light source apparatus according to claim 12, further comprising:
a second energy detector provided outside said extreme ultra violet light generating chamber, for detecting energy of the laser beam before passing through said window,
wherein said processing unit determines deterioration of said window and said optical element based on the energy of the laser beam detected by said first energy detector and the energy of the laser beam detected by said second energy detector when extreme ultra violet light is not generated.

14. The extreme ultra violet light source apparatus according to claim 12, wherein said first energy detector is provided outside said extreme ultra violet light generating chamber, and a concave mirror for guiding the laser beam, which has been dispersed without being applied to the target material, to said first energy detector is provided inside said extreme ultra violet light generating chamber.

15. The extreme ultra violet light source apparatus according to claim 14, further comprising:
a protection housing provided in said extreme ultra violet light generating chamber,
wherein said concave mirror is stored capable of being taken out in said protection housing, and is inserted into an optical path of the laser beam at measurement of said first energy detector.

16. The extreme ultra violet light source apparatus according to claim 12, wherein the target material supply unit does not inject the target material while said driver laser emits the laser beam, when said extreme ultra violet light is not generated.

17. The extreme ultra violet light source apparatus according to claim 12, wherein timing of injecting the target material controlled by the target material supply unit and timing of emitting the laser beam controlled by said driver laser are adjusted so as not to apply the laser beam to the target material, when said extreme ultra violet light is not generated.

18. The extreme ultra violet light source apparatus according to claim 12, wherein the trajectory of the target material controlled by the target material supply unit and an optical path of the laser beam controlled by said driver laser are adjusted so as not to apply the laser beam to the target material, when said extreme ultra violet light is not generated.

19. The extreme ultra violet light source apparatus according to claim 9, further comprising:
a shielding means for shielding materials and electromagnetic waves generated in said extreme ultra violet light generating chamber to protect said window and said optical element provided in said extreme ultra violet light generating chamber when extreme ultra violet light is generated.

20. An extreme ultra violet light source apparatus for generating extreme ultra violet light by applying a laser beam to a target material to turn the target material into plasma, said apparatus comprising:
an extreme ultra violet light generating chamber in which extreme ultra violet light is generated;
a target material supply unit for injecting a target material into said extreme ultra violet light generating chamber when extreme ultra violet light is generated;
a driver laser for emitting a laser beam;
a window provided to said extreme ultra violet light generating chamber, for passing the laser beam into said extreme ultra violet light generating chamber;
laser beam focusing optics including an optical element provided in said extreme ultra violet light generating chamber, said laser beam focusing optics focusing the laser beam emitted from said driver laser onto a trajectory of the target material injected into said extreme ultra violet light generating chamber to generate plasma;
extreme ultra violet light collecting optics for collecting and outputting extreme ultra violet light radiated from said plasma;
a cooling channel for supplying cooling water to said window and/or said optical element;
a temperature sensor provided at a cooling water back-flow position of said cooling channel, for detecting a temperature of back-flow cooling water; and
a processing unit for obtaining an amount of waste heat carried by the cooling water based on the temperature detected by the temperature sensor when extreme ultra violet light is generated, and determining deterioration of said window and/or said optical element based on the amount of waste heat.

21. The extreme ultra violet light source apparatus according to claim 20, wherein said driver laser includes a pre-pulse laser and a main pulse laser, and said window and said laser beam focusing optics are provided for each of said pre-pulse laser and said main pulse laser.

22. The extreme ultra violet light source apparatus according to claim 20, wherein said processing unit outputs a control signal for stopping emission of the laser beam to said driver laser when determining that said window and/or said optical element is deteriorated.

23. The extreme ultra violet light source apparatus according to claim 20, further comprising:
a first energy detector for detecting energy of the laser beam, which has been dispersed without being applied to the target material after being focused by said laser beam focusing optics, when extreme ultra violet light is not generated,
wherein said processing unit determines deterioration of said window and/or said optical element based on the energy of the laser beam detected by said first energy detector when extreme ultra violet light is not generated.

24. The extreme ultra violet light source apparatus according to claim 23, further comprising:
a second energy detector provided outside said extreme ultra violet light generating chamber, for detecting energy of the laser beam before passing through said window,
wherein said processing unit determines deterioration of said window and/or said optical element based on the energy of the laser beam detected by said first energy detector and the energy of the laser beam detected by said second energy detector when extreme ultra violet light is not generated.

25. The extreme ultra violet light source apparatus according to claim 23, wherein said first energy detector is provided outside said extreme ultra violet light generating chamber, and a concave mirror for guiding the laser beam, which has been dispersed without being applied to the target material, to said first energy detector is provided inside said extreme ultra violet light generating chamber.

26. The extreme ultra violet light source apparatus according to claim 25, further comprising:
a protection housing provided in the extreme ultra violet light generating chamber,
wherein said concave mirror is stored capable of being taken out in said protection housing, and is inserted into an optical path of the laser beam at measurement of said first energy detector.

27. The extreme ultra violet light source apparatus according to claim 23, wherein the target material supply unit does not inject the target material while said driver laser emits the laser beam, when said extreme ultra violet light is not generated.

28. The extreme ultra violet light source apparatus according to claim 23, wherein timing of injecting the target material controlled by the target material supply unit and timing of emitting the laser beam controlled by said driver laser are adjusted so as not to apply the laser beam to the target material, when said extreme ultra violet light is not generated.

29. The extreme ultra violet light source apparatus according to claim 23, wherein the trajectory of the target material controlled by the target material supply unit and an optical path of the laser beam controlled by said driver laser are adjusted so as not to apply the laser beam to the target material, when said extreme ultra violet light is not generated.

30. The extreme ultra violet light source apparatus according to claim 20, further comprising:
a shielding means for shielding materials and electromagnetic waves generated in said extreme ultra violet light generating chamber to protect said window and said optical element provided in said extreme ultra violet light generating chamber when extreme ultra violet light is generated.

* * * * *